United States Patent
Koezuka et al.

(10) Patent No.: US 10,249,651 B2
(45) Date of Patent: *Apr. 2, 2019

(54) MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventors: Junichi Koezuka, Tochigi (JP); Naoto Yamade, Isehara (JP); Yuhei Sato, Atsugi (JP); Yutaka Okazaki, Isehara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/911,708

(22) Filed: Mar. 5, 2018

(65) Prior Publication Data

US 2018/0261633 A1  Sep. 13, 2018

Related U.S. Application Data

(63) Continuation of application No. 15/399,154, filed on Jan. 5, 2017, now Pat. No. 9,911,767, which is a (Continued)

(30) Foreign Application Priority Data

Apr. 27, 2011  (JP) .................................. 2011-100040

(51) Int. Cl.
*H01L 21/00* (2006.01)
*H01L 27/12* (2006.01)
(Continued)

(52) U.S. Cl.
CPC .... *H01L 27/1274* (2013.01); *H01L 21/02565* (2013.01); *H01L 21/02609* (2013.01);
(Continued)

(58) Field of Classification Search
CPC ........... H01L 29/66742; H01L 29/7869; H01L 29/78606
See application file for complete search history.

(56) References Cited

U.S. PATENT DOCUMENTS 3,789,263 A    1/1974  Fritz et al.
5,407,903 A    4/1995  Nakamura et al.
(Continued)

FOREIGN PATENT DOCUMENTS

CN    101339899 A    1/2009
CN    101882630 A    11/2010
(Continued)

OTHER PUBLICATIONS

Chinese Office Action (Application No. 201610352570.6) dated May 29, 2018.
(Continued)

*Primary Examiner* — Nicholas J Tobergte
(74) *Attorney, Agent, or Firm* — Robinson Intellectual Property Law Office; Eric J. Robinson

(57) ABSTRACT

A semiconductor device using an oxide semiconductor is provided with stable electric characteristics to improve the reliability. In a manufacturing process of a transistor including an oxide semiconductor film, an oxide semiconductor film containing a crystal having a c-axis which is substantially perpendicular to a top surface thereof (also called a first crystalline oxide semiconductor film) is formed; oxygen is added to the oxide semiconductor film to amorphize at least part of the oxide semiconductor film, so that an amorphous oxide semiconductor film containing an excess
(Continued)

of oxygen is formed; an aluminum oxide film is formed over the amorphous oxide semiconductor film; and heat treatment is performed thereon to crystallize at least part of the amorphous oxide semiconductor film, so that an oxide semiconductor film containing a crystal having a c-axis which is substantially perpendicular to a top surface thereof (also called a second crystalline oxide semiconductor film) is formed.

3 Claims, 28 Drawing Sheets

Related U.S. Application Data continuation of application No. 15/046,962, filed on Feb. 18, 2016, now Pat. No. 9,543,145, which is a continuation of application No. 14/632,081, filed on Feb. 26, 2015, now Pat. No. 9,269,797, which is a continuation of application No. 13/453,118, filed on Apr. 23, 2012, now Pat. No. 8,969,182.

(51) Int. Cl.
  *H01L 29/786* (2006.01)
  *H01L 29/66* (2006.01)
  *H01L 21/383* (2006.01)
  *H01L 21/44* (2006.01)
  *H01L 21/477* (2006.01)
  *H01L 21/02* (2006.01)

(52) U.S. Cl.
  CPC ...... *H01L 21/02667* (2013.01); *H01L 21/383* (2013.01); *H01L 21/44* (2013.01); *H01L 21/477* (2013.01); *H01L 27/1225* (2013.01); *H01L 29/66742* (2013.01); *H01L 29/66969* (2013.01); *H01L 29/7869* (2013.01); *H01L 29/78606* (2013.01); *H01L 29/78696* (2013.01)

(56) References Cited

U.S. PATENT DOCUMENTS

| | | | |
|---|---|---|---|
| 5,508,209 | A | 4/1996 | Zhang et al. |
| 5,712,496 | A | 1/1998 | Takahashi et al. |
| 5,731,856 | A | 3/1998 | Kim et al. |
| 5,744,864 | A | 4/1998 | Cillessen et al. |
| 5,849,612 | A | 12/1998 | Takahashi et al. |
| 5,940,705 | A | 8/1999 | Lee et al. |
| 6,018,195 | A | 1/2000 | Takebuchi |
| 6,294,274 | B1 | 9/2001 | Kawazoe et al. |
| 6,326,249 | B1 | 12/2001 | Yamazaki et al. |
| 6,388,291 | B1 | 5/2002 | Zhang et al. |
| 6,433,361 | B1 | 8/2002 | Zhang et al. |
| 6,515,511 | B2 | 2/2003 | Sugibayashi et al. |
| 6,563,174 | B2 | 5/2003 | Kawasaki et al. |
| 6,727,522 | B1 | 4/2004 | Kawasaki et al. |
| 6,767,847 | B1 | 7/2004 | Hu et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,172,952 | B2 | 2/2007 | Chung |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,378,286 | B2 | 5/2008 | Hsu et al. |
| 7,385,224 | B2 | 6/2008 | Ishii et al. |
| 7,390,705 | B2 | 6/2008 | Paik |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,491,575 | B2 | 2/2009 | Wu et al. |
| 7,501,293 | B2 | 3/2009 | Ito et al. |
| 7,511,343 | B2 | 3/2009 | Li et al. |
| 7,575,965 | B2 | 8/2009 | Kuwabara et al. |
| 7,598,520 | B2 | 10/2009 | Hirao et al. |
| 7,674,650 | B2 | 3/2010 | Akimoto et al. |
| 7,678,625 | B2 | 3/2010 | Lim et al. |
| 7,678,668 | B2 | 3/2010 | Shimomura et al. |
| 7,732,819 | B2 | 6/2010 | Akimoto et al. |
| 7,791,072 | B2 | 9/2010 | Kumomi et al. |
| 7,829,444 | B2 | 11/2010 | Yabuta et al. |
| 7,884,360 | B2 | 2/2011 | Takechi et al. |
| 7,893,495 | B2 | 2/2011 | Li et al. |
| 7,910,490 | B2 | 3/2011 | Akimoto et al. |
| 7,932,521 | B2 | 4/2011 | Akimoto et al. |
| 7,977,169 | B2 | 7/2011 | Hirao et al. |
| 7,977,675 | B2 | 7/2011 | Kawamura et al. |
| 7,993,964 | B2 | 8/2011 | Hirao et al. |
| 8,202,365 | B2 | 6/2012 | Umeda et al. |
| 8,207,025 | B2 | 6/2012 | Suzawa et al. |
| 8,274,077 | B2 | 9/2012 | Akimoto et al. |
| 8,274,078 | B2 | 9/2012 | Itagaki et al. |
| 8,294,147 | B2 | 10/2012 | Yamazaki et al. |
| 8,319,214 | B2 | 11/2012 | Imai |
| 8,319,216 | B2 | 11/2012 | Akimoto et al. |
| 8,343,849 | B2 | 1/2013 | Sasagawa et al. |
| 8,377,744 | B2 | 2/2013 | Yamazaki et al. |
| 8,384,077 | B2 | 2/2013 | Yano et al. |
| 8,384,085 | B2 | 2/2013 | Kimura et al. |
| 8,395,153 | B2 | 3/2013 | Yamazaki et al. |
| 8,420,442 | B2 | 4/2013 | Takechi et al. |
| 8,431,449 | B2 | 4/2013 | Suzawa et al. |
| 8,440,510 | B2 | 5/2013 | Yamazaki |
| 8,401,007 | B2 | 6/2013 | Yamazaki |
| 8,466,463 | B2 | 6/2013 | Akimoto et al. |
| 8,471,252 | B2 | 6/2013 | Yamazaki et al. |
| 8,513,053 | B2 | 8/2013 | Yamazaki et al. |
| 8,518,755 | B2 | 8/2013 | Yamazaki et al. |
| 8,530,289 | B2 | 9/2013 | Yamazaki |
| 8,546,225 | B2 | 10/2013 | Yamazaki |
| 8,581,243 | B2 | 11/2013 | Takahashi et al. |
| 8,592,879 | B2 | 11/2013 | Suzawa et al. |
| 8,629,069 | B2 | 1/2014 | Akimoto et al. |
| 8,669,550 | B2 | 3/2014 | Akimoto et al. |
| 8,709,922 | B2 | 4/2014 | Koezuka et al. |
| 8,785,240 | B2 | 7/2014 | Watanabe |
| 8,790,959 | B2 | 7/2014 | Akimoto et al. |
| 8,796,069 | B2 | 8/2014 | Akimoto et al. |
| 8,828,811 | B2 | 9/2014 | Yamazaki |
| 8,865,534 | B2 | 10/2014 | Yamazaki |
| 8,889,480 | B2 | 11/2014 | Takechi et al. |
| 8,900,917 | B2 | 12/2014 | Yamazaki et al. |
| 8,945,982 | B2 | 2/2015 | Yamazaki |
| 8,969,144 | B2 | 3/2015 | Suzawa et al. |
| 8,969,182 | B2 | 3/2015 | Koezuka et al. |
| 8,981,369 | B2 | 3/2015 | Yano et al. |
| 8,987,728 | B2 * | 3/2015 | Honda ............... H01L 29/42384 |
| | | | 257/43 |
| 9,064,853 | B2 * | 6/2015 | Nomura ............ H01L 29/66969 |
| 9,082,857 | B2 | 7/2015 | Yamazaki et al. |
| 9,099,562 | B2 | 8/2015 | Akimoto et al. |
| 9,105,734 | B2 * | 8/2015 | Honda ................ H01L 29/7869 |
| 9,209,026 | B2 | 12/2015 | Takechi et al. |
| 9,269,794 | B2 | 2/2016 | Yamazaki et al. |
| 9,397,194 | B2 | 7/2016 | Yamazaki et al. |
| 9,490,351 | B2 | 11/2016 | Honda et al. |
| 2001/0015450 | A1 | 8/2001 | Sugibayashi et al. |
| 2001/0046027 | A1 | 11/2001 | Tai et al. |
| 2002/0056838 | A1 | 5/2002 | Ogawa |
| 2002/0072223 | A1 | 6/2002 | Gliberts et al. |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |

(56) References Cited

U.S. PATENT DOCUMENTS

| | | |
|---|---|---|
| 2005/0039670 A1 | 2/2005 | Hosono et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0160726 A1 | 7/2008 | Lim et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu |
| 2008/0308805 A1 | 12/2008 | Akimoto et al. |
| 2009/0051046 A1 | 2/2009 | Yamazaki et al. |
| 2009/0068773 A1 | 3/2009 | Lai et al. |
| 2009/0072343 A1 | 3/2009 | Ohnuma et al. |
| 2009/0073325 A1 | 3/2009 | Kuwabara et al. |
| 2009/0114910 A1 | 5/2009 | Chang |
| 2009/0127551 A1 | 5/2009 | Imai |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0044700 A1 | 2/2010 | Kim et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0213460 A1 | 8/2010 | Kondo et al. |
| 2010/0267198 A1 | 10/2010 | Yabuta et al. |
| 2010/0320458 A1 | 12/2010 | Umeda et al. |
| 2010/0320459 A1 | 12/2010 | Umeda et al. |
| 2011/0012117 A1 | 1/2011 | Yamazaki et al. |
| 2011/0062432 A1 | 3/2011 | Yamazaki et al. |
| 2011/0068335 A1 | 3/2011 | Yamazaki et al. |
| 2011/0084264 A1 | 4/2011 | Yamazaki et al. |
| 2011/0104851 A1 | 5/2011 | Akimoto et al. |
| 2011/0114943 A1 | 5/2011 | Yamazaki et al. |
| 2011/0121290 A1 | 5/2011 | Akimoto et al. |
| 2011/0193079 A1 | 8/2011 | Endo et al. |
| 2011/0198600 A1 | 8/2011 | Hayashi et al. |
| 2011/0215317 A1 | 9/2011 | Yamazaki et al. |
| 2011/0215326 A1 | 9/2011 | Godo et al. |
| 2011/0220891 A1 | 9/2011 | Fujii et al. |
| 2011/0286256 A1 | 11/2011 | Kamata |
| 2012/0026787 A1 | 2/2012 | Uochi et al. |
| 2012/0052606 A1 | 3/2012 | Yamazaki |
| 2012/0074407 A1 | 3/2012 | Yamazaki et al. |
| 2012/0241734 A1 | 9/2012 | Honda et al. |
| 2012/0276694 A1 | 11/2012 | Koezuka et al. |
| 2012/0315735 A1 | 12/2012 | Koezuka et al. |
| 2013/0001557 A1 | 1/2013 | Okazaki et al. |
| 2013/0043466 A1 | 2/2013 | Nomura et al. |
| 2013/0161610 A1 | 6/2013 | Yamazaki |
| 2014/0154837 A1 | 6/2014 | Yamazaki |
| 2014/0191230 A1 | 7/2014 | Honda et al. |
| 2015/0228667 A1 | 8/2015 | Yamazaki et al. |
| 2015/0340513 A1 | 11/2015 | Akimoto et al. |
| 2016/0268437 A1 | 9/2016 | Yamazaki et al. |

FOREIGN PATENT DOCUMENTS

| | | |
|---|---|---|
| EP | 1209748 A | 5/2002 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2061087 A | 5/2009 |
| EP | 2159845 A | 3/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-001273 A | 1/1989 |
| JP | 05-251705 A | 9/1993 |
| JP | 07-321337 A | 12/1995 |
| JP | 08-023101 A | 1/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-041362 A | 2/2003 |
| JP | 2003-050405 A | 2/2003 |
| JP | 2003-068646 A | 3/2003 |
| JP | 2003-086000 A | 3/2003 |
| JP | 2003-086808 A | 3/2003 |
| JP | 2003-197638 A | 7/2003 |
| JP | 2004-103957 A | 4/2004 |
| JP | 2004-273614 A | 9/2004 |
| JP | 2004-273732 A | 9/2004 |
| JP | 2006-041465 A | 2/2006 |
| JP | 2006-060209 A | 3/2006 |
| JP | 2006-165528 A | 6/2006 |
| JP | 2006-165531 A | 6/2006 |
| JP | 2007-123861 A | 5/2007 |
| JP | 2007-220816 A | 8/2007 |
| JP | 2008-042088 A | 2/2008 |
| JP | 2008-060419 A | 3/2008 |
| JP | 2008-112909 A | 5/2008 |
| JP | 2008-281988 A | 11/2008 |

(56) References Cited

FOREIGN PATENT DOCUMENTS

| JP | 2009-141342 A | 6/2009 |
|---|---|---|
| JP | 2009-167087 A | 7/2009 |
| JP | 2009-528670 | 8/2009 |
| JP | 2009-253204 A | 10/2009 |
| JP | 2009-260002 A | 11/2009 |
| JP | 2010-040552 A | 2/2010 |
| JP | 2010-045263 A | 2/2010 |
| JP | 2010-062229 A | 3/2010 |
| JP | 2010-062547 A | 3/2010 |
| JP | 2010-199456 A | 9/2010 |
| JP | 2011-009415 A | 1/2011 |
| JP | 2011-035387 A | 2/2011 |
| JP | 2011-054942 A | 3/2011 |
| KR | 2008-0052107 A | 6/2008 |
| WO | WO-2004/114391 | 12/2004 |
| WO | WO-2007/142167 | 12/2007 |
| WO | WO-2008/126879 | 10/2008 |
| WO | WO-2009/075281 | 6/2009 |
| WO | WO-2011/004723 | 1/2011 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry. Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11. pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials). 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Symposium of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transitionithe "Blue Phase"", Physics Letters, Sep. 10, 1973, vol. 45A, No. 2, pp. 115-116.

Cho.D et al., "21.2: Al and Sn-Doped Zinc Indium Oxide Thin Film Transistors for AMOLED Backplane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

(56) References Cited

OTHER PUBLICATIONS

Parks et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68,3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical.Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactlons on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers. May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application". SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 50, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure To Water", Appl. Phys. Lett. (Applied Physics Letters) . 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using Castep", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
European Search Report (Application No. 12165147.5) dated Aug. 16, 2012.
Chinese Office Action (Application No. 201210114763.X) dated Sep. 2, 2015.
Taiwanese Office Action (Application No. 105124153) dated Jan. 18, 2017.
Korean Office Action (Application No. 2012-0043275) dated Jul. 19, 2018.

* cited by examiner

IGZO

IGZO

SiOx

FIG. 26A  FIG. 26B
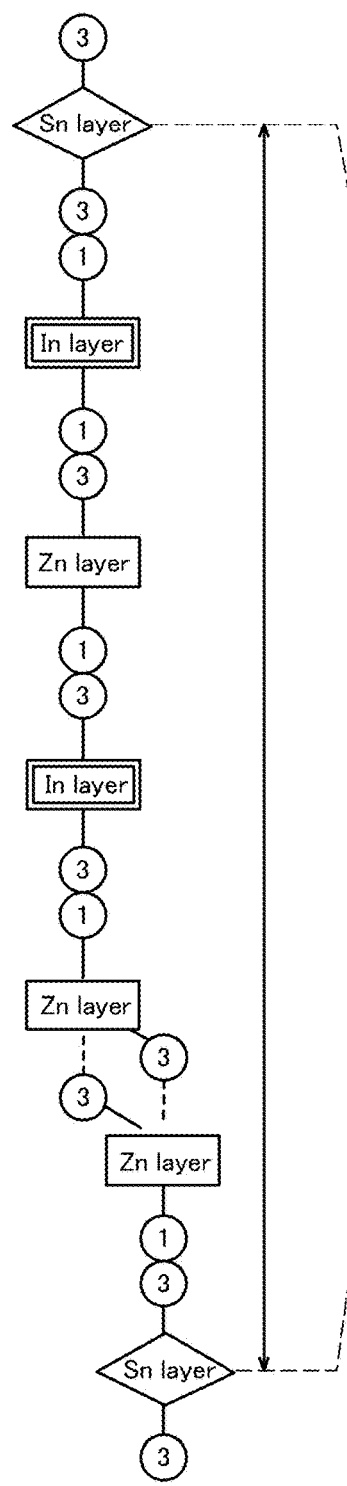
FIG. 26C
● In
☾ Sn
⌣ Zn
• O

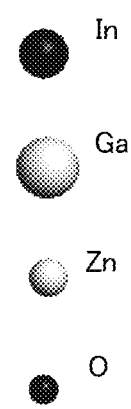

MANUFACTURING METHOD OF SEMICONDUCTOR DEVICE

BACKGROUND OF THE INVENTION

1. Field of the Invention

The present invention relates to a semiconductor device and a method for manufacturing the semiconductor device.

In this specification, a semiconductor device means any device which can function utilizing semiconductor characteristics, and includes in its category an electrooptic device, a semiconductor circuit, and an electronic device.

2. Description of the Related Art

Attention has been focused on a technique for forming a transistor using a semiconductor thin film formed over a substrate having an insulating surface (the transistor is also referred to as a thin film transistor (TFT)). The transistor has been applied to a wide range of electronic devices such as an integrated circuit (IC) and an image display device (display device). Although a silicon-based semiconductor material is widely known as a material for a semiconductor thin film applicable to a transistor, an oxide semiconductor has been attracting attention as an alternative material.

For example, a transistor whose active layer uses an amorphous oxide containing indium (In), gallium (Ga), and zinc (Zn) with an electron carrier concentration of less than $10^{18}/cm^3$ is disclosed (see Patent Document 1).

REFERENCE

Patent Document 1: Japanese Published Patent Application No. 2006-165528

SUMMARY OF THE INVENTION

However, the electric conductivity of an oxide semiconductor is changed by deviation from the stoichiometric composition or entrance of hydrogen or moisture, which forms an electron donor, in the oxide semiconductor. Such a phenomenon leads to a change in the electric characteristics of a transistor using the oxide semiconductor.

In view of the foregoing, one object of one embodiment of the present invention is to provide a semiconductor device using an oxide semiconductor with stable electric characteristics to improve the reliability.

In a process for manufacturing a transistor including an oxide semiconductor film, an oxide semiconductor film containing a crystal having a c-axis which is substantially perpendicular to a top surface of the oxide semiconductor film (also referred to as a first crystalline oxide semiconductor film) is formed, and oxygen is added to the oxide semiconductor film to amorphize at least part of the oxide semiconductor film, so that an amorphous oxide semiconductor film containing an excess of oxygen is formed. Then, an aluminum oxide film is formed over the amorphous oxide semiconductor film, and heat treatment is performed thereon to crystallize at least part of the amorphous oxide semiconductor film, so that an oxide semiconductor film containing a crystal having a c-axis which is substantially perpendicular to a top surface of the oxide semiconductor film (also referred to as a second crystalline oxide semiconductor film) is formed.

As the method for adding oxygen (containing at least one of an oxygen radical, an oxygen atom, and an oxygen ion) into the first crystalline oxide semiconductor film, an ion implantation method, an ion doping method, a plasma immersion ion implantation method, plasma treatment, or the like can be used.

The oxide semiconductor film containing a crystal having a c-axis substantially perpendicular to a top surface of the oxide semiconductor film (hereinafter also referred to as a crystalline oxide semiconductor film) has neither a single crystal structure nor an amorphous structure, and is a crystalline oxide semiconductor having a c-axis alignment (also referred to as a c-axis aligned crystalline oxide semiconductor (CAAC-OS)). The crystalline oxide semiconductor film enables a change in the electric characteristics of the transistor due to irradiation with visible light or ultraviolet light to be further suppressed, so that a highly reliable semiconductor device can be provided.

According to one embodiment of the present invention disclosed herein, oxygen is added into a first crystalline oxide semiconductor (CAAC-OS) film to amorphize at least part of the first crystalline oxide semiconductor film to lower the crystallinity, and then, heat treatment is performed thereon to recrystallize the oxide semiconductor film, so that a second crystalline oxide semiconductor (CAAC-OS) film is formed. The first crystalline oxide semiconductor (CAAC-OS) film and the second crystalline oxide semiconductor (CAAC-OS) film are oxide semiconductor (CAAC-OS) films each containing a crystal having a c-axis which is substantially perpendicular to a top surface of the oxide semiconductor film. Since the first crystalline oxide semiconductor (CAAC-OS) film is the crystalline oxide semiconductor (CAAC-OS) film containing a crystal having a c-axis which is substantially perpendicular to the top surface of the oxide semiconductor film like the second crystalline oxide semiconductor (CAAC-OS) film, the crystallinity of the second crystalline oxide semiconductor (CAAC-OS) film obtained through oxygen addition and recrystallization can be improved.

The oxide semiconductor film (the amorphous oxide semiconductor film, the second crystalline oxide semiconductor film) has a region containing an excess of oxygen as compared to the stoichiometric composition ratio of the oxide semiconductor in a crystalline state, owing to the oxygen addition. In that case, the oxygen content is greater than that in the stoichiometric oxide semiconductor or higher than that in the single crystal state. In some cases, oxygen exists between lattices of the oxide semiconductor. The composition of such an oxide semiconductor can be expressed by $InGaZn_mO_{m+3x}$ ($x>1$). For example, supposing that m=1, the value of 1+3x in $InGaZnO_{1+3x}$ ($x>1$) exceeds 4 in the case where the content of oxygen is excess.

In an oxide semiconductor film, oxygen may be eliminated to form an oxygen vacancy. An oxide semiconductor with no excess oxygen cannot repair such an oxygen vacancy with other oxygen. In contrast, since the second crystalline oxide semiconductor film according to one embodiment of the present invention is a CAAC-OS film containing an excess of oxygen, the excess of oxygen (which is preferably excess as compared to the stoichiometric composition ratio) contained in the film can act to repair an oxygen vacancy in the second crystalline oxide semiconductor film immediately.

The aluminum oxide film provided over the oxide semiconductor film has a high shielding effect (blocking effect) of blocking penetration of both oxygen and impurities such as hydrogen, moisture, a hydroxyl group, and hydride (also referred to as a hydrogen compound).

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

Further, since the heat treatment for crystallizing the amorphous oxide semiconductor film is performed in the state where the amorphous oxide semiconductor film is covered with the aluminum oxide film, oxygen can be prevented from being released from the amorphous oxide semiconductor film by the heat treatment. Thus, the resulting second crystalline oxide semiconductor film can maintain the amount of oxygen contained in the amorphous oxide semiconductor film, and therefore has a region where the amount of oxygen content is excess as compared to the stoichiometric oxide semiconductor in a crystalline state.

Therefore, the second crystalline oxide semiconductor film has high purity because impurities such as hydrogen and moisture do not enter the second crystalline oxide semiconductor film, and has the region where the amount of oxygen is excess as compared to the stoichiometric oxide semiconductor in a crystalline state because oxygen is prevented from being released therefrom. Accordingly, the crystalline oxide semiconductor film enables a variation in the threshold voltage $V_{th}$ of the transistor and a shift of the threshold voltage ($\Delta V_{th}$) due to an oxygen vacancy to be reduced.

Before the aluminum oxide film is formed, it is preferable to perform heat treatment for dehydration or dehydrogenation on the first crystalline oxide semiconductor film so as to remove a hydrogen atom, an impurity containing a hydrogen atom such as water, and the like from the oxide semiconductor film.

By removing hydrogen from the oxide semiconductor to highly purify the oxide semiconductor so as not to contain impurities as much as possible, and repairing oxygen vacancies therein, the oxide semiconductor can be turned into an i-type (intrinsic) oxide semiconductor or a substantially i-type (intrinsic) oxide semiconductor. That is, with the removal of impurities such as hydrogen and water as much as possible and repair of oxygen vacancies, a highly purified i-type (intrinsic) or substantially i-type (intrinsic) oxide semiconductor can be realized. Thus, the Fermi level (Ef) of the oxide semiconductor can be changed to the same or substantially the same level as the intrinsic Fermi level (Ei).

One embodiment of a structure of the present invention is a method for manufacturing a semiconductor device in which a first crystalline oxide semiconductor film containing a crystal having a c-axis which is substantially perpendicular to a top surface of the film is formed over an insulating film; a gate insulating film is formed over the first crystalline oxide semiconductor film; oxygen is added to the first crystalline oxide semiconductor film through the gate insulating film, so that an oxide semiconductor film at least part of which is amorphous is formed; a gate electrode layer is formed over the gate insulating film; an aluminum oxide film is formed over the gate electrode layer; and heat treatment is performed thereon to crystallize at least part of the oxide semiconductor film at least part of which is amorphous, so that a second crystalline oxide semiconductor film containing a crystal having a c-axis which is substantially perpendicular to a top surface of the second crystalline oxide semiconductor film is formed.

One embodiment of a structure of the present invention is a method for manufacturing a semiconductor device in which a first crystalline oxide semiconductor film containing a crystal having a c-axis which is substantially perpendicular to a top surface of the film is formed over an insulating film; a gate insulating film is formed over the first crystalline oxide semiconductor film; a gate electrode layer is formed over the gate insulating film; oxygen is added to the first crystalline oxide semiconductor film through the gate insulating film, so that an oxide semiconductor film at least part of which is amorphous is formed; an aluminum oxide film is formed over the gate electrode layer; and heat treatment is performed thereon to crystallize at least part of the oxide semiconductor film at least part of which is amorphous, so that a second crystalline oxide semiconductor film containing a crystal having a c-axis which is substantially perpendicular to a top surface of the second crystalline oxide semiconductor film is formed.

In the above-described structure, the first crystalline oxide semiconductor film containing a crystal having a c-axis which is substantially perpendicular to a top surface of the film can be formed by any of the following methods: an amorphous oxide semiconductor film is formed over the insulating film, and is at least partly crystallized by performing heat treatment thereon; film formation is performed over the insulating film while being heated.

Further, a top surface of the insulating film in a region which is in contact with the oxide semiconductor film preferably has less roughness. Specifically, the average surface roughness of the top surface of the insulating film is preferably greater than or equal to 0.05 nm and less than 0.5 nm (or greater than or equal to 0.1 nm and less than 0.5 nm). Such a top surface of the insulating film with less surface roughness enables the oxide semiconductor film to have stable and high crystallinity.

Further, an oxide insulating film may be formed between the gate electrode layer and the aluminum oxide film in the above-described structure. Further, an insulating layer with a sidewall structure covering the side surface of the gate electrode layer may be formed before formation of the aluminum oxide film.

Further, heat treatment for releasing hydrogen or moisture may be performed on the first crystalline oxide semiconductor film in the above-described structure.

A transistor using such a highly purified crystalline oxide semiconductor film containing excess oxygen which repairs an oxygen vacancy has less change in electric characteristics and thus is electrically stable. Accordingly, a highly reliable semiconductor device using an oxide semiconductor having stable electric characteristics can be provided.

The aluminum oxide film is provided over the crystalline oxide semiconductor film so that excess oxygen contained in the oxide semiconductor film is not released by the heat treatment, generation and increase of a defect in the crystalline oxide semiconductor and in any interface between the crystalline oxide semiconductor film and the overlying or underlying layer in contact with the crystalline oxide semiconductor film can be prevented. That is, excess oxygen contained in the crystalline oxide semiconductor film acts to fill an oxygen-vacancy defect, so that a highly reliable semiconductor device having stable electric characteristics can be provided.

Accordingly, in accordance with one embodiment of the present invention, a transistor having stable electric characteristics can be manufactured.

Further, in accordance with one embodiment of the present invention, a highly reliable semiconductor device having favorable electric characteristics can be manufactured.

BRIEF DESCRIPTION OF THE DRAWINGS

FIG. 26A to 26C show a structure of an oxide material according to one embodiment of the present invention.

DETAILED DESCRIPTION OF THE INVENTION

Hereinafter, embodiments of the invention disclosed in this specification are described with reference to the accompanying drawings. The invention disclosed in this specification is not limited to the following description, and it will be easily understood by those skilled in the art that modes and details thereof can be variously changed without departing from the spirit and the scope of the present invention. Therefore, the invention disclosed in this specification is not construed as being limited to the description of the following embodiments. The ordinal numbers such as "first" and "second" are used for convenience and do not denote the order of steps or the stacking order of layers. In addition, the ordinal numbers in this specification do not denote particular names which specify the present invention.

(Embodiment 1)

In this embodiment, one embodiment of a semiconductor device and a method for manufacturing the semiconductor device is described with reference to FIGS. 1A to 1F. In this embodiment, a transistor including an oxide semiconductor film is described as an example of the semiconductor device.

A structure of the transistor is not particularly limited as long as it is a top-gate structure; for example, a staggered or a planar type can be employed. Further, the transistor may have a single gate structure including one channel formation region, a double gate structure including two channel formation regions, or a triple gate structure including three channel formation regions. Alternatively, the transistor may have a dual gate structure including two gate electrode layers positioned over and below a channel region each with a gate insulating layer provided therebetween.

Figure 1A:
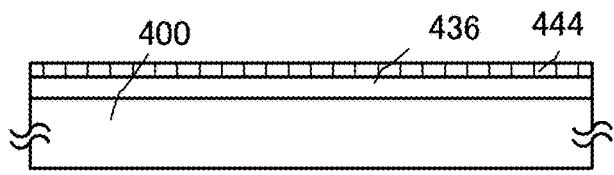
FIGS. 1A to 1F show one embodiment of a semiconductor device and a method for manufacturing the semiconductor device.
Figure 1B:
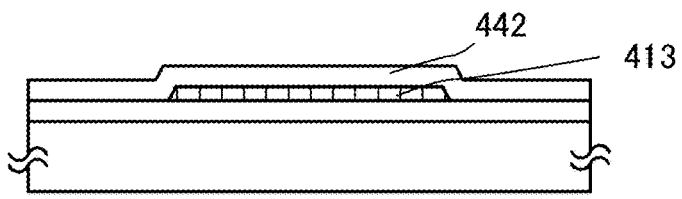
Figure 1C:
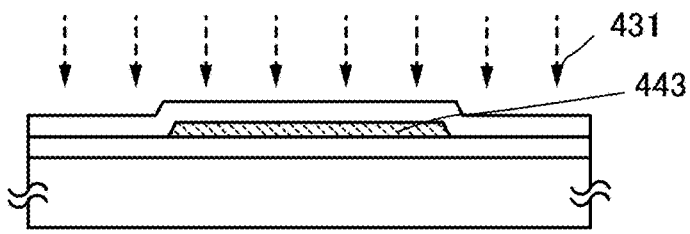
Figure 1D:
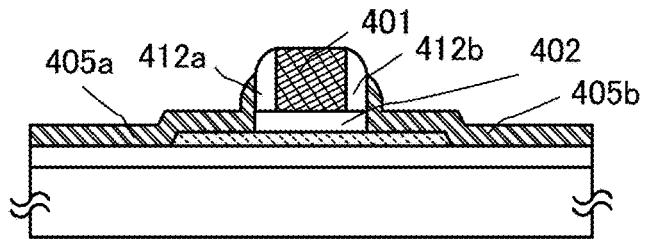
Figure 1E:
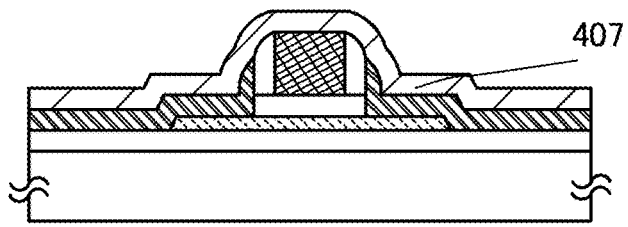
Figure 1F:
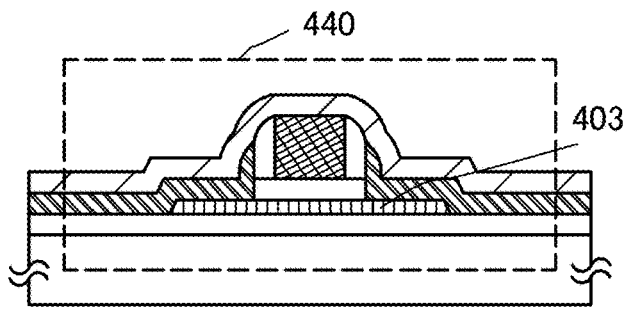

As shown in FIG. 1F, a transistor 440 includes over a substrate 400 provided with an insulating layer 436 as an insulating surface, a source electrode layer 405a, a drain electrode layer 405b, a crystalline oxide semiconductor film 403, a gate insulating layer 402, and a gate electrode layer 401. An insulating layer 407 is formed over the transistor 440.

The insulating layer 407 has either a single-layer structure or a stacked-layer structure, and includes an aluminum oxide film. In this embodiment, an aluminum oxide film is used as the insulating layer 407.

The crystalline oxide semiconductor film 403 is an oxide semiconductor film which has an a-b plane substantially parallel to a top surface of the crystalline oxide semiconductor film and includes a crystal having a c-axis which is substantially perpendicular to the top surface. Furthermore, the crystalline oxide semiconductor film 403 has neither a single crystal structure nor an amorphous structure and is a crystalline oxide semiconductor having c-axis alignment (CAAC-OS). The crystalline oxide semiconductor film enables electric characteristics of the transistor due to irradiation with visible light or ultraviolet light to be further suppressed to form a highly reliable semiconductor device.

FIGS. 1A to 1F illustrate an example of a method for manufacturing the transistor 440.

First, the insulating layer 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate comprised of silicon, silicon carbide, or the like; a compound semiconductor substrate of silicon germanium or the like; an SOI substrate; or the like can be used as the substrate 400, or such a substrate provided with a semiconductor element can also be used as the substrate 400.

The semiconductor device may be manufactured using a flexible substrate as the substrate 400. In order to manufacture a flexible semiconductor device, the transistor 440 including the crystalline oxide semiconductor film 403 may be directly formed over a flexible substrate; or alternatively, the transistor 440 including the crystalline oxide semiconductor film 403 may be formed over a substrate, and then, the transistor 440 may be separated and transferred to a flexible substrate. In order to separate the transistor from the substrate and transfer to the flexible substrate, a separation layer may be provided between the substrate and the transistor including the oxide semiconductor film.

The insulating layer 436 can be formed by a plasma enhanced CVD method, a sputtering method, or the like using silicon oxide, silicon oxynitride, aluminum oxide, aluminum oxynitride, hafnium oxide, gallium oxide, silicon nitride, silicon nitride oxide, aluminum nitride, aluminum nitride oxide, or a mixed material thereof.

The insulating layer 436 has either a single-layer structure or a stacked-layer structure; an oxide insulating layer is preferably used as the film to be in contact with the crystalline oxide semiconductor film 403. A silicon oxide film is formed by a sputtering method as the insulating layer 436 in this embodiment.

Next, a crystalline oxide semiconductor film 444 is formed over the insulating layer 436 (see FIG. 1A).

The insulating layer 436, which is in contact with the crystalline oxide semiconductor film 444, preferably contains oxygen which exceeds at least the stoichiometric composition ratio in the film (the bulk). For example, in the case where a silicon oxide film is used as the insulating layer 436, the composition formula is $SiO_{2+\alpha}$ ($\alpha$>0). By using such a film as the insulating layer 436 described above, oxygen can be supplied to the crystalline oxide semiconductor film 444, leading to favorable characteristics. Oxygen supplied to the crystalline oxide semiconductor film 444 can repair oxygen vacancies in the film.

For example, an insulating layer containing a large amount of (an excess of) oxygen, which is a supply source of oxygen, may be provided as the insulating layer 436 so as to be in contact with the crystalline oxide semiconductor film 444, whereby oxygen can be supplied from the insulating layer 436 to the crystalline oxide semiconductor film 444. Heat treatment may be performed in the state where the crystalline oxide semiconductor film 444 and the insulating layer 436 are in contact with each other at least partly, so that oxygen is supplied to the crystalline oxide semiconductor film 444.

Further, a top surface of the insulating layer 436 in a region which is in contact with the crystalline oxide semiconductor film 444 preferably has less roughness. Specifically, the average surface roughness of the top surface is preferably greater than or equal to 0.05 nm and less than 0.5 nm (or greater than or equal to 0.1 nm and less than 0.5 nm). Such a top surface of the insulating layer with less surface roughness enables the crystalline oxide semiconductor film 444 to have stable and high crystallinity.

In this specification and the like, average surface roughness ($R_a$) is obtained by three-dimension expansion of the center line average roughness ($R_a$) which is defined by JISB0601:2001 (ISO 4287:1997) so that $R_a$ can be applied to a measurement surface, and is an average value of the absolute values of deviations from a reference surface to a specific surface.

The center line average roughness ($R_a$) is expressed by the following formula (1), where a portion by a measurement length L is picked up from a roughness curve in the direction of the center line of the roughness curve, the direction of a center line of the roughness curve of the picked portion is an X-axis, the direction of longitudinal magnification (direction perpendicular to the X-axis) is a Y-axis, and the roughness curve is expressed by Y=F(X).

[FORMULA 1]

$$R_a = \frac{1}{L}\int_0^L |F(X)| dX \quad (1)$$

Where the measurement surface which is a surface represented by measurement data is expressed by Z=F(X,Y), the average surface roughness ($R_a$) is an average value of the absolute values of deviations from the reference surface to the specific surface and is expressed by the following formula (2).

[FORMULA 2]

$$R_a = \frac{1}{S_0}\int_{Y_1}^{Y_2}\int_{X_1}^{X_2} |F(X, Y) - Z_0| dXdY \quad (2)$$

Here, the specific surface is a surface which is a target of roughness measurement, and is a rectangular region which is surrounded by four points represented by the coordinates $(X_1,Y_1)$, $(X_1,Y_2)$, $(X_2,Y_1)$, and $(X_2,Y_2)$, and $S_0$ denotes the area of the specific surface when assumed to be flat ideally.

In addition, the reference surface refers to a surface parallel to the X-Y plane at the average height of the specific surface. In short, where the average value of the height of the specific surface is $Z_0$, the height of the reference surface is also denoted by $Z_0$.

Therefore, planarizing treatment may be performed on the region of the insulating layer 436 which is in contact with the crystalline oxide semiconductor film 444. As the planarizing treatment, polishing treatment (e.g., chemical mechanical polishing (CMP)), dry-etching treatment, or plasma treatment can be used, though there is no particular limitation on the planarizing treatment.

As the plasma treatment, a reverse sputtering in which an argon gas is introduced and plasma is produced can be performed. The reverse sputtering is a method in which voltage is applied to a substrate side with use of an RF power source in an argon atmosphere and plasma is formed in the vicinity of the substrate so that a substrate surface is modified. Instead of the argon atmosphere, a nitrogen atmosphere, a helium atmosphere, an oxygen atmosphere, or the like may be used. The reverse sputtering can remove particle substances (also referred to as particles or dust) attached to the top surface of the insulating layer 436.

As the planarizing treatment, polishing treatment, dry-etching treatment, or plasma treatment may be performed plural times and/or in combination. Further, the order of steps of such a combination is not particularly limited and may be set as appropriate in accordance with roughness of the top surface of the insulating layer 436.

In order that hydrogen or water will not enter the crystalline oxide semiconductor film 444 as much as possible in the formation step of the crystalline oxide semiconductor film 444, it is preferable to heat the substrate provided with the insulating layer 436 in a preheating chamber in a sputtering apparatus as a pretreatment for formation of the crystalline oxide semiconductor film 444 so that impurities such as hydrogen and moisture adsorbed to the substrate and the insulating layer 436 are eliminated and evacuated. As an exhaustion unit provided in the preheating chamber, a cryopump is preferable.

The crystalline oxide semiconductor film 444 is an oxide semiconductor film having a crystallized portion; CAAC-OS (c-axis aligned crystalline oxide semiconductor) is used in this embodiment. The crystalline oxide semiconductor film 444 contains a crystal having a c-axis which is substantially perpendicular to a top surface of the crystalline oxide semiconductor film 444.

CAAC-OS is an oxide semiconductor containing a crystal with c-axis alignment which has a triangular or hexagonal atomic arrangement when seen from the direction of the a-b plane, the top surface, or the interface and in which metal atoms are arranged in a layered manner, or metal atoms and oxygen atoms are arranged in a layered manner along the c-axis, and the direction of the a-axis or the b-axis is varied in the a-b plane (or the top surface or the interface), that is, which rotates around the c-axis.

In a broad sense, CAAC-OS means a non-single-crystal material including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis direction.

The CAAC-OS is not a single crystal, but is not only in an amorphous state. The CAAC-OS includes a crystallized portion (crystalline portion), and a boundary between one crystalline portion and another crystalline portion is not clear in some positions.

Nitrogen may be substituted for part of oxygen which constitutes part of the CAAC-OS. The c-axes of individual crystalline portions included in the CAAC-OS may be aligned in one direction (e.g., the direction perpendicular to a surface of a substrate over which the CAAC-OS is formed, or a top surface, a film surface, and an interface of the CAAC-OS, or the like). Alternatively, the normals of the a-b planes of the individual crystalline portions included in the CAAC-OS may be aligned in one direction (e.g., a direction perpendicular to the substrate surface or the surface, film surface, interface, or the like of the CAAC-OS).

First, CAAC-OS is described in detail using FIGS. 25A to 25C and FIGS. 26A to 26C. In FIGS. 25A to 25C and FIGS. 26A and 26B, the upward direction corresponds to the c-axis direction and a plane perpendicular to the c-axis direction corresponds to the a-b plane, unless otherwise specified. The simple expressions of an "upper half" and a "lower half" refer to an upper half above the a-b plane and a lower half below the a-b plane (an upper half and a lower half with respect to the a-b plane), respectively. Furthermore, in FIGS. 25A to 25C, O surrounded by a circle represents tetracoodianate O and O surrounded by a double circle represents tricoodenate O.

Figure 25A:
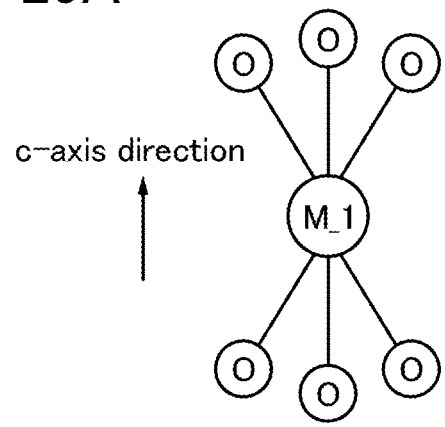
FIGS. 25A to 25C show structures of oxide materials according to one embodiment of the present invention.

FIG. 25A illustrates a structure having one hexacoordinate metal atom M_1 and six tetracoordinate oxygen atoms O proximate to the metal atom M_1. Such a structure in which only one metal atom and proximate oxygen atoms to the metal atom are illustrated is called a subunit herein. The structure in FIG. 25A is an octahedral structure, but is illustrated as a planar structure for simplicity. Three tetracoordinate O exist in each of the upper half and the lower half in FIG. 25A.

Figure 25B:
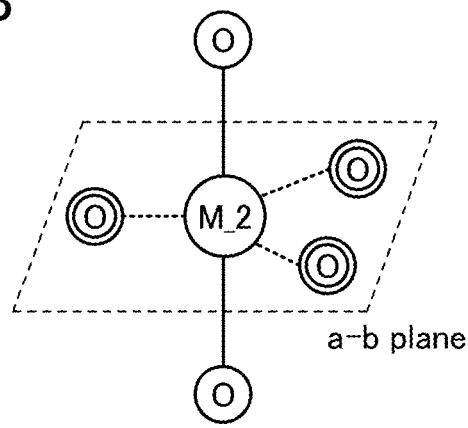

FIG. 25B illustrates a structure having one pentacoordinate metal atom M_2, three tricoordinate oxygen atoms (hereinafter referred to as tricoordinate O) proximate to the metal atom M_2, and two tetrocoordinate O proximate to the metal atom M_2. All the tricoordinate O exist on the a-b plane. One tetracoordinate O exists in each of the upper half and the lower half in FIG. 25B.

Figure 25C:
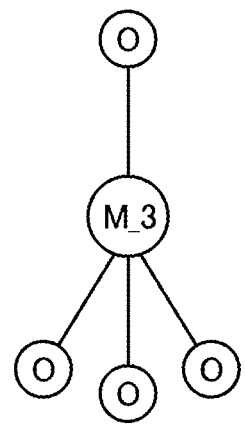

FIG. 25C illustrates a structure having one tetracoordinate metal atom M_3 and four tetracoordinate O proximate to the metal atom M_3. One tetracoordinate O exists in the upper half and three tetracoordinate O exist in the lower half in FIG. 25C. Alternatively, three tetracoordinate O atoms may exist in the upper half and one tetracoordinate O atom may exist in the lower half in FIG. 25C.

Such a metal atom whose coordination number is 4, 5, or 6 is bonded to another metal atom through tetracoordinate O. Specifically, a metal atom is bonded to another metal atom through four tetracoordinate O in total. For example, in the case where the hexacoordinate metal atom M_1 is bonded through three tetracoordinate O in the upper half, it is bonded to the pentacoordinate metal atom M_2 through tetracoordinate O in the upper half with respect to the pentacoordinate metal atom M_2, the pentacoordinate metal atom M_2 through tetracoordinate O in the lower half with respect to the pentacoordinate metal atom M_2, or the tetracoordinate metal atom M_3 through the tetracoordinate O in the upper half with respect to the tetracoordinate metal atom M_3.

Such a metal atom whose coordination number is 4, 5, or 6 is bonded to another metal atom through tetracoordinate O. Besides, subunits are bonded to each other so that the total electric charge in the layer structure is 0 to constitute one group.

FIG. 26A illustrates a model of one group which constitutes a layer structure of an In—Sn—Zn—O system. A structure in which only one metal atom and proximate oxygen atoms to the metal atom are illustrated is referred to as a subunit, a group of a plurality of subunits is referred to as one group, and one cycle which consists of a plurality of groups as shown in FIG. 26B is referred to as a unit herein. FIG. 26C illustrates an atomic arrangement of the layer structure in FIG. 26B when observed from the direction perpendicular to the film top surface, the substrate surface, or the interface.

In FIG. 26A, tricoordinate O is omitted for simplicity, and tetracoordinate O is illustrated by circling the number thereof. For example, three tetracoordinate O existing in each of the upper half and the lower half with respect to a Sn atom are denoted by circled 3. Similarly, in FIG. 26A, one tetracoordinate O existing in each of the upper half and the lower half with respect to an In atom is denoted by circled 1. FIG. 26A also illustrates a Zn atom proximate to one tetracoordinate O in the lower half and three tetracoordinate O in the upper half, and a Zn atom proximate to one tetracoordinate O in the upper half and three tetracoordinate O in the lower half.

In FIG. 26A, one group which constitutes the layer structure of an In—Sn—Zn—O system is a structure in which the following metal atoms are bonded to each other in this order from the top: the Sn atom proximate to three tetracoordinate O in each of the upper half and the lower half; the In atom proximate to one tetracoordinate O in each of the upper half and the lower half; the Zn atom proximate to three tetracoordinate O in the upper half; the In atom proximate to three tetracoordinate O in each of the upper half and the lower half, which is bonded to the Zn atom through one tetracoordinate O in the lower half with respect to the Zn atom; the Zn atom proximate to one tetracoordinate O in the upper half; the Zn atom which is bonded to the Zn atom through three tetracoordinate O in the lower half with respect to the Zn atom; and Sn atom which is bonded to the Zn atom through one tetracoordinate O in the lower half with respect to the Zn atom. A plurality of groups is bonded to constitute one cycle, one unit.

Here, electric charge for one bond of tricoordinate O and electric charge for one bond of tetracoordinate O can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Therefore, electric charge of a subunit of a Sn atom is +1. Thus, electric charge of −1, which cancels +1, is needed to form a layer structure including a Sn atom. As such a structure having electric charge of −1, a structure in which two subunits of Zn atoms are bonded as shown in FIG. 26A can be given. For example, two bonded subunits of Zn atoms with respect to one subunit of a Sn atom enables electric charge to be canceled, whereby the total electric charge in the layer structure can result in 0.

An In atom can have either 5 ligands or 6 ligands. With a plurality of cycles each illustrated in FIG. 26B, an In—Sn—Zn—O-based crystal ($In_2SnZn_3O_8$) can be formed. A layer structure of the In—Sn—Zn—O system can be expressed by a composition formula, $In_2SnZn_2O_7(ZnO)_m$ (m is 0 or a natural number). As larger m is, the crystallinity of the In—Sn—Zn—O-based crystal improves, which is preferable.

The above can be applied also in the case where the following is used: a four-component metal oxide such as an In—Sn—Ga—Zn—O-based oxide semiconductor; a three-component metal oxide such as an In—Ga—Zn—O-based oxide semiconductor (also referred to as IGZO), an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; or a single-component metal oxide such as an In—O-based oxide semiconductor, a Sn—O-based oxide semiconductor, or a Zn—O-based oxide semiconductor.

Figure 27A:
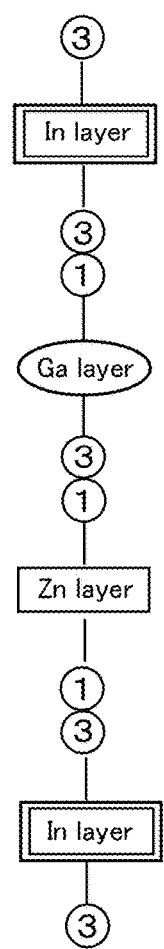
FIGS. 27A to 27C show a structure of an oxide material according to one embodiment of the present invention.

For example, FIG. 27A illustrates a model of a first group as an example of a structure of a layer structure of an In—Ga—Zn—O system.

In FIG. 27A, the first group which constitutes the layer structure of an In—Ga—Zn—O system is a structure in which the following metal atoms are bonded to each other in this order from the top: an In atom proximate to three tetracoordinate O in each of the upper half and the lower half; a Ga atom proximate to one tetracoordinate O in the upper half; a Zn atom proximate to one tetracoordinate O in each of the upper half and the lower half, which is bonded to the Ga atom through three tetracoordinate O in the lower half with respect to the Ga atom; and an In atom proximate to three tetracoordinate O in each of the upper half and the lower half, which is bonded to the Zn atom through one tetracoordinate O in the lower half with respect to the Zn atom. A plurality of (3 in this embodiment) first groups is bonded to constitute one cycle, one unit.

Figure 27B:
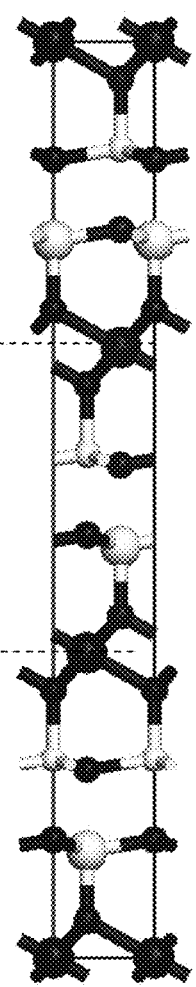
Figure 27C:
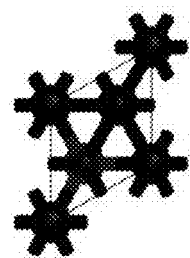

One cycle which consists of a plurality of first groups is illustrated in FIG. 27B. FIG. 27C illustrates an atomic arrangement of the layer structure in FIG. 27B when observed from the direction perpendicular to the film top surface, the substrate surface, or the interface.

Figure 28A:
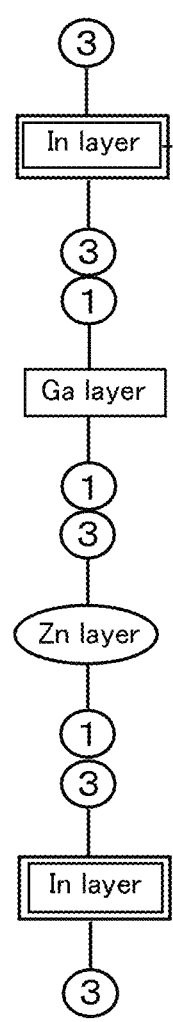
FIGS. 28A to 28C show a structure of an oxide material according to one embodiment of the present invention.
Figure 28B:
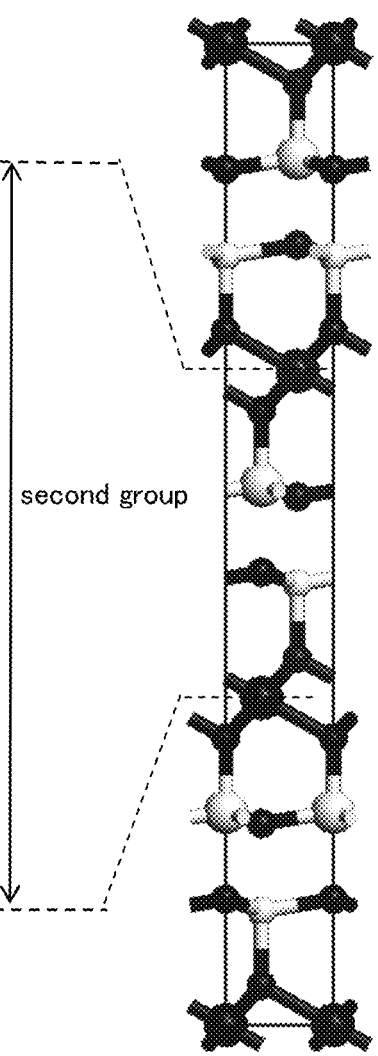
Figure 28C:
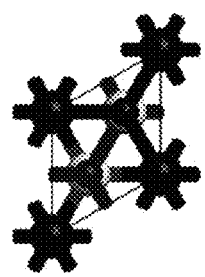

The group which constitutes the layer structure of an In—Ga—Zn—O system is not limited to the first group shown in FIG. 27A, and instead, another combination of subunits can be used. For example, a second group which constitutes another In—Ga—Zn—O system is illustrated in FIG. 28A, and one cycle which consists of a plurality of second groups is illustrated in FIG. 28B. FIG. 28C illustrates an atomic arrangement of the layer structure in FIG. 28B when observed from the direction perpendicular to the film top surface, the substrate surface, or the interface.

FIG. 28A illustrates a model of the second group as another example of a structure of a layer structure of an In—Ga—Zn—O system.

In FIG. 28A, the second group which constitutes the layer structure of an In—Ga—Zn—O system is a structure in which the following metal atoms are bonded to each other in this order from the top: an In atom proximate to three tetracoordinate O in each of the upper half and the lower half; a Ga atom proximate to one tetracoordinate O in each of the upper half and the lower half; a Zn atom proximate to three tetracoordinate O in the upper half; and an In atom proximate to three tetracoordinate O in each of the upper half and the lower half, which is bonded to the Zn atom through one tetracoordinate O in the lower half with respect to the Zn atom. A plurality of (3 in this embodiment) second groups is bonded to constitute one cycle, one unit.

Electric charge of a (hexacoordinate or pentacoordinate) In atom, electric charge of a (tetracoordinate) Zn atom, and electric charge of a (hexacoordinate) Ga atom are +3, +2, and +3, respectively. Therefore, electric charge of a subunit of an In atom, a Zn atom, and a Ga atom results in 0. Thus, the total electric charge of a layer structure which consists of a combination of the subunits is always 0.

The group which constitutes the layer structure of an In—Ga—Zn—O system is not limited to the first group and the second group; a variety of atoms can be used in combination to constitute the group. For example, any combination can be used as long as it has c-axis alignment and has a triangular, hexagonal, regular triangular, or regular hexagonal atomic arrangement when seen from the direction of the a-b plane, the top surface, or the interface, and metal atoms are arranged in a layered manner, or metal atoms and oxygen atoms are arranged in a layered manner in the c-axis direction. Further, one unit is not limited to 3 first groups or 3 second groups but can consist of any other combination.

There are three methods for obtaining a crystalline oxide semiconductor having c-axis alignment. First is a method in which an oxide semiconductor film is deposited at a temperature(s) higher than or equal to 200° C. and lower than or equal to 500° C. such that the c-axis is substantially perpendicular to the top surface. Second is a method in which an oxide semiconductor film is deposited thin, and is subjected to heat treatment at a temperature(s) higher than or equal to 200° C. and lower than or equal to 700° C., so that the c-axis is substantially perpendicular to the top surface. Third is a method in which a first-layer oxide semiconductor film is deposited thin, and is subjected to heat treatment at a temperature(s) higher than or equal to 200° C. and lower than or equal to 700° C., and a second-layer oxide semiconductor film is deposited thereover, so that the c-axis is substantially perpendicular to the top surface.

In this embodiment, an oxide semiconductor film is deposited at a temperature(s) higher than or equal to 200° C. and lower than or equal to 500° C., thereby forming the crystalline oxide semiconductor film 444 having a c-axis alignment substantially perpendicular to a top surface of the crystalline oxide semiconductor film 444. For example, the crystalline oxide semiconductor film 444 having a c-axis alignment substantially perpendicular to the top surface is deposited by a sputtering method at a substrate temperature of 400° C.

The crystalline oxide semiconductor film 444 is CAAC-OS, which enables a change of electric characteristics of the transistor due to irradiation with visible light or ultraviolet light to be further suppressed, so that a highly reliable semiconductor device can be provided.

The crystalline oxide semiconductor film 444 has a thickness greater than or equal to 1 nm and less than or equal to 200 nm (preferably greater than or equal to 5 nm and less than or equal to 30 nm) and can be formed by a sputtering method, a molecular beam epitaxy (MBE) method, a CVD method, a pulse laser deposition method, an atomic layer deposition (ALD) method, or the like as appropriate. The crystalline oxide semiconductor film 444 may be formed using a sputtering apparatus which performs deposition with top surfaces of a plurality of substrates set substantially perpendicular to a top surface of a sputtering target, which is a so-called columnar plasma (CP) sputtering system. By any of the methods, crystal growth proceeds in the direction perpendicular to roughness of the top surface of the oxide semiconductor film, so that a crystalline oxide semiconductor having c-axis alignment can be obtained.

As a material of the crystalline oxide semiconductor film 444, at least one element selected from In, Ga, Sn, and Zn is contained. For example, the following can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, or a Hf—In—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single-component metal oxide such as an In—O-based oxide semiconductor, a Sn—O-based oxide semiconductor, or a Zn—O-based oxide semiconductor; or the like. In addition, any of the above oxide semiconductors may contain an element other than In, Ga, Sn, and Zn, for example, $SiO_2$.

For example, the In—Ga—Zn—O-based oxide semiconductor means an oxide semiconductor containing indium (In), gallium (Ga), and zinc (Zn), and there is no limitation on the composition ratio thereof.

Further, for the crystalline oxide semiconductor film 444, a thin film represented by the chemical formula, $InMO_3(ZnO)_m$ (m>0), can be used. Here, M represents one or more metal elements selected from Zn, Ga, Al, Mn, and Co. For example, M can be Ga, Ga and Al, Ga and Mn, Ga and Co, or the like.

In the case where an In—Sn—Zn—O-based oxide semiconductor is used as an oxide semiconductor, a target whose composition ratio is In:Sn:Zn=1:2:2, In:Sn:Zn=2:1:3, In:Sn:Zn=1:1:1, or the like in an atomic ratio, can be used.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for deposition of an In—Zn—O-based oxide semiconductor where an atomic ratio of In:Zn:O=X:Y:Z, the relation of Z>1.5X+Y is satisfied.

The crystalline oxide semiconductor film 444 is preferably deposited under a condition such that much oxygen is contained (for example, by a sputtering method in an atmosphere of 100% oxygen) so as to be a film containing much oxygen (preferably having a region containing an excess of oxygen as compared to the stoichiometric composition ratio of the oxide semiconductor in a crystalline state).

Further, heat treatment may be performed on the crystalline oxide semiconductor film 444 in order to remove excess hydrogen (including water and a hydroxyl group) (to perform dehydration or dehydrogenation). The temperature of the heat treatment is higher than or equal to 300° C. and lower than or equal to 700° C., or lower than the strain point of a substrate. The heat treatment can be performed under reduced pressure, a nitrogen atmosphere, or the like. For example, the substrate is introduced into an electric furnace which is a kind of heat treatment apparatus, and heat treatment is performed on the oxide semiconductor film at 450° C. for 1 hour in a nitrogen atmosphere.

The heat treatment apparatus is not limited to an electric furnace, and instead, any device for heating an object by heat conduction or heat radiation from a heating element such as a resistance heating element may be used. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object by radiation of light (electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object by heat treatment, such as nitrogen or a rare gas like argon, is used.

For example, as the heat treatment, GRTA may be performed as follows: the substrate is put in an inert gas heated at a high temperature of between 650° C. and 700° C., and is heated for several minutes, and is then taken out of the inert gas.

Such heat treatment for dehydration or dehydrogenation may be performed in the manufacturing process of the transistor 440 anytime after formation of the crystalline oxide semiconductor film 444 before addition of oxygen into a crystalline oxide semiconductor film 413.

The heat treatment for dehydration or dehydrogenation is preferably performed before the crystalline oxide semiconductor film 444 is processed into an island shape to be the crystalline oxide semiconductor film 413, whereby oxygen contained in the insulating layer 436 can be prevented from being released by the heat treatment.

In the heat treatment, it is preferable that water, hydrogen, or the like is not contained in nitrogen or a rare gas such as helium, neon, or argon; or the purity of nitrogen or the rare gas such as helium, neon, or argon which is introduced into the heat treatment apparatus is preferably 6N (99.9999%) or higher, further preferably 7N (99.99999%) or higher (that is, the impurity concentration is preferably 1 ppm or lower, further preferably 0.1 ppm or lower).

In addition, after the crystalline oxide semiconductor film 444 is heated by the heat treatment, a high-purity oxygen gas, a high-purity N$_2$O gas, or ultra dry air (the moisture amount is less than or equal to 20 ppm (−55° C. by conversion into a dew point), preferably less than or equal to 1 ppm, further preferably less than or equal to 10 ppb, according to a dew point meter of a cavity ring down laser spectroscopy (CRDS) system) may be introduced into the same furnace. It is preferable that water, hydrogen, or the like is not contained in the oxygen gas or the N$_2$O gas; or the purity of the oxygen gas or the N$_2$O gas which is introduced into the heat treatment apparatus is preferably 6N or higher, further preferably 7N or higher (i.e., the impurity concentration in the oxygen gas or the N$_2$O gas is preferably 1 ppm or lower, further preferably 0.1 ppm or lower). The oxygen gas or the N$_2$O gas acts to supply oxygen that is a main component of the crystalline oxide semiconductor and that is reduced by the step for removing an impurity for dehydration or dehydrogenation, thereby making the crystalline oxide semiconductor film 444 a highly purified, electrically i-type (intrinsic) oxide semiconductor.

The crystalline oxide semiconductor film 444 may be processed into an island shape or may not be processed to remain the film shape. Further, an element isolation region formed of an insulating layer for isolating the crystalline oxide semiconductor film per element may be provided.

In this embodiment, the crystalline oxide semiconductor film 444 is processed into the island-shaped crystalline oxide semiconductor film 413 by a photolithography process. A resist mask used for forming the island-shaped crystalline oxide semiconductor film 413 may be formed by an inkjet method. Formation of the resist mask by an inkjet method involves no photomask; thus, manufacturing costs can be reduced.

One or both of dry etching and wet etching may be used for etching of the crystalline oxide semiconductor film 444. As an etchant used for wet etching for the crystalline oxide semiconductor film 444, for example, a mixed solution of phosphoric acid, acetic acid, and nitric acid, or the like can be used. Further, ITO07N (produced by KANTO CHEMICAL CO., INC.) may also be used.

Next, a gate insulating layer 442 covering the crystalline oxide semiconductor film 413 is formed (see FIG. 1B).

To improve the coverage with the gate insulating layer 442 over the crystalline oxide semiconductor film 413, the above-described planarizing treatment may be performed also on a top surface of the crystalline oxide semiconductor film 413. It is preferable that the planarity of the top surface of the crystalline oxide semiconductor film 413 is high particularly in the case where a thin insulating film is used as the gate insulating layer 442.

The gate insulating layer 442 has a thickness greater than or equal to 1 nm and less than or equal to 100 nm and can be formed by a sputtering method, an MBE method, a CVD method, a pulse laser deposition method, an ALD method, or the like as appropriate. The gate insulating layer 442 may also be formed using a sputtering apparatus which performs film deposition with surfaces of a plurality of substrates set substantially perpendicular to a top surface of a sputtering target, which is a so-called columnar plasma (CP) sputtering system.

The gate insulating layer 442 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating layer 442 include oxygen in a portion which is in contact with the crystalline oxide semiconductor film 413. In particular, the gate insulating layer 442 preferably contains an excess amount of oxygen which exceeds at least the stoichiometry composition ratio in the film (bulk); for example, in the case where a silicon oxide film is used as the gate insulating layer 442, the composition formula is SiO$_{2+\alpha}$ ($\alpha$>0). In this embodiment, a silicon oxide film of SiO$_{2+\alpha}$ ($\alpha$>0) is used as the gate insulating layer 442. By using the silicon oxide film as the gate insulating layer 442, oxygen can be supplied to the crystalline oxide semiconductor film 413 and favorable characteristics can be obtained. Further, the gate insulating layer 442 is preferably formed in consideration of the size of a transistor and the step coverage with the gate insulating layer 442.

The gate insulating layer 442 can be formed using a high-k material such as hafnium oxide, yttrium oxide, hafnium silicate (HfSi$_x$O$_y$ (x>0, y>0)), hafnium silicate to which nitrogen is added (HfSiO$_x$N$_y$ (x>0, y>0)), hafnium aluminate (HfAl$_x$O$_y$ (x>0, y>0)), or lanthanum oxide, whereby gate leakage current can be reduced. Further, the gate insulating layer 442 has either a single-layer structure or a stacked-layer structure.

Next, oxygen 431 (including at least one of an oxygen radical, an oxygen atom, and an oxygen ion) is added into the crystalline oxide semiconductor film 413; thus, oxygen is supplied to the crystalline oxide semiconductor film 413. Oxygen can be added by an ion implantation method, an ion doping method, a plasma immersion ion implantation method, plasma treatment, or the like.

The step of adding oxygen in the manufacturing process of the transistor 440 in this embodiment is performed after formation of the crystalline oxide semiconductor film 444 before formation of an aluminum oxide film as the insulating layer 407. The above-described heat treatment for dehydration or dehydrogenation is performed before the step of adding oxygen. In the step of adding oxygen, oxygen may be directly added into the crystalline oxide semiconductor film or added into the crystalline oxide semiconductor film through another film such as the gate insulating layer or an insulating layer. An ion implantation method, an ion doping method, a plasma immersion ion implantation method, or the like may be employed in the case where oxygen is added into a crystalline oxide semiconductor film through another film, whereas plasma treatment or the like can also be employed in the case where oxygen is directly added into a crystalline oxide semiconductor film which is bare (for example, subsequently to formation of the crystalline oxide semiconductor film 444 or subsequently to formation of the crystalline oxide semiconductor film 413).

In this embodiment, the oxygen 431 is added into the crystalline oxide semiconductor film 413 through the gate insulating layer 442 by an ion implantation method. The addition of the oxygen 431 amorphizes at least part of the crystalline oxide semiconductor film 413, so that an amorphous oxide semiconductor film 443 having a region where the amount of oxygen is excess as compared to the stoichiometric composition ratio of the oxide semiconductor in a crystalline state is formed (see FIG. 1C).

For example, it is preferable that the concentration of oxygen in the amorphous oxide semiconductor film 443, which is added by the addition of the oxygen 431, is greater than or equal to $1 \times 10^{18}$/cm$^3$ and less than or equal to $3 \times 10^{21}$/cm$^3$. Such an oxygen excess region exists in at least part (including its interface) of the amorphous oxide semiconductor film 443. Thus, with the addition of the oxygen 431, oxygen is contained in at least one of the interface between the insulating layer 436 and the amorphous oxide semiconductor film 443, the amorphous oxide semiconductor film 443, and the interface between the amorphous oxide semiconductor film 443 and the gate insulating layer 442.

The amorphous oxide semiconductor film 443 has the region containing an excess of oxygen as compared to the stoichiometric composition ratio of the oxide semiconductor in a crystalline state. In that case, the oxygen content is greater than that in the stoichiometric oxide semiconductor or higher than that in the single crystal state. In some cases, oxygen exists between lattices of the oxide semiconductor. The composition of such an oxide semiconductor can be expressed by $InGaZn_mO_{m+3x}$ (x>1). For example, supposing that m=1, the value of 1+3x in $InGaZnO_{1+3x}$ (x>1) exceeds 4 in the case where the content of oxygen is excess.

An oxygen vacancy in the amorphous oxide semiconductor film 443 can be repaired by the oxygen 431.

In the oxide semiconductor, oxygen is one of main component materials. Thus, it is difficult to accurately estimate the oxygen concentration of the oxide semiconductor film by a method such as secondary ion mass spectrometry (SIMS). In other words, it can be said that it is difficult to judge whether oxygen is intentionally added to the oxide semiconductor film or not.

However, it is known that there exist isotopes of oxygen, such as $^{17}O$ and $^{18}O$, and the proportions of $^{17}O$ and $^{18}O$ in the total of oxygen atoms in nature are about 0.037% and about 0.204%, respectively. That is to say, it is possible to measure the concentrations of these isotopes in the oxide semiconductor film by a method such as SIMS; thus, the oxygen concentration of the oxide semiconductor film may be able to be estimated more accurately by measuring the concentrations of these isotopes. Therefore, the concentrations of these isotopes may be measured to determine whether oxygen is intentionally added to the oxide semiconductor film or not.

In this specification, since at least part of a crystal having c-axis which is substantially perpendicular to the top surface of the crystalline oxide semiconductor film 413 is amorphized to lower the crystallinity by adding the oxygen 431 into the crystalline oxide semiconductor film 413, the crystalline oxide semiconductor film 413 after being added with the oxygen 431 is referred to as the amorphous oxide semiconductor film 443.

A film containing much oxygen may be used as the insulating layer which is in contact with the crystalline oxide semiconductor film 413 and the oxygen 431 may be directly added into the crystalline oxide semiconductor film 413; in this manner, a plurality of oxygen supply methods can be performed. Such a film containing much oxygen is not necessarily used as the insulating layer which is in contact with the crystalline oxide semiconductor film 413 in the case where the oxygen 431 is directly added into the crystalline oxide semiconductor film 413 like this embodiment.

Next, the gate electrode layer 401 is formed over the gate insulating layer 442. The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above conductive material and the above metal material.

As one layer of the gate electrode layer 401 which is in contact with the gate insulating layer 442, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher; thus, any of these films used as the gate electrode layer enables the threshold voltage of the transistor to be positive, so that a so-called normally-off switching element can be provided.

Sidewall insulating layers 412a and 412b are formed on the side surface of the gate electrode layer 401, and the gate insulating layer 402 is formed. The sidewall insulating layers 412a to 412d may be formed on the side surface of the gate electrode layer 401 in a self-aligned manner by forming an insulating layer to cover the gate electrode layer 401 and then processing the insulating layer by anisotropic etching by an RIE (Reactive Ion Etching) method. There is no particular limitation on the insulating layer; for example, a silicon oxide film with favorable step coverage, which is formed by reacting TEOS (tetraethyl ortho-silicate), silane, or the like with oxygen, nitrous oxide, or the like can be used. The insulating layer can be formed by a thermal CVD method, a plasma enhanced CVD method, an atmospheric pressure CVD method, a bias ECRCVD method, a sputtering method, or the like. A silicon oxide film formed by a low temperature oxidation (LTO) method may also be used.

The gate insulating layer 402 can be formed by etching the gate insulating layer 442 with use of the gate electrode layer 401 and the sidewall insulating layers 412a and 412b as a mask.

In this embodiment, in etching the insulating layer, the insulating layer over the gate electrode layer 401 is removed to expose the gate electrode layer 401; alternatively, the sidewall insulating layers 412a to 412d may be formed while the insulating layer directly above the gate electrode layer 401 remains. Further, a protective film may be formed over the gate electrode layer 401 in a later step. By protecting the gate electrode layer 401 in such a manner, film reduction of the gate electrode layer in the etching process can be prevented. Various etching methods such as a dry etching method and a wet etching method may be used for the etching.

Next, a conductive film for forming a source electrode layer and a drain electrode layer (including a wiring formed of the same layer) is formed over part of the sidewall insulating layer 412a, part of the sidewall insulating layer 412b, and the amorphous oxide semiconductor film 443. The conductive film is formed using a material that can withstand heat treatment in a later step. As the conductive film used for the source electrode layer and the drain electrode layer, for example, a metal film containing an element selected from Al, Cr, Cu, Ta, Ti, Mo, and W, a metal nitride film containing any of the above elements as its component (a titanium nitride film, a molybdenum nitride film, or a tungsten nitride film), or the like can be used. A metal film having a high melting point of Ti, Mo, W, or the like or a metal nitride film of any of these elements (such as a titanium nitride film, a molybdenum nitride film, or a tungsten nitride film) may be stacked on one of or both of the lower side and the upper side of a metal film of Al, Cu, or the like. Alternatively, the conductive film for forming the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

Through a photolithography process, a resist mask is formed over the conductive film, and selective etching is performed thereon, so that the source electrode layer 405a and the drain electrode layer 405b are formed, and then, the resist mask is removed (see FIG. 1D).

Next, the insulating layer 407 is formed over the gate electrode layer 401, the sidewall insulating layers 412a to 412d, the source electrode layer 405a, and the drain electrode layer 405b (see FIG. 1E). The insulating layer 407 has either a single-layer structure or a stacked-layer structure, and includes an aluminum oxide film.

The thickness of the aluminum oxide film included in the insulating layer 407 is greater than or equal to 30 nm and less than or equal to 500 nm, preferably greater than or equal to 50 nm and less than or equal to 200 nm. The insulating layer 407 can be formed by a method by which impurities such as water or hydrogen are prevented from entering the insulating layer 407, such as a sputtering method as appropriate. If hydrogen is contained in the insulating layer 407, entry of hydrogen into the oxide semiconductor film or extraction of oxygen from the oxide semiconductor film by hydrogen is caused; thus, the resistance of the oxide semiconductor film might lower (the conductivity of the same might become n-type) and a parasitic channel might be formed. Therefore, it is important that a film formation method in which hydrogen is not used is employed in order to form the insulating layer 407 containing as little hydrogen as possible.

The aluminum oxide film preferably has a region containing an excess of oxygen as compared to the stoichiometric composition ratio of the aluminum oxide in a crystalline state. In that case, the oxygen content is greater than that in the stoichiometric oxide aluminum oxide or higher than that in the single crystal state. In some cases, oxygen exists between lattices of the aluminum oxide. Supposing that the composition is expressed by $AlO_x$ (x>0), an aluminum oxide film having an oxygen excess region where x exceeds 3/2 is preferably used. Such an oxygen excess region exists at least in part (including its interface) of the aluminum oxide film.

In this embodiment, an aluminum oxide film with a thickness of 100 nm is formed as the insulating layer 407 by a sputtering method. The formation of the aluminum oxide film by a sputtering method can be performed in a rare gas (typically argon) atmosphere, an oxygen atmosphere, or a mixed atmosphere of a rare gas and oxygen.

To remove residual moisture from the deposition chamber for the insulating layer 407 like in the formation of the oxide semiconductor film, an entrapment vacuum pump (such as a cryopump) is preferably used. This is because the deposition chamber evacuated using a cryopump enables the impurity concentration of the insulating layer 407 to be low. As an evacuation unit for removing moisture remaining in the deposition chamber for the insulating layer 407, a turbo molecular pump provided with a cold trap may also be used.

A high-purity gas from which impurities such as hydrogen, water, a hydroxyl group, and hydride have been removed is preferably used as a sputtering gas for the deposition of the insulating layer 407.

Figure 7A:
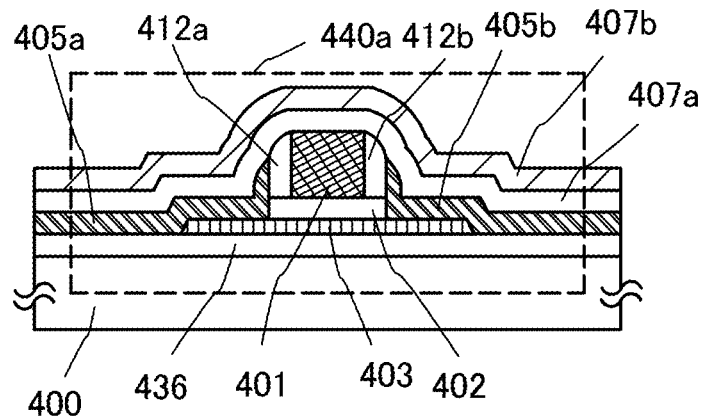
FIGS. 7A to 7C show embodiments of a semiconductor device.

The insulating layer 407 can have a stacked-layer structure including the aluminum oxide film and an inorganic insulating film such as, typically, a silicon oxide film, a silicon oxynitride film, an aluminum oxynitride film, or a gallium oxide film. FIG. 7A illustrates an example in which the insulating layer 407 in the transistor 440 has a stacked-layer structure of insulating layers 407a and 407b.

As shown in FIG. 7A, the insulating layer 407a is formed over the gate insulating layer 401, the sidewall insulating layers 412a and 412b, the source electrode layer 405a, and the drain electrode layer 405b, and the insulating layer 407b is formed over the insulating layer 407a. For example, in this embodiment, a silicon oxide film which has a region containing an excess of oxygen as compared to the stoichiometric composition ratio of the silicon oxide in a crystalline state is used as the insulating layer 407a, and an aluminum oxide film is used as the insulating layer 407b.

Next, heat treatment is performed on the amorphous oxide semiconductor film 443 to crystallize at least part of the amorphous oxide semiconductor film 443, so that the crystalline oxide semiconductor film 403 which includes a crystal having a c-axis which is substantially perpendicular to a top surface of the crystalline oxide semiconductor film 403 is formed.

The aluminum oxide film provided as the insulating layer 407 over the amorphous oxide semiconductor film 443 has a high shielding effect (blocking effect) of blocking penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating layer 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region where the amount of oxygen is excess as compared to the stoichiometric oxide semiconductor in a crystalline state.

Therefore, the crystalline oxide semiconductor film 403 has high purity because impurities such as hydrogen and moisture do not enter the crystalline oxide semiconductor film 403, and has the region where the amount of oxygen is excess as compared to the stoichiometric oxide semiconductor in a crystalline state because oxygen is prevented from being released therefrom.

If oxygen is eliminated from the crystalline oxide semiconductor film 403, an oxygen vacancy is formed therein. An oxide semiconductor with no excess oxygen cannot repair such an oxygen vacancy with other oxygen. In contrast, since the crystalline oxide semiconductor film 403 according to one embodiment of the present invention is a CAAC-OS film containing an excess of oxygen, the excess of oxygen (which is preferably excess as compared to the stoichiometric composition ratio) contained in the film can act to repair an oxygen vacancy in the crystalline oxide semiconductor film 403 immediately.

Accordingly, the crystalline oxide semiconductor film 403 enables a variation in the threshold voltage $V_{th}$ of the transistor and a shift of the threshold voltage ($\Delta V_{th}$) due to an oxygen vacancy to be reduced.

The heat treatment for crystallizing at least part of the amorphous oxide semiconductor film 443 is performed at a temperature(s) higher than or equal to 300° C. and lower than or equal to 700° C., preferably higher than or equal to 450° C. and lower than or equal to 650° C., further preferably higher than or equal to 500° C., still further preferably higher than or equal to 550° C.

For example, the substrate is introduced into an electric furnace which is one of heat treatment apparatuses, and heat treatment is performed on the oxide semiconductor film at 450° C. for 1 hour in an oxygen atmosphere.

The heat treatment apparatus is not limited to an electric furnace, and instead, any device for heating an object by heat conduction or heat radiation from a heating element such as a resistance heating element may be used. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object by radiation of light (electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object by heat treatment, such as nitrogen or a rare gas like argon, is used.

For example, as the heat treatment, GRTA may be performed as follows: the substrate is put in an inert gas heated at a high temperature of between 650° C. and 700° C., and is heated for several minutes, and is then taken out of the inert gas.

The heat treatment may be performed under an atmosphere of nitrogen, oxygen, ultra-dry air (air in which the water content is 20 ppm or lower, preferably 1 ppm or lower, further preferably 10 ppb or lower), or a rare gas (argon, helium, or the like). It is preferable that water, hydrogen, or the like is not contained in the atmosphere of nitrogen, oxygen, ultra-dry air, or a rare gas. The purity of nitrogen, oxygen, or the rare gas which is introduced into the heat treatment apparatus is preferably 6N (99.9999%) or higher, further preferably 7N (99.99999%) or higher (that is, the impurity concentration is preferably 1 ppm or lower, further preferably 0.1 ppm or lower).

In the crystalline oxide semiconductor film 403 which is highly purified and whose oxygen vacancy is repaired, impurities such as hydrogen and water are sufficiently removed; the hydrogen concentration in the crystalline oxide semiconductor film 403 is less than or equal to $5\times10^{19}/cm^3$, preferably less than or equal to $5\times10^{18}/cm^3$. The hydrogen concentration in the crystalline oxide semiconductor film 403 is measured by secondary ion mass spectrometry (SIMS).

The number of carriers in the crystalline oxide semiconductor film 403 is extremely small (close to zero), and the carrier concentration is less than $1\times10^{14}/cm^3$, preferably less than $1\times10^{12}/cm^3$, further preferably less than $1\times10^{11}/cm^3$.

Through the above process, the transistor 440 is formed (see FIG. 1F). The transistor 440 includes the highly purified crystalline oxide semiconductor film containing an excess of oxygen that repairs an oxygen vacancy. Therefore, the transistor 440 has less change in electric characteristics and thus is electrically stable.

The current value in the off state (off-state current value) of the transistor 440 using the highly purified crystalline oxide semiconductor film 403 containing an excess of oxygen that repairs an oxygen vacancy according to this embodiment is less than or equal to 100 zA per micrometer of channel width at room temperature (1 zA (zeptoampere) $=1\times10^{-21}$ A), preferably less than or equal to 10 zA/µm, further preferably less than or equal to 1 zA/µm, still further preferably less than or equal to 100 yA/µm.

In this manner, a semiconductor device using an oxide semiconductor with stable electric characteristics can be provided. Accordingly, a highly reliable semiconductor device can be provided.

(Embodiment 2)

In this embodiment, one embodiment of a semiconductor device and a method for manufacturing the semiconductor device is described with reference to FIGS. 2A to 2F. The description of the above embodiment can be applied to the same portion as or a portion having a function similar to that in the above embodiment, and the same step as or a step having a function similar to that in the above embodiment, and description thereof is not repeated. In addition, detailed description of the same portions is omitted.

Described in this embodiment is an example in which heat treatment is performed on an amorphous oxide semiconductor film to crystallize at least part thereof, whereby a crystalline oxide semiconductor film containing a crystal having a c-axis which is substantially perpendicular to a top surface of the crystalline oxide semiconductor film is formed in a method for manufacturing a semiconductor device according to one embodiment of the present invention.

FIGS. 2A to 2F illustrate an example of a method for manufacturing the transistor 440.

First, the insulating layer 436 is formed over the substrate 400. Next, an amorphous oxide semiconductor film 441 is formed over the insulating layer 436 (see FIG. 2A). The amorphous oxide semiconductor film 441 can be formed by a similar material and a similar method to those of the crystalline oxide semiconductor film 444 described in Embodiment 1; however, the substrate temperature is a temperature at which crystallization does not occur in film formation (preferably lower than or equal to 200° C.).

Further, heat treatment may be performed on the amorphous oxide semiconductor film 441 in order to remove excess hydrogen (including water and a hydroxyl group) (to perform dehydration or dehydrogenation). The temperature of the heat treatment is a temperature(s) at which the amorphous oxide semiconductor film 441 is not crystallized, and typically higher than or equal to 250° C. and lower than or equal to 400° C., preferably lower than or equal to 300° C.

The heat treatment for dehydration or dehydrogenation is preferably performed before the amorphous oxide semiconductor film 441 is processed into an island shape, whereby oxygen contained in the insulating layer 436 can be prevented from being released by the heat treatment.

In the heat treatment, it is preferable that water, hydrogen, or the like is not contained in nitrogen or a rare gas such as helium, neon, or argon; or the purity of nitrogen or the rare gas such as helium, neon, or argon which is introduced into the heat treatment apparatus is preferably 6N (99.9999%) or higher, further preferably 7N (99.99999%) or higher (that is, the impurity concentration is preferably 1 ppm or lower, further preferably 0.1 ppm or lower).

In addition, after the amorphous oxide semiconductor film 441 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb, according to a dew point meter of a cavity ring down laser spectroscopy (CRDS) system) may be introduced into the same furnace. It is preferable that water, hydrogen, or the like is not contained in the oxygen gas or the $N_2O$ gas; or the purity of the oxygen gas or the $N_2O$ gas which is introduced into the heat treatment apparatus is preferably 6N or higher, further preferably 7N or higher (i.e., the impurity concentration in the oxygen gas or the $N_2O$ gas is preferably 1 ppm or lower, further preferably 0.1 ppm or lower). The oxygen gas or the $N_2O$ gas acts to supply oxygen that is a main component of the amorphous oxide semiconductor and that is reduced by the step for removing an impurity for dehydration or dehydrogenation, thereby making the amorphous oxide semiconductor film 441 a highly purified, electrically i-type (intrinsic) oxide semiconductor.

Next, heat treatment is performed on the amorphous oxide semiconductor film 441 to crystallize at least part of the amorphous oxide semiconductor film 441, so that a crystalline oxide semiconductor film including a crystal having a c-axis which is substantially perpendicular to a top surface of the crystalline oxide semiconductor film is formed.

The heat treatment for crystallizing at least part of the amorphous oxide semiconductor film 441 is performed at a temperature(s) higher than or equal to 300° C. and lower than or equal to 700° C., preferably higher than or equal to 450° C. and lower than or equal to 650° C., further preferably higher than or equal to 500° C., still further preferably higher than or equal to 550° C.

For example, the substrate is introduced into an electric furnace which is one of heat treatment apparatuses, and heat treatment is performed on the amorphous oxide semiconductor film 441 at 650° C. for 1 hour in an nitrogen atmosphere.

The heat treatment apparatus is not limited to an electric furnace, and instead, any device for heating an object by heat conduction or heat radiation from a heating element such as a resistance heating element may be used. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object by radiation of light (electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object by heat treatment, such as nitrogen or a rare gas like argon, is used.

For example, as the heat treatment, GRTA may be performed as follows: the substrate is put in an inert gas heated at a high temperature of between 650° C. and 700° C., and is heated for several minutes, and is then taken out of the inert gas.

The heat treatment may be performed under an atmosphere of nitrogen, oxygen, ultra-dry air (air in which the water content is 20 ppm or lower, preferably 1 ppm or lower, further preferably 10 ppb or lower), or a rare gas (argon, helium, or the like). It is preferable that water, hydrogen, or the like is not contained in the atmosphere of nitrogen, oxygen, ultra-dry air, or a rare gas. The purity of nitrogen, oxygen, or the rare gas which is introduced into the heat treatment apparatus is preferably 6N (99.9999%) or higher, further preferably 7N (99.99999%) or higher (that is, the impurity concentration is preferably 1 ppm or lower, further preferably 0.1 ppm or lower).

The crystalline oxide semiconductor film is processed into an island shape to form the crystalline oxide semiconductor film 413. Next, the gate insulating layer 442 is formed to cover the crystalline oxide semiconductor film 413 (see FIG. 2B).

In this embodiment, such heat treatment for dehydration or dehydrogenation may be performed in the manufacturing process of the transistor 440 anytime after formation of the amorphous oxide semiconductor film 443 before addition of oxygen into the crystalline oxide semiconductor film 413.

The heat treatment for dehydration or dehydrogenation is preferably performed before the crystalline oxide semiconductor film is processed into an island shape to be the crystalline oxide semiconductor film 413, whereby oxygen contained in the insulating layer 436 can be prevented from being released by the heat treatment.

Next, the oxygen 431 (including at least one of an oxygen radical, an oxygen atom, and an oxygen ion) is added into the crystalline oxide semiconductor film 413; thus, oxygen is supplied to the crystalline oxide semiconductor film 413.

In this embodiment, the oxygen 431 is added into the crystalline oxide semiconductor film 413 through the gate insulating layer 442 by an ion implantation method. The addition of the oxygen 431 amorphizes at least part of the crystalline oxide semiconductor film 413, so that the amorphous oxide semiconductor film 443 having a region where the amount of oxygen is excess as compared to the stoichiometric composition ratio of the oxide semiconductor in a crystalline state is formed (see FIG. 2C).

An oxygen vacancy in the amorphous oxide semiconductor film 443 can be repaired by the oxygen 431.

Next, the gate electrode layer 401 is formed over the gate insulating layer 442.

The sidewall insulating layers 412a and 412b are formed on the side surface of the gate electrode layer 401, and the gate insulating layer 402 is formed.

The gate insulating layer 402 can be formed by etching the gate insulating layer 442 with use of the gate electrode layer 401 and the sidewall insulating layers 412a and 412b as a mask.

Next, a conductive film for forming a source electrode layer and a drain electrode layer (including a wiring formed of the same layer) is formed over part of the sidewall insulating layer 412a, part of the sidewall insulating layer 412b, and the amorphous oxide semiconductor film 443.

Figure 2A:
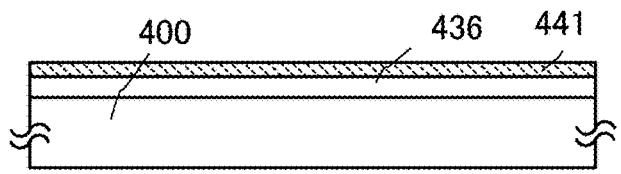
FIGS. 2A to 2F show one embodiment of a semiconductor device and a method for manufacturing the semiconductor device.
Figure 2B:
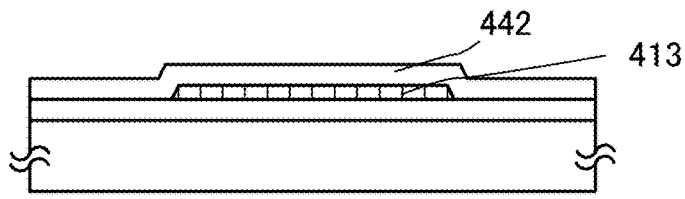
Figure 2C:
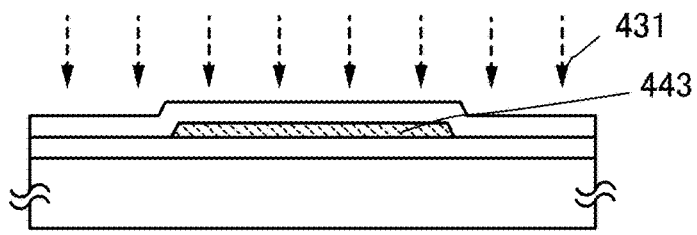
Figure 2D:
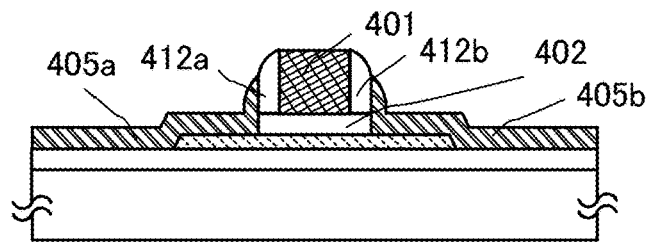

Through a photolithography process, a resist mask is formed over the conductive film, and selective etching is performed thereon, so that the source electrode layer 405a and the drain electrode layer 405b are formed, and then, the resist mask is removed (see FIG. 2D).

Figure 2E:
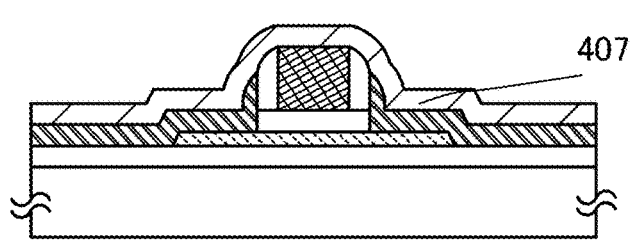

Next, the insulating layer 407 is formed over the gate electrode layer 401, the sidewall insulating layers 412a to 412d, the source electrode layer 405a, and the drain electrode layer 405b (see FIG. 2E). The insulating layer 407 has either a single-layer structure or a stacked-layer structure, and includes an aluminum oxide film.

In this embodiment, a 100-nm-thick aluminum oxide film is formed as the insulating layer 407 by a sputtering method.

Next, heat treatment is performed on the amorphous oxide semiconductor film 443 to crystallize at least part of the amorphous oxide semiconductor film 443, so that the crystalline oxide semiconductor film 403 which includes a crystal having a c-axis which is substantially perpendicular to a top surface of the crystalline oxide semiconductor film 403 is formed.

The aluminum oxide film provided as the insulating layer 407 over the amorphous oxide semiconductor film 443 has a high shielding effect (blocking effect) of blocking penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating layer 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region where the amount of oxygen is excess as compared to the stoichiometric oxide semiconductor in a crystalline state.

Therefore, the crystalline oxide semiconductor film 403 has high purity because impurities such as hydrogen and moisture do not enter the crystalline oxide semiconductor film 403, and has the region where the amount of oxygen is excess as compared to the stoichiometric oxide semiconductor in a crystalline state because oxygen is prevented from being released therefrom.

If oxygen is eliminated from the crystalline oxide semiconductor film 403, an oxygen vacancy is formed therein. An oxide semiconductor with no excess oxygen cannot repair such an oxygen vacancy with other oxygen. In contrast, since the crystalline oxide semiconductor film 403 according to one embodiment of the present invention is a CAAC-OS film containing an excess of oxygen, the excess of oxygen (which is preferably excess as compared to the stoichiometric composition ratio) contained in the film can act to repair an oxygen vacancy in the crystalline oxide semiconductor film 403 immediately.

Accordingly, the crystalline oxide semiconductor film 403 enables a variation in the threshold voltage $V_{th}$ of the transistor and a shift of the threshold voltage ($\Delta V_{th}$) due to an oxygen vacancy to be reduced.

Figure 2F:
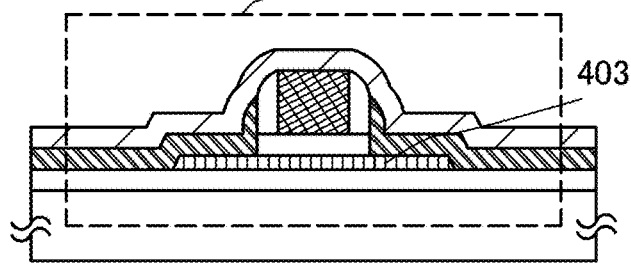

Through the above process, the transistor 440 is formed (see FIG. 2F). The transistor 440 includes the highly purified crystalline oxide semiconductor film containing an excess of oxygen that repairs an oxygen vacancy. Therefore, the transistor 440 has less change in electric characteristics and thus is electrically stable.

The current value in the off state (off-state current value) of the transistor 440 using the highly purified crystalline oxide semiconductor film 403 containing an excess of oxygen that repairs an oxygen vacancy according to this embodiment is less than or equal to 100 zA per micrometer of channel width at room temperature (1 zA (zeptoampere) =$1\times10^{-21}$ A), preferably less than or equal to 10 zA/µm, further preferably less than or equal to 1 zA/µm, still further preferably less than or equal to 100 yA/µm.

In this manner, a semiconductor device using an oxide semiconductor with stable electric characteristics can be provided. Accordingly, a highly reliable semiconductor device can be provided.

(Embodiment 3)

In this embodiment, one embodiment of a semiconductor device and a method for manufacturing the semiconductor device is described with reference to FIGS. 3A to 3E. The description of the above embodiment can be applied to the same portion as or a portion having a function similar to that in the above embodiment, and the same step as or a step having a function similar to that in the above embodiment, and description thereof is not repeated. In addition, detailed description of the same portions is omitted.

Described in this embodiment is an example in which addition of oxygen into a crystalline oxide semiconductor film is performed through a gate insulating layer after a gate electrode layer is formed in a method for manufacturing a semiconductor device according to one embodiment of the present invention.

FIGS. 3A to 3E illustrate an example of a method for manufacturing the transistor 440.

First, the insulating layer 436 is formed over the substrate 400. Next, the crystalline oxide semiconductor film 413 is formed over the insulating layer 436. The crystalline oxide semiconductor film 413 can be formed by a similar material and a similar method to those of the crystalline oxide semiconductor film 413 described in Embodiment 1 or Embodiment 2. Then, the gate insulating layer 442 is formed to cover the crystalline oxide semiconductor film 413.

Figure 3A:
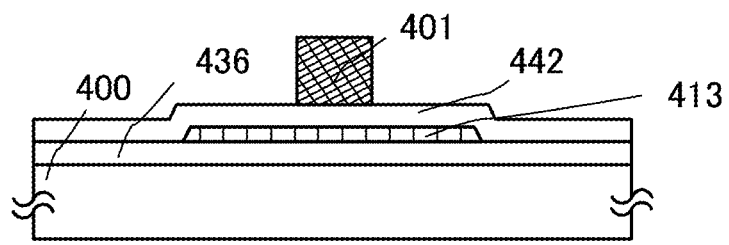
FIGS. 3A to 3E show one embodiment of a semiconductor device and a method for manufacturing the semiconductor device.
Figure 3B:
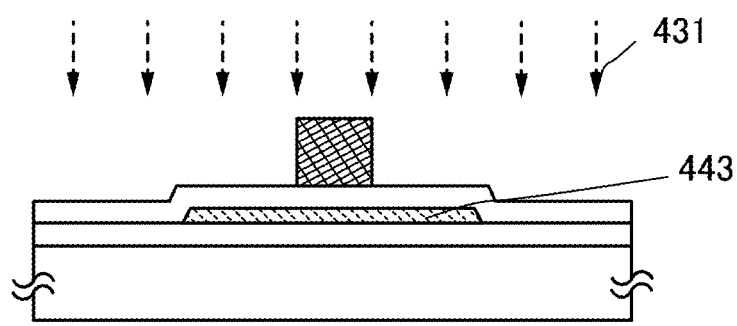

Next, the gate electrode layer 401 is formed over the gate insulating layer 442 (see FIG. 3A).

Further, heat treatment may be performed on the crystalline oxide semiconductor film 413 in order to remove excess hydrogen (including water and a hydroxyl group) (to perform dehydration or dehydrogenation).

Next, the oxygen 431 (including at least one of an oxygen radical, an oxygen atom, and an oxygen ion) is added into the crystalline oxide semiconductor film 413; thus oxygen is supplied to the crystalline oxide semiconductor film 413.

In this embodiment, the oxygen 431 is added into the crystalline oxide semiconductor film 413 through the gate insulating layer 442 by an ion implantation method after the gate electrode layer 401 is formed. The addition of the oxygen 431 amorphizes at least part of the crystalline oxide semiconductor film 413, so that the amorphous oxide semiconductor film 443 having a region where the amount of oxygen is excess as compared to the stoichiometric composition ratio of the oxide semiconductor in a crystalline state is formed (see FIG. 3B).

Although there is a case where the oxygen 431 is not added in a region of the crystalline oxide semiconductor film 413 which is overlapped with the gate electrode layer 401 due to the existence of the gate electrode layer 401, oxygen added into the amorphous oxide semiconductor film 443 can be diffused also to the region of the crystalline oxide semiconductor film 413 which is overlapped with the gate electrode layer 401 by heat treatment for crystallizing the amorphous oxide semiconductor film 443 because the width of the gate electrode layer 401 is small (for example, in the submicron order).

An oxygen vacancy in the amorphous oxide semiconductor film 443 can be repaired by the oxygen 431.

The sidewall insulating layers 412a and 412b are formed on the side surface of the gate electrode layer 401, and the gate insulating layer 402 is formed.

The gate insulating layer 402 can be formed by etching the gate insulating layer 442 with use of the gate electrode layer 401 and the sidewall insulating layers 412a and 412b as a mask.

Next, a conductive film for forming a source electrode layer and a drain electrode layer (including a wiring formed of the same layer) is formed over part of the sidewall insulating layer 412a, part of the sidewall insulating layer 412b, and the amorphous oxide semiconductor film 443.

Figure 3C:
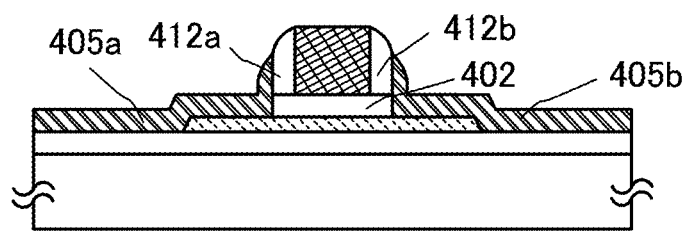

Through a photolithography process, a resist mask is formed over the conductive film, and selective etching is performed thereon, so that the source electrode layer 405a and the drain electrode layer 405b are formed, and then, the resist mask is removed (see FIG. 3C).

Figure 3D:
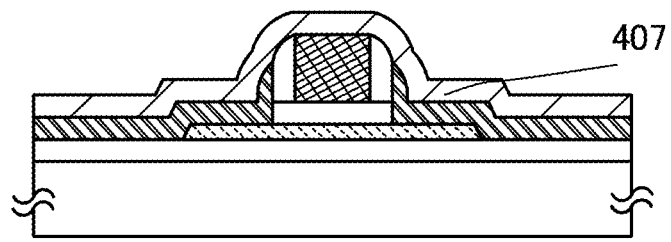

Next, the insulating layer 407 is formed over the gate electrode layer 401, the sidewall insulating layers 412a to 412d, the source electrode layer 405a, and the drain electrode layer 405b (see FIG. 3D). The insulating layer 407 has either a single-layer structure or a stacked-layer structure, and includes an aluminum oxide film.

In this embodiment, a 100-nm-thick aluminum oxide film is formed as the insulating layer 407 by a sputtering method.

Next, heat treatment is performed on the amorphous oxide semiconductor film 443 to crystallize at least part of the amorphous oxide semiconductor film 443, so that the crystalline oxide semiconductor film 403 which includes a crystal having a c-axis which is substantially perpendicular to a top surface of the crystalline oxide semiconductor film 403 is formed. Also with this heat treatment, oxygen is diffused throughout the amorphous oxide semiconductor film 443, so that oxygen is supplied throughout the film.

The aluminum oxide film provided as the insulating layer 407 over the amorphous oxide semiconductor film 443 has a high shielding effect (blocking effect) of blocking penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating layer 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region where the amount of oxygen is excess as compared to the stoichiometric oxide semiconductor in a crystalline state.

Therefore, the crystalline oxide semiconductor film 403 has high purity because impurities such as hydrogen and moisture do not enter the crystalline oxide semiconductor film 403, and has the region where the amount of oxygen is excess as compared to the stoichiometric oxide semiconductor in a crystalline state because oxygen is prevented from being released therefrom.

If oxygen is eliminated from the crystalline oxide semiconductor film 403, an oxygen vacancy is formed therein. An oxide semiconductor with no excess oxygen cannot repair such an oxygen vacancy with other oxygen. In contrast, since the crystalline oxide semiconductor film 403 according to one embodiment of the present invention is a CAAC-OS film containing an excess of oxygen, the excess of oxygen (which is preferably excess as compared to the stoichiometric composition ratio) contained in the film can act to repair an oxygen vacancy in the crystalline oxide semiconductor film 403 immediately.

Accordingly, the crystalline oxide semiconductor film 403 enables a variation in the threshold voltage $V_{th}$ of the transistor 440 and a shift of the threshold voltage ($\Delta V_{th}$) due to an oxygen vacancy to be reduced.

Figure 3E:
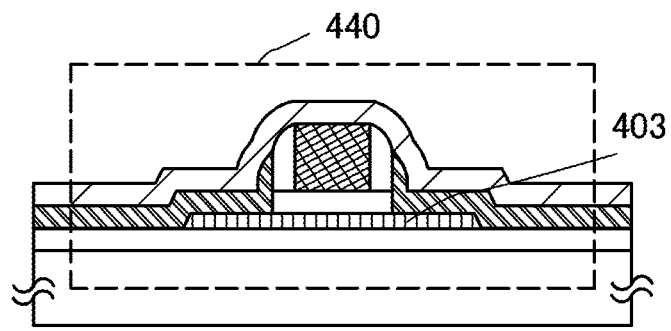

Through the above process, the transistor 440 is formed (see FIG. 3E). The transistor 440 includes the highly purified crystalline oxide semiconductor film containing an excess of oxygen that repairs an oxygen vacancy. Therefore, the transistor 440 has less change in electric characteristics and thus is electrically stable.

The current value in the off state (off-state current value) of the transistor 440 using the highly purified crystalline oxide semiconductor film 403 containing an excess of oxygen that repairs an oxygen vacancy according to this embodiment is less than or equal to 100 zA per micrometer of channel width at room temperature (1 zA (zeptoampere) =$1\times10^{-21}$ A), preferably less than or equal to 10 zA/μm, further preferably less than or equal to 1 zA/μm, still further preferably less than or equal to 100 yA/μm.

In this manner, a semiconductor device using an oxide semiconductor with stable electric characteristics can be provided. Accordingly, a highly reliable semiconductor device can be provided.

(Embodiment 4)

In this embodiment, one embodiment of a semiconductor device and a method for manufacturing the semiconductor device is described with reference to FIGS. 4A to 4E. The description of the above embodiment can be applied to the same portion as or a portion having a function similar to that in the above embodiment, and the same step as or a step having a function similar to that in the above embodiment, and description thereof is not repeated. In addition, detailed description of the same portions is omitted.

Described in this embodiment is an example in which addition of oxygen into a crystalline oxide semiconductor film is performed through an insulating layer provided over a transistor in a method for manufacturing a semiconductor device according to one embodiment of the present invention.

FIGS. 4A to 4E illustrate an example of a method for manufacturing a transistor 410.

First, the insulating layer 436 is formed over the substrate 400. Next, the crystalline oxide semiconductor film 413 is formed over the insulating layer 436. The crystalline oxide semiconductor film 413 can be formed by a similar material and a similar method to those of the crystalline oxide semiconductor film 413 described in Embodiment 1 or Embodiment 2. Then, the gate insulating layer 442 is formed to cover the crystalline oxide semiconductor film 413.

Figure 4A:
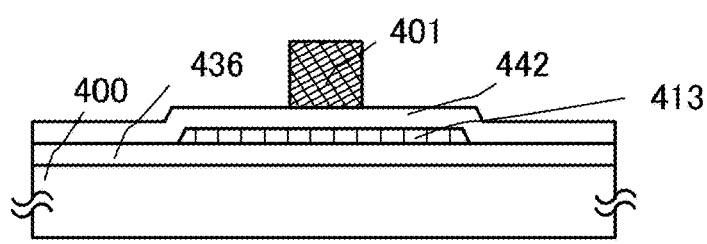
FIGS. 4A to 4E show one embodiment of a semiconductor device and a method for manufacturing the semiconductor device.

Next, the gate electrode layer 401 is formed over the gate insulating layer 442 (see FIG. 4A).

In this embodiment, an example in which a sidewall insulating layer is not formed and the gate insulating layer 442 is not processed into an island shape and is used as a continuous film is described.

Further, heat treatment may be performed on the crystalline oxide semiconductor film 413 in order to remove excess hydrogen (including water and a hydroxyl group) (to perform dehydration or dehydrogenation).

Figure 4B:
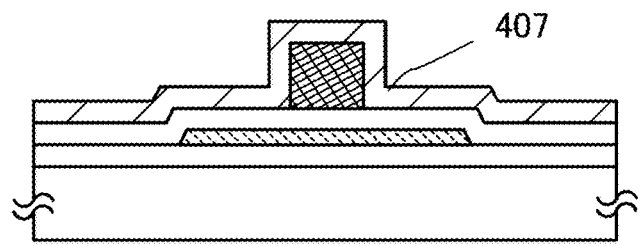
Figure 4C:
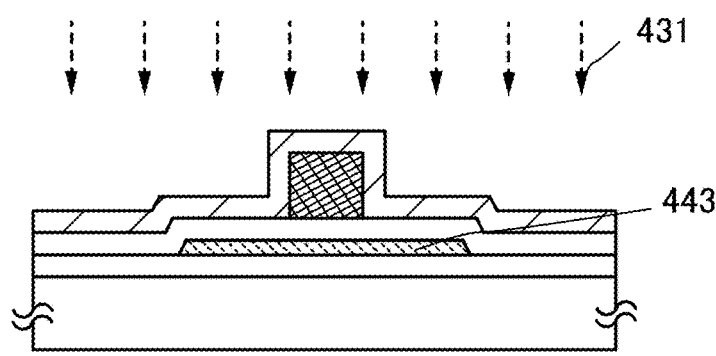

Next, the insulating layer 407 is formed over the gate insulating layer 442 and the gate electrode layer 401 (see FIG. 4B). The insulating layer 407 has either a single-layer structure or a stacked-layer structure, and includes an aluminum oxide film.

In this embodiment, a 100-nm-thick aluminum oxide film is formed as the insulating layer 407 by a sputtering method.

Next, the oxygen 431 (including at least one of an oxygen radical, an oxygen atom, and an oxygen ion) is added into the crystalline oxide semiconductor film 413; thus, oxygen is supplied to the crystalline oxide semiconductor film 413.

In this embodiment, the oxygen 431 is added into the crystalline oxide semiconductor film 413 through the gate insulating layer 442 and the insulating layer 407 by an ion implantation method after the insulating layer 407 is formed. The addition of the oxygen 431 amorphizes at least part of the crystalline oxide semiconductor film 413, so that the amorphous oxide semiconductor film 443 having a region where the amount of oxygen is excess as compared to the stoichiometric composition ratio of the oxide semiconductor in a crystalline state is formed (see FIG. 4C).

Although there is a case where the oxygen 431 is not added in a region of the crystalline oxide semiconductor film 413 which is overlapped with the gate electrode layer 401 due to the existence of the gate electrode layer 401, oxygen added into the amorphous oxide semiconductor film 443 can be diffused also to the region of the amorphous oxide semiconductor film 443 which is overlapped with the gate electrode layer 401 by heat treatment for crystallizing the amorphous oxide semiconductor film 443 because the width of the gate electrode layer 401 is small (for example, 0.35 μm).

An oxygen vacancy in the amorphous oxide semiconductor film 443 can be repaired by the oxygen 431.

Figure 4D:
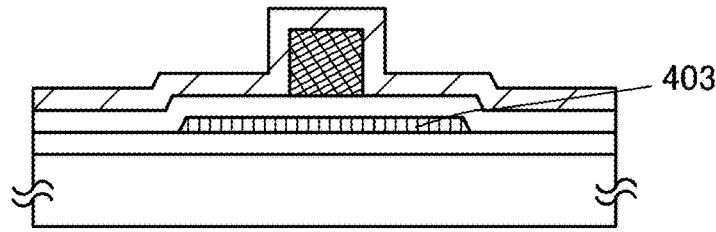

Next, heat treatment is performed on the amorphous oxide semiconductor film 443 to crystallize at least part of the amorphous oxide semiconductor film 443, so that the crystalline oxide semiconductor film 403 which includes a crystal having a c-axis which is substantially perpendicular to a top surface of the crystalline oxide semiconductor film 403 is formed (see FIG. 4D). Also with this heat treatment, oxygen is diffused throughout the amorphous oxide semiconductor film 443, so that oxygen is supplied throughout the film.

The aluminum oxide film provided as the insulating layer 407 over the amorphous oxide semiconductor film 443 has a high shielding effect (blocking effect) of blocking penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating layer 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region where the amount of oxygen is excess as compared to the stoichiometric oxide semiconductor in a crystalline state.

Therefore, the crystalline oxide semiconductor film 403 has high purity because impurities such as hydrogen and moisture do not enter the crystalline oxide semiconductor film 403, and has the region where the amount of oxygen is excess as compared to the stoichiometric oxide semiconductor in a crystalline state because oxygen is prevented from being released therefrom.

If oxygen is eliminated from the crystalline oxide semiconductor film 403, an oxygen vacancy is formed therein. An oxide semiconductor with no excess oxygen cannot repair such an oxygen vacancy with other oxygen. In contrast, since the crystalline oxide semiconductor film 403 according to one embodiment of the present invention is a CAAC-OS film containing an excess of oxygen, the excess of oxygen (which is preferably excess as compared to the stoichiometric composition ratio) contained in the film can act to repair an oxygen vacancy in the crystalline oxide semiconductor film 403 immediately.

Accordingly, the crystalline oxide semiconductor film 403 enables a variation in the threshold voltage $V_{th}$ of the transistor 410 and a shift of the threshold voltage ($\Delta V_{th}$) due to an oxygen vacancy to be reduced.

Further, a planarization insulating film may be formed thereover in order to reduce surface roughness due to the transistor. For the planarization insulating film, an organic material such as polyimide, acrylic, or benzocyclobutene can be used. Other than such an organic material, it is also possible to use a low-dielectric constant material (a low-k material) or the like. The planarization insulating film may be formed by stacking a plurality of insulating films formed using these materials.

In this embodiment, a planarization insulating film 415 is formed over the insulating layer 407. Further, openings reaching the crystalline oxide semiconductor film 403 are formed in the gate insulating layer 442, the insulating layer 407, and the planarization insulating film 415, and the source electrode layer 405a and the drain electrode layer 405b are formed so as to be electrically connected to the crystalline oxide semiconductor film 403 through the openings.

Figure 4E:
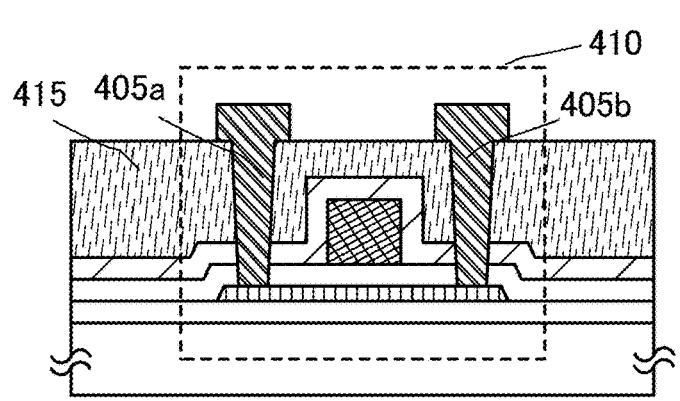

Through the above process, the transistor 410 is formed (see FIG. 4E). The transistor 410 includes the highly purified crystalline oxide semiconductor film containing an excess of oxygen that repairs an oxygen vacancy. Therefore, the transistor 410 has less change in electric characteristics and thus is electrically stable.

Figure 7B:
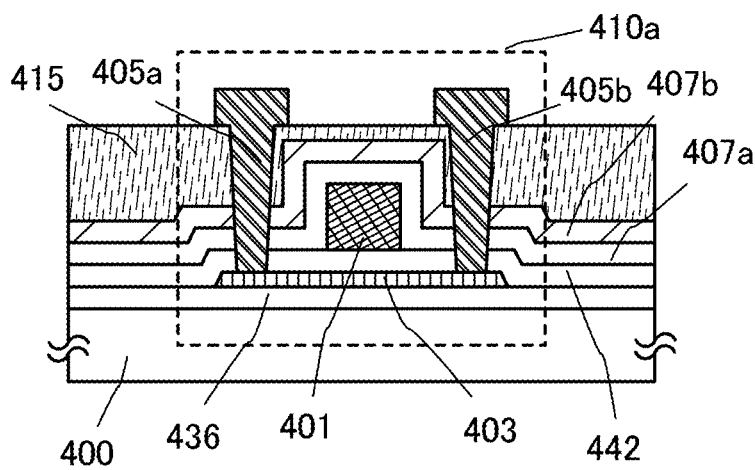

The insulating layer 407 can have a stacked-layer structure including the aluminum oxide film and an inorganic insulating film such as, typically, a silicon oxide film, a silicon oxynitride film, an aluminum oxynitride film, or a gallium oxide film. FIG. 7B illustrates an example in which the insulating layer 407 in the transistor 410 has a stacked-layer structure of the insulating layers 407a and 407b.

As shown in FIG. 7B, the insulating layer 407a is formed over the gate insulating layer 442 and the gate electrode layer 401, and the insulating layer 407b is formed over the insulating layer 407a. For example, in this embodiment, a silicon oxide film which has a region containing an excess of oxygen as compared to the stoichiometric composition ratio of the silicon oxide in a crystalline state is used as the insulating layer 407a, and an aluminum oxide film is used as the insulating layer 407b.

In the case the insulating layer 407 has the stacked-layer structure of the insulating layers 407a and 407b, the addition of oxygen into the crystalline oxide semiconductor film 413 can be performed through the stacked insulating layers 407a and 407b.

The current value in the off state (off-state current value) of the transistor 410 using the highly purified crystalline oxide semiconductor film 403 containing an excess of oxygen that repairs an oxygen vacancy according to this embodiment is less than or equal to 100 zA per micrometer of channel width at room temperature (1 zA (zeptoampere) $=1\times10^{-21}$ A), preferably less than or equal to 10 zA/µm, further preferably less than or equal to 1 zA/µm, still further preferably less than or equal to 100 yA/µm.

In this manner, a semiconductor device using an oxide semiconductor with stable electric characteristics can be provided. Accordingly, a highly reliable semiconductor device can be provided.

(Embodiment 5)

In this embodiment, one embodiment of a semiconductor device and a method for manufacturing the semiconductor device is described with reference to FIGS. 5A to 5F. The description of the above embodiment can be applied to the same portion as or a portion having a function similar to that in the above embodiment, and the same step as or a step having a function similar to that in the above embodiment, and description thereof is not repeated. In addition, detailed description of the same portions is omitted.

Described in this embodiment is an example in which the structure of connection between a source and drain electrode layers and a crystalline oxide semiconductor film is different from Embodiment 1.

FIGS. 5A to 5F illustrate an example of a method for manufacturing the transistor 430.

First, the insulating layer 436 is formed over the substrate 400.

Next, a conductive film for forming a source electrode layer and a drain electrode layer (including a wiring formed of the same layer) is formed over the insulating layer 436.

Figure 5A:
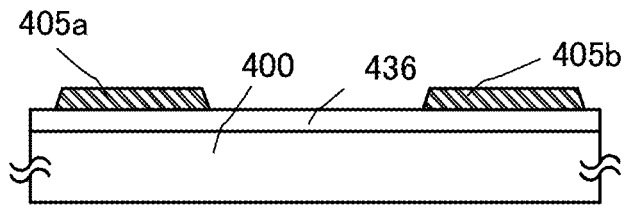
FIGS. 5A to 5F show one embodiment of a method for manufacturing a semiconductor device.

Through a photolithography process, a resist mask is formed over the conductive film, and selective etching is performed thereon, so that the source electrode layer 405a and the drain electrode layer 405b are formed, and then, the resist mask is removed (see FIG. 5A).

Figure 5B:
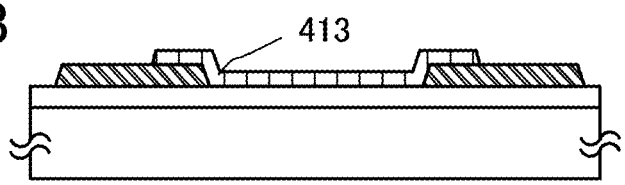
Figure 5C:
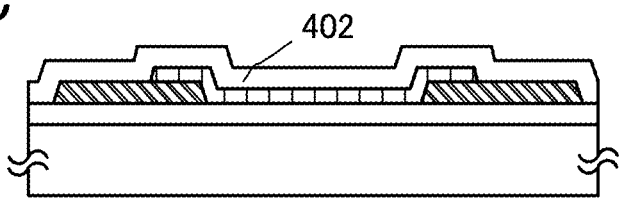
Figure 5D:
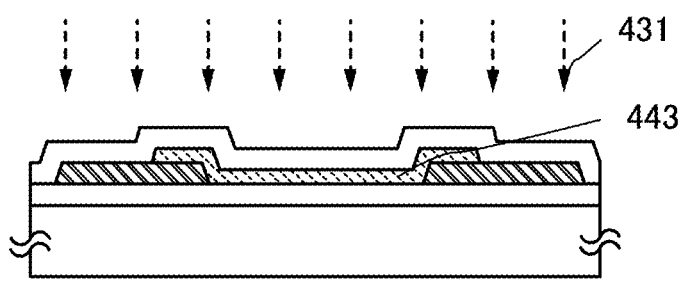

Then, the crystalline oxide semiconductor film 413 is formed over the insulating layer 436, the source electrode layer 405a, and the drain electrode layer 405b (see FIG. 5B). The crystalline oxide semiconductor film 413 can be formed by a similar material and a similar method to those of the crystalline oxide semiconductor film 413 described in Embodiment 1 or Embodiment 2. Then, the gate insulating layer 402 is formed to cover the crystalline oxide semiconductor film 413 (see FIG. 5C).

Further, heat treatment may be performed on the crystalline oxide semiconductor film 413 in order to remove excess hydrogen (including water and a hydroxyl group) (to perform dehydration or dehydrogenation).

Next, the oxygen 431 (including at least one of an oxygen radical, an oxygen atom, and an oxygen ion) is added into the crystalline oxide semiconductor film 413; thus, oxygen is supplied to the crystalline oxide semiconductor film 413.

In this embodiment, the oxygen 431 is added into the crystalline oxide semiconductor film 413 through the gate insulating layer 402 by an ion implantation method. The addition of the oxygen 431 amorphizes at least part of the crystalline oxide semiconductor film 413, so that the amorphous oxide semiconductor film 443 having a region where the amount of oxygen is excess as compared to the stoichiometric composition ratio of the oxide semiconductor in a crystalline state is formed (see FIG. 5D).

An oxygen vacancy in the amorphous oxide semiconductor film 443 can be repaired by the oxygen 431.

Next, the gate electrode layer 401 is formed over the gate insulating layer 402.

In the example described in this embodiment, a sidewall insulating layer is not provided on the side of the gate electrode layer 401; however, a sidewall insulating layer may be provided and the gate insulating layer 402 may be processed into an island shape as described in Embodiment 1.

Figure 5E:
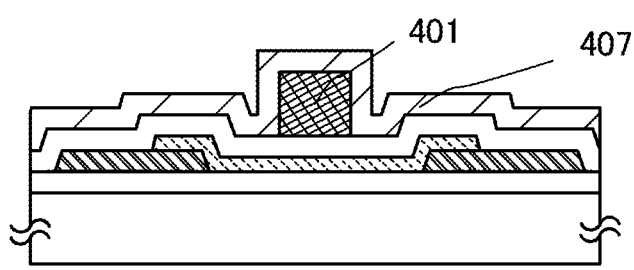

Next, the insulating layer 407 is formed over the gate insulating layer 402 and the gate electrode layer 401 (see FIG. 5E). The insulating layer 407 has either a single-layer structure or a stacked-layer structure, and includes an aluminum oxide film.

In this embodiment, a 100-nm-thick aluminum oxide film is formed as the insulating layer 407 by a sputtering method.

Next, heat treatment is performed on the amorphous oxide semiconductor film 443 to crystallize at least part of the amorphous oxide semiconductor film 443, so that the crystalline oxide semiconductor film 403 which includes a crystal having a c-axis which is substantially perpendicular to a top surface of the crystalline oxide semiconductor film 403 is formed.

The aluminum oxide film provided as the insulating layer 407 over the amorphous oxide semiconductor film 443 has a high shielding effect (blocking effect) of blocking penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating layer 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region where the amount of oxygen is excess as compared to the stoichiometric oxide semiconductor in a crystalline state.

Therefore, the crystalline oxide semiconductor film 403 has high purity because impurities such as hydrogen and moisture do not enter the crystalline oxide semiconductor film 403, and has the region where the amount of oxygen is excess as compared to the stoichiometric oxide semiconductor in a crystalline state because oxygen is prevented from being released therefrom.

If oxygen is eliminated from the crystalline oxide semiconductor film 403, an oxygen vacancy is formed therein. An oxide semiconductor with no excess oxygen cannot repair such an oxygen vacancy with other oxygen. In contrast, since the crystalline oxide semiconductor film 403 according to one embodiment of the present invention is a CAAC-OS film containing an excess of oxygen, the excess of oxygen (which is preferably excess as compared to the stoichiometric composition ratio) contained in the film can act to repair an oxygen vacancy in the crystalline oxide semiconductor film 403 immediately.

Accordingly, the crystalline oxide semiconductor film 403 enables a variation in the threshold voltage $V_{th}$ of the transistor 430 and a shift of the threshold voltage ($\Delta V_{th}$) due to an oxygen vacancy to be reduced.

Figure 7C:
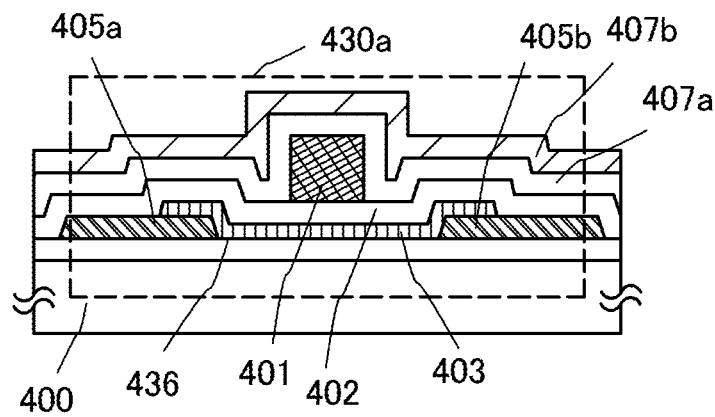

The insulating layer 407 can have a stacked-layer structure including the aluminum oxide film and an inorganic insulating film such as, typically, a silicon oxide film, a silicon oxynitride film, an aluminum oxynitride film, or a gallium oxide film. FIG. 7C illustrates an example in which the insulating layer 407 in the transistor 430 has a stacked-layer structure of the insulating layers 407a and 407b.

As shown in FIG. 7C, the insulating layer 407a is formed over the gate insulating layer 402 and the gate electrode layer 401, and the insulating layer 407b is formed over the insulating layer 407a. For example, in this embodiment, a silicon oxide film which has a region containing an excess of oxygen as compared to the stoichiometric composition ratio of the silicon oxide in a crystalline state is used as the insulating layer 407a, and an aluminum oxide film is used as the insulating layer 407b.

Figure 5F:
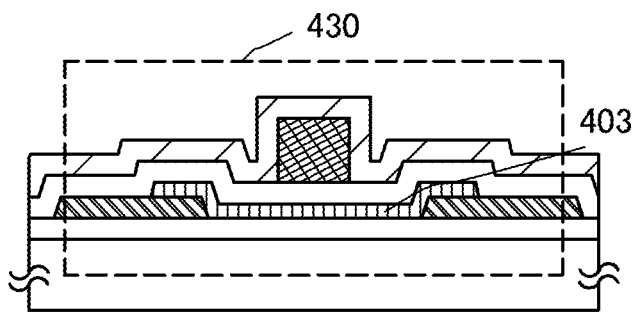

Through the above process, the transistor 430 is formed (see FIG. 5F). The transistor 430 includes the highly purified crystalline oxide semiconductor film containing an excess of oxygen that repairs an oxygen vacancy. Therefore, the transistor 430 has less change in electric characteristics and thus is electrically stable.

The current value in the off state (off-state current value) of the transistor 430 using the highly purified crystalline oxide semiconductor film 403 containing an excess of oxygen that repairs an oxygen vacancy according to this embodiment is less than or equal to 100 zA per micrometer of channel width at room temperature (1 zA (zeptoampere) $=1\times10^{-21}$ A), preferably less than or equal to 10 zA/µm, further preferably less than or equal to 1 zA/µm, still further preferably less than or equal to 100 yA/µm.

In this manner, a semiconductor device using an oxide semiconductor with stable electric characteristics can be provided. Accordingly, a highly reliable semiconductor device can be provided.

(Embodiment 6)

In this embodiment, one embodiment of a method for manufacturing a semiconductor device is described. The description of the above embodiment can be applied to the same portion as or a portion having a function similar to that in the above embodiment, and the same step as or a step having a function similar to that in the above embodiment, and description thereof is not repeated. In addition, detailed description of the same portions is omitted.

Described in this embodiment are examples of a step for adding oxygen, which is applicable in the manufacturing process of the transistor 430 described in Embodiment 5.

Figure 6A:
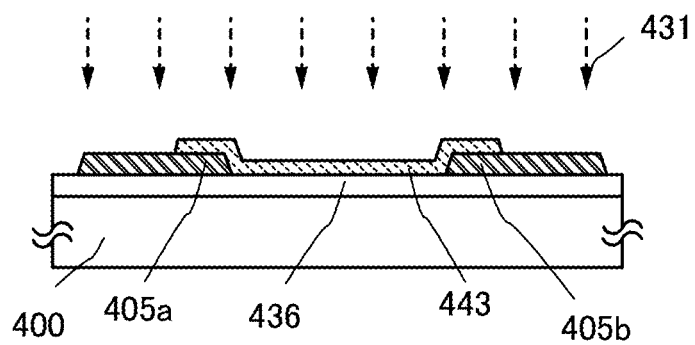
FIGS. 6A to 6C show one embodiment of a method for manufacturing a semiconductor device.

FIG. 6A illustrates an example of adding the oxygen 431 directly into the crystalline oxide semiconductor film 413 after the step shown in FIG. 5B. The addition of the oxygen 431 amorphizes at least part of the crystalline oxide semiconductor film 413, so that the amorphous oxide semiconductor film 443 having a region where the amount of oxygen is excess as compared to the stoichiometric composition ratio of the oxide semiconductor in a crystalline state is formed. An oxygen vacancy in the amorphous oxide semiconductor film 443 can be repaired by the oxygen 431. In the case where oxygen is added directly into the crystalline oxide semiconductor film 413 which is bare as shown in FIG. 6A, plasma treatment can be used.

Figure 6B:
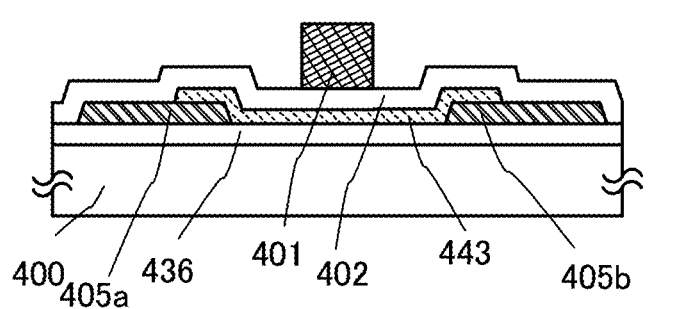

FIG. 6B illustrates an example of adding the oxygen 431 into the crystalline oxide semiconductor film 413 through the gate insulating layer 402 after the gate electrode layer 401 is formed over the gate insulating layer 402. The addition of the oxygen 431 amorphizes at least part of the crystalline oxide semiconductor film 413, so that the amorphous oxide semiconductor film 443 having a region where the amount of oxygen is excess as compared to the stoichiometric composition ratio of the oxide semiconductor in a crystalline state is formed. An oxygen vacancy in the amorphous oxide semiconductor film 443 can be repaired by the oxygen 431.

Figure 6C:
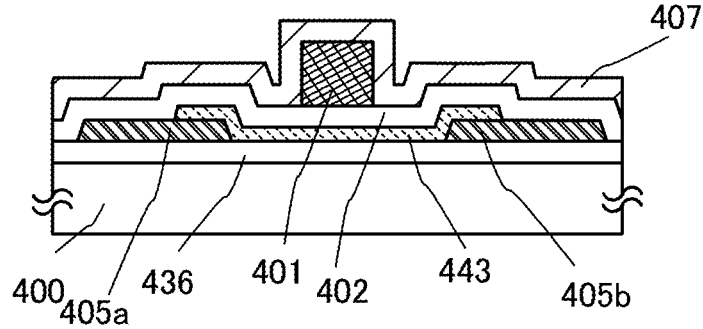

FIG. 6C illustrates an example of adding the oxygen 431 into the crystalline oxide semiconductor film 413 through the gate insulating layer 402 and the insulating layer 407 after the insulating layer 407 is formed over the gate insulating layer 402 and the gate electrode layer 401. The addition of the oxygen 431 amorphizes at least part of the crystalline oxide semiconductor film 413, so that the amorphous oxide semiconductor film 443 having a region where the amount of oxygen is excess as compared to the stoichiometric composition ratio of the oxide semiconductor in a crystalline state is formed. An oxygen vacancy in the amorphous oxide semiconductor film 443 can be repaired by the oxygen 431.

As described above, the addition of oxygen into the crystalline oxide semiconductor film can be performed anytime after dehydration or dehydrogenation is performed thereon. Further, the number of times of the addition of oxygen into the dehydrated or dehydrogenated oxide semiconductor film is not limited.

The transistor manufactured through the above process includes the highly purified crystalline oxide semiconductor film containing an excess of oxygen that repairs an oxygen vacancy. Therefore, the transistor has less change in electric characteristics and thus is electrically stable.

A semiconductor device using an oxide semiconductor with stable electric characteristics can be provided. Accordingly, a highly reliable semiconductor device can be provided.

This embodiment can be implemented combining with another embodiment as appropriate.

(Embodiment 7)

In this embodiment, one embodiment of a semiconductor device and a method for manufacturing the semiconductor device is described with reference to FIGS. 8A to 8C. The description of the above embodiment can be applied to the same portion as or a portion having a function similar to that in the above embodiment, and the same step as or a step having a function similar to that in the above embodiment, and description thereof is not repeated. In addition, detailed description of the same portions is omitted.

Described in this embodiment are examples in which impurity regions functioning as a source region and a drain region are formed in a crystalline oxide semiconductor film in a manufacturing method of a semiconductor device according to one embodiment of the present invention. The impurity regions functioning as a source region and a drain region can be formed by adding an impurity (also called a dopant) for changing the electrical conductivity into the crystalline oxide semiconductor film.

The dopant concentration in each impurity region of the source region and the drain region is preferably greater than or equal to $5\times10^{18}/cm^3$ and less than or equal to $1\times10^{22}/cm^3$.

The dopant is a Group 15 element and/or boron, specifically, one or more selected from phosphorus, arsenic, antimony, and boron. As the method of adding the dopant into the crystalline oxide semiconductor film, an ion doping method or an ion implantation method can be used.

The substrate may be heated while the dopant is added by an ion doping method or an ion implantation method.

The addition of dopant into the crystalline oxide semiconductor film may be performed plural times, and the number of kinds of dopant may be plural.

The addition of dopant may amorphizes the impurity region. In that case, the crystallinity can be recovered by performing heat treatment thereon after the addition of dopant.

Figure 8A:
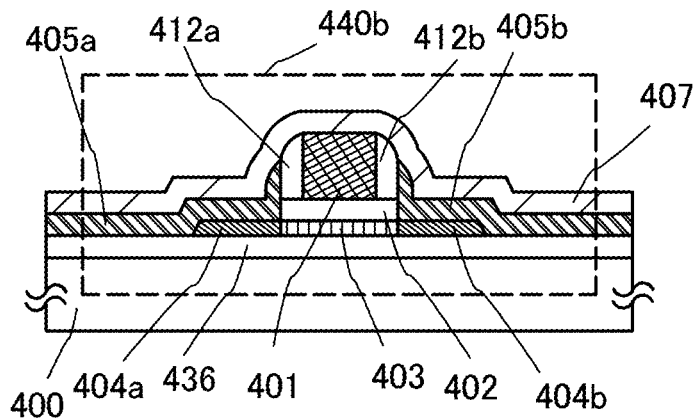
FIGS. 8A to 8C show embodiments of a semiconductor device.

FIG. 8A illustrates a transistor 440b in which impurity regions 404a and 404b functioning as a source region and a drain region are provided in the crystalline oxide semiconductor film 403 in the transistor 440 described in Embodiments 1 to 3. The impurity regions 404a and 404b can be formed by adding a dopant into the crystalline oxide semiconductor film 403 with the gate electrode layer 401 and the sidewall insulating layers 412a and 412b as a mask before formation of the source electrode layer 405a and the drain electrode layer 405b.

Figure 8B:
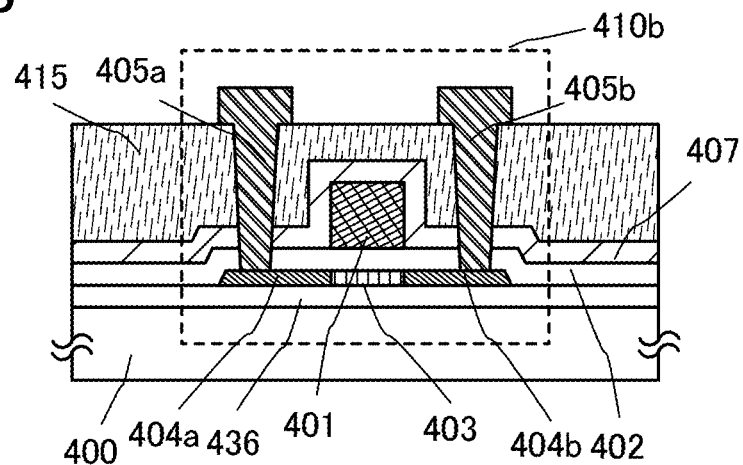

FIG. 8B illustrates a transistor 410b in which the impurity regions 404a and 404b functioning as a source region and a drain region are provided in the crystalline oxide semiconductor film 403 in the transistor 410 described in Embodiment 4. The impurity regions 404a and 404b can be formed by adding a dopant into the crystalline oxide semiconductor film 403 with the gate electrode layer 401 as a mask.

Figure 8C:
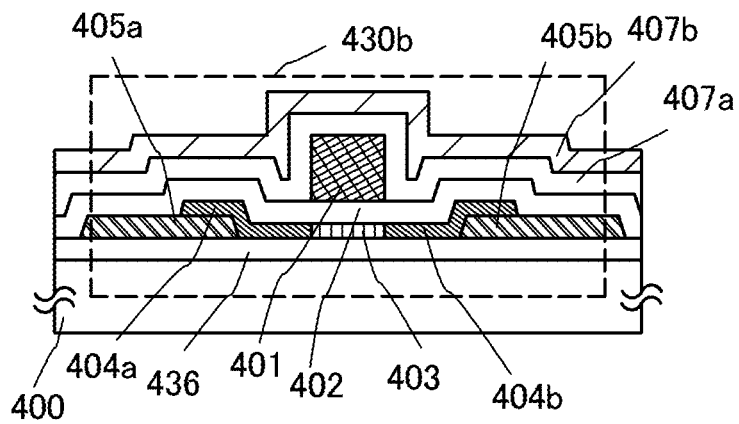

FIG. 8C illustrates a transistor 430b in which the impurity regions 404a and 404b functioning as a source region and a drain region are provided in the crystalline oxide semiconductor film 403 in the transistor 430 described in Embodiment 5. The impurity regions 404a and 404b can be formed by adding a dopant into the crystalline oxide semiconductor film 403 with the gate electrode layer 401 as a mask.

With the impurity regions functioning as a source region and a drain region, the electric field applied to a channel formation region between the impurity regions can be attenuated. Further, by electrically connecting the electrode layer to the crystalline oxide semiconductor film in the impurity region, contact resistance between the electrode layer and the crystalline oxide semiconductor film can be reduced. Consequently, the electrical characteristics of the transistor can be enhanced.

This embodiment can be implemented combining with another embodiment as appropriate.

(Embodiment 8)

A semiconductor device (also referred to as a display device) with a display function can be manufactured using the transistor an example of which is described in any of Embodiments 1 to 7. Further, part or all of the driver circuitry which includes the transistor can be formed over a substrate where the pixel portion is formed, whereby a system-on-panel can be obtained.

Figure 20A:
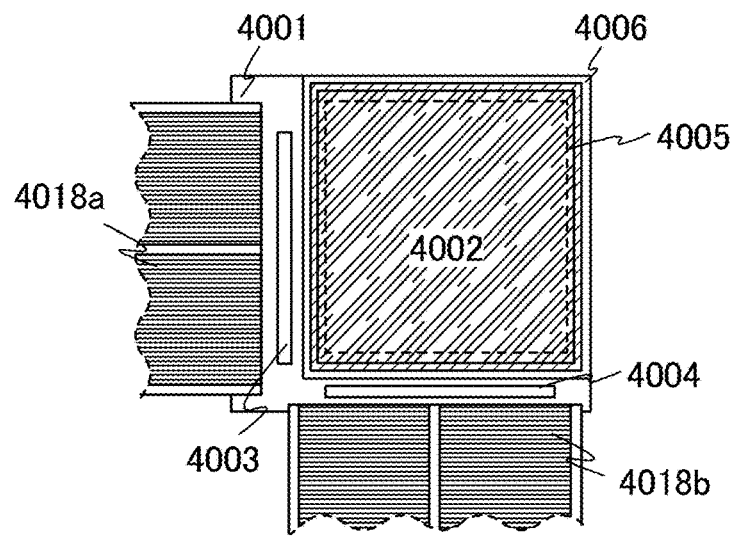
FIGS. 20A to 20C show embodiments of a semiconductor device.

In FIG. 20A, a sealant 4005 is provided so as to surround a pixel portion 4002 provided over a first substrate 4001, and the pixel portion 4002 is sealed with a second substrate 4006. In FIG. 20A, a scan line driver circuit 4004 and a signal line driver circuit 4003 each are formed using a single crystal semiconductor film or a polycrystalline semiconductor film over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 through flexible printed circuits (FPCs) 4018a and 4018b.

Figure 20B:
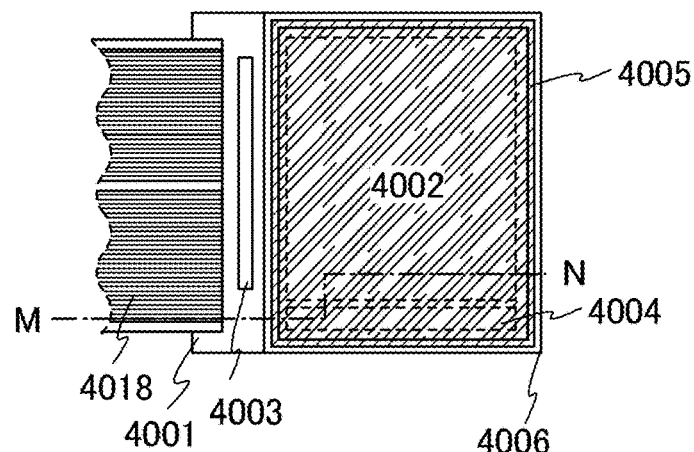
Figure 20C:
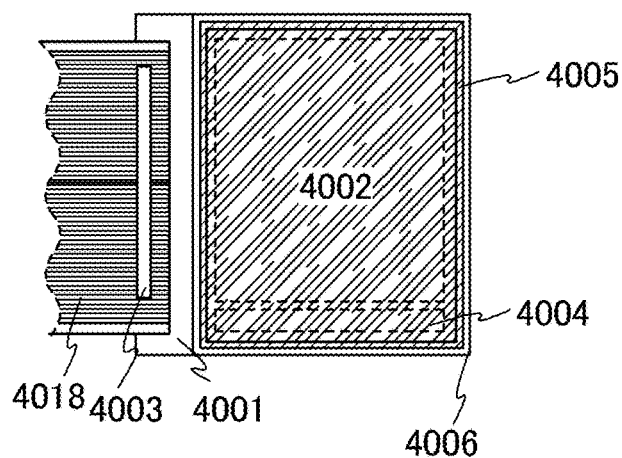

In FIGS. 20B and 20C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Hence, the pixel portion 4002 and the scan line driver circuit 4004 are sealed together with the display element, by the first substrate 4001, the sealant 4005, and the second substrate 4006. Further, in FIGS. 20B and 20C, the signal line driver circuit 4003 which is formed using a single crystal semiconductor film or a polycrystalline semiconductor film over another substrate is mounted in a region that is different from the region surrounded by the sealant 4005 over the first substrate 4001. In FIGS. 20B and 20C, various signals and potentials are supplied to the signal line driver circuit 4003, the scan line driver circuit 4004, and the pixel portion 4002 through an FPC 4018.

Although FIGS. 20B and 20C each illustrate an example in which the signal line driver circuit 4003 is formed separately and mounted on the first substrate 4001, an embodiment of the present invention is not limited to this structure. The scan line driver circuit may be separately formed and then mounted, or only part of the signal line driver circuit or only part of the scan line driver circuit may be separately formed and then mounted.

The connection method of a separately formed driver circuit is not particularly limited; a chip on glass (COG) method, a wire bonding method, a tape automated bonding (TAB) method, or the like can be used. FIG. 20A illustrates an example in which the signal line driver circuit 4003 and the scan line driver circuit 4004 are mounted by a COG method; FIG. 20B illustrates an example in which the signal line driver circuit 4003 is mounted by a COG method; FIG. 20C illustrates an example in which the signal line driver circuit 4003 is mounted by a TAB method.

The display device encompasses a panel in which a liquid crystal display element is sealed, and a module in which an IC or the like including a controller is mounted on the panel.

The display device in this specification refers to an image display device, a display device, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors to which any of the transistors which are described in Embodiments 1 to 7 can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically encompasses an inorganic electroluminescent (EL) element, an organic EL element, and the like. Besides those, display medium whose contrast is changed by an electric effect, such as electronic ink, can also be used.

Figure 21A:
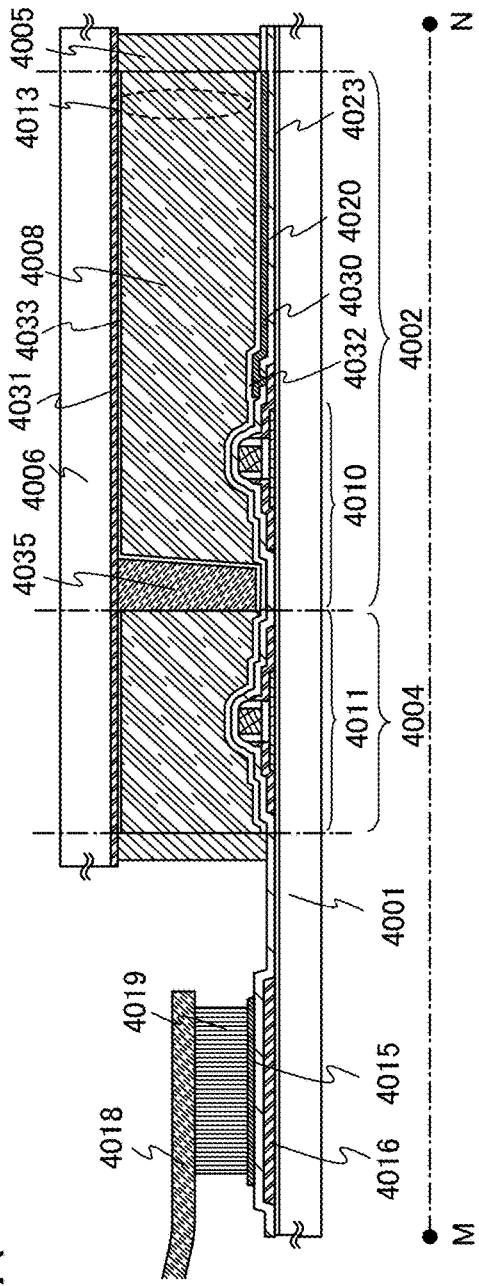
FIGS. 21A and 21B show embodiments of a semiconductor device.
Figure 21B:
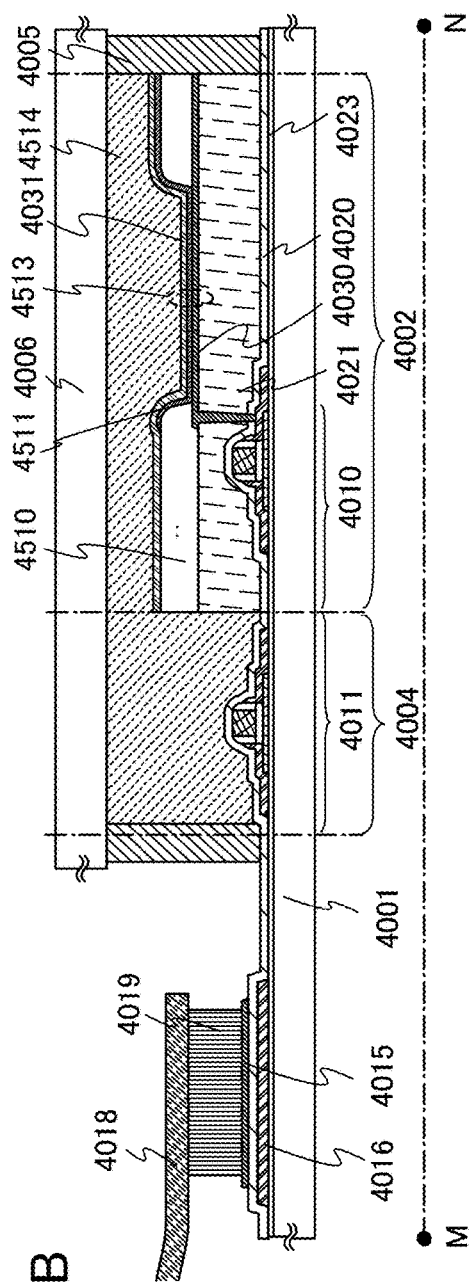

An embodiment of a semiconductor device is described with reference to FIG. 20A and FIGS. 21A and 21B. FIGS. 21A and 21B correspond to cross-sectional views taken along line M-N in FIG. 20A.

As shown in FIGS. 21A and 21B, the semiconductor device has a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed of the same conductive film as a first electrode layer 4030, and the terminal electrode 4016 is formed of the same conductive film as a source and drain electrode layers of transistors 4010 and 4011.

The pixel portion 4002 and the scan line driver circuit 4004 provided over the first substrate 4001 include a plurality of transistors. In FIGS. 21A and 21B, the transistor 4010 included in the pixel portion 4002 and the transistor 4011 included in the scan line driver circuit 4004 are shown as an example. An insulating layer 4020 is provided over the transistors 4010 and 4011 in FIG. 21A, and an insulating layer 4021 is further provided in FIG. 21B. An insulating film 4023 is an insulating film serving as a base film.

In this embodiment, the transistor described in any of Embodiments 1 to 7 can be applied to the transistor 4010, 4011.

Each of the transistors 4010 and 4011 includes a highly purified crystalline oxide semiconductor film containing excess oxygen that repairs an oxygen vacancy. Therefore, change in the electric characteristics of the transistor 4010 and the transistor 4011 is suppressed, and the transistor 4010 and the transistor 4011 are electrically stable.

Accordingly, highly reliable semiconductor devices can be provided as the semiconductor device of this embodiment shown in FIGS. 21A and 21B.

The transistor 4010 included in the pixel portion 4002 is electrically connected to the display element to constitute part of a display panel. A variety of display elements can be used as the display element as long as display can be performed.

An example of a liquid crystal display device using a liquid crystal element as a display element is illustrated in FIG. 21A. In FIG. 21A, a liquid crystal element 4013 which is the display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 are stacked with the liquid crystal layer 4008 provided therebetween.

A columnar spacer denoted by reference numeral 4035 is obtained by selective etching of an insulating film and is provided in order to control the thickness (cell gap) of the liquid crystal layer 4008. A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is not involved may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which several weight percent or more of a chiral material is mixed is used for the liquid crystal layer in order to widen the temperature range. The liquid crystal composition which includes the liquid crystal exhibiting a blue phase and a chiral agent has a short response time, and has optical isotropy, which makes the alignment process unnecessary and the viewing angle dependence small. In addition, since an alignment film is not involved and thus rubbing treatment is unnecessary, electrostatic discharge damage caused by the rubbing treatment can be prevented, so that defects and damage of the liquid crystal display device in the manufacturing process can be reduced. Thus, productivity of the liquid crystal display device can be increased. A transistor using an oxide semiconductor film has a possibility that the electric characteristics may change significantly by the influence of static electricity to deviate from the designed range. Therefore, it is more effective to use a liquid crystal material exhibiting a blue phase for the liquid crystal display device including the transistor using the oxide semiconductor film.

The inherent resistance of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. The inherent resistance in this specification is measured at 20° C.

The magnitude of a storage capacitor provided in the liquid crystal display device is set considering the leakage current of the transistor in the pixel portion or the like so that electric charge can be held for a predetermined period. The magnitude of the storage capacitor may be set considering the off-state current of the transistor or the like. Since the transistor including a highly purified crystalline oxide semiconductor film is used, it is enough to provide a storage capacitor having a capacitance that is less than or equal to ⅓, preferably less than or equal to ⅕ of the liquid crystal capacitance of each pixel.

In the transistor used in this embodiment, which uses the highly purified crystalline oxide semiconductor film, the current value in the off state (off-state current value) is small. Accordingly, an electrical signal such as an image signal can be retained for a longer period, and the writing interval can be set longer in the power-on state. Accordingly, the frequency of refresh operation can be reduced, which leads to a reduction in power consumption.

The field-effect mobility of the transistor using a highly purified crystalline oxide semiconductor film used in this embodiment is relatively high, which enables high-speed driving. For example, with use of such a transistor which can operate at high speed for a liquid crystal display device, a switching transistor in a pixel portion and a driver transistor in a driver circuitry can be formed over one substrate. That is, a semiconductor device formed using a silicon wafer or the like is not additionally needed as a driver circuitry, and thus the number of components of the semiconductor device can be reduced. In addition, by using the transistor which can operate at high speed in the pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

Further, a normally-black liquid crystal display device such as a transmissive liquid crystal display device utilizing a vertical alignment (VA) mode may be realized. Some examples can be given as the vertical alignment mode; for example, an MVA (multi-domain vertical alignment) mode, a PVA (patterned vertical alignment) mode, an ASV mode, or the like can be employed. Furthermore, one embodiment of the present invention can be applied to a VA liquid crystal display device. The VA liquid crystal display device has a kind of form in which alignment of liquid crystal molecules of the liquid crystal display panel is controlled. In the VA liquid crystal display device, liquid crystal molecules are aligned in a vertical direction with respect to the panel surface when no voltage is applied. Further, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be applied with a polarizing substrate and a retardation substrate. In addition, a backlight, a side light, or the like may be used as a light source.

As a display method in the pixel portion, a progressive method, an interlace method, or the like can be employed. Further, color elements controlled in each pixel for color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the size of the display region may be different between respective dots of color elements. One embodiment of the present invention can be applied not only to a display device for color display, but also to a display device for monochrome display.

Further, a light-emitting element utilizing electroluminescence can alternatively be used as the display element in the display device. Light-emitting elements utilizing electroluminescence are classified according to whether the light-emitting material is an organic compound or an inorganic compound; in general, the former is referred to as an organic EL element, and the latter is referred to as an inorganic EL element.

In an organic EL element, by application of voltage to the light-emitting element, electrons and holes are separately injected from a pair of electrodes into a layer containing the light-emitting organic compound, and current flows. Then, the carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. On the other hand, the thin-film inorganic EL element has a structure where a light-emitting layer is sandwiched between dielectric layers, which is further sandwiched between electrodes, and its light emission mechanism is localized type light emission that utilizes inner-shell electron transition of metal ions. An example in which an organic EL element is used as the light-emitting element is described here.

In order to extract light emitted from the light-emitting element, at least one of the pair of electrodes has a light-transmitting property. The transistor and the light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the side opposite to the substrate and the substrate side.

FIG. 21B illustrates an example of a light-emitting device using a light-emitting element as a display element. A light-emitting element 4513 which is the display element is electrically connected to the transistor 4010 in the pixel portion 4002. The structure of the light-emitting element 4513 is not limited to the stacked-layer structure including the first electrode layer 4030, an electroluminescent layer 4511, and the second electrode layer 4031, which is illustrated in FIG. 21B. The structure of the light-emitting element 4513 can be changed as appropriate depending on the direction in which light is extracted from the light-emitting element 4513, or the like.

A bank 4510 can be formed using an organic insulating material or an inorganic insulating material. It is particularly preferable that the bank 4510 be formed using a photosensitive resin material to have an opening over the first electrode layer 4030 so that a sidewall of the opening slopes with continuous curvature.

The electroluminescent layer 4511 consists of either a single layer or a plurality of layers stacked.

A protective film may be formed over the second electrode layer 4031 and the bank 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is confined by the first substrate 4001, the second substrate 4006, and the sealant 4005, a filler 4514 is provided for sealing. It is preferable that the panel be packaged (sealed) with a protective film (such as a laminate film or an ultraviolet curable resin film) or a cover member with high air-tightness and little degasification so that the panel is not exposed to the outside air, in this manner.

As the filler 4514, an ultraviolet curable resin or a thermosetting resin can be used as well as an inert gas such as nitrogen or argon; for example, polyvinyl chloride (PVC), an acrylic resin, a polyimide resin, an epoxy resin, a silicone resin, polyvinyl butyral (PVB), ethylene vinyl acetate (EVA), or the like can be used. For example, nitrogen is used for the filler.

In addition, if necessary, an optical film, such as a polarizing plate, a circularly polarizing plate (including an elliptically polarizing plate), a retardation plate (a quarter-wave plate or a half-wave plate), or a color filter, may be provided as appropriate on a light-emission surface of the light-emitting element. Further, the polarizing plate or the circularly polarizing plate may be provided with an anti-reflection film. For example, anti-glare treatment by which reflected light can be diffused by unevenness of the surface so as to reduce the glare can be performed.

Further, an electronic paper in which electronic ink is driven can be provided as the display device. The electronic paper is also called an electrophoretic display device (an electrophoretic display) and is advantageous in that it has the same level of readability as paper, it has lower power consumption than other display devices, and it can be made thin and lightweight.

The electrophoretic display device contains a plurality of microcapsules dispersed in a solvent or a solute, each microcapsule containing first particles which are positively charged and second particles which are negatively charged, in which by applying an electric field to the microcapsules, the particles in the microcapsules move in opposite directions to each other and only the color of the particles gathering on one side is displayed, though there are various modes in the electrophoretic display device. The first particles and the second particles each contain pigment and do not move without an electric field. Further, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is called electronic ink. This electronic ink can be printed on a surface of glass, plastic, cloth, paper, or the like. Furthermore, by using a color filter or particles that have a pigment, color display can also be performed.

The first particle and the second particle in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or a composite material of any of these.

As the electronic paper, a display device using a twisting ball display system can also be applied. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 20A to 20C and FIGS. 21A and 21B, as each of the first substrate 4001 and the second substrate 4006, a flexible substrate, for example, a plastic substrate having a light-transmitting property or the like can be used, as well as a glass substrate. As plastic, a fiberglass-reinforced plastics (FRP) plate, a polyvinyl fluoride (PVF) film, a polyester film, or an acrylic resin film can be used. A sheet with a structure in which an aluminum foil is sandwiched between PVF films or polyester films can be used as well.

In this embodiment, an aluminum oxide film is used as the insulating layer 4020. The insulating layer 4020 can be formed by a sputtering method or a plasma enhanced CVD method.

The aluminum oxide film provided as the insulating layer 4020 over an oxide semiconductor film has a high shielding effect (blocking effect) of blocking penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

The transistors 4010 and 4011 each include the crystalline oxide semiconductor film obtained by recrystallization of an amorphous oxide semiconductor film amorphized by adding oxygen into a crystalline oxide semiconductor film. Since the heat treatment for crystallizing the amorphous oxide semiconductor film is performed in the state where the amorphous oxide semiconductor film is covered with the aluminum oxide film, oxygen can be prevented from being released from the amorphous oxide semiconductor film by the heat treatment. Thus, the resulting crystalline oxide semiconductor film can maintain the amount of oxygen contained in the amorphous oxide semiconductor film, and therefore has a region where the amount of oxygen is excess as compared to the stoichiometric oxide semiconductor in a crystalline state.

Therefore, the crystalline oxide semiconductor film has high purity because impurities such as hydrogen and moisture do not enter the crystalline oxide semiconductor film, and has the region where the amount of oxygen is excess as compared to the stoichiometric oxide semiconductor in a crystalline state because oxygen is prevented from being released therefrom. Accordingly, the crystalline oxide semiconductor film enables a variation in the threshold voltage Vin of each of the transistors 4010 and 4011 and a shift of the threshold voltage ($\Delta V_{th}$) due to an oxygen vacancy to be reduced.

The insulating layer 4021 serving as a planarizing insulating film can be formed using an organic material having heat resistance, such as acrylic, polyimide, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The insulating layer may be formed by stacking a plurality of insulating films formed of these materials.

There is no particular limitation on the method for forming the insulating layer 4021, and any of the following can be used depending on a material thereof: a method such as a sputtering method, an SOG method, spin coating, dipping, spray coating, or a droplet discharging method (e.g., an inkjet method), screen printing, or offset printing; a tool (equipment) such as doctor knife, roll coater, curtain coater, or knife coater; or the like.

The display device displays an image by transmitting light from a light source or a display element. Therefore, it is necessary that the substrate and the thin films such as the insulating film and the conductive film provided for the pixel portion where light is transmitted have a light-transmitting property with respect to light in the visible-light wavelength range.

On the other hand, the first electrode layer and the second electrode layer (each of which is also called a pixel electrode layer, a common electrode layer, a counter electrode layer, or the like) for applying voltage to the display element each have either a light-transmitting property or a light-reflecting property, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 each can also be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called a conductive polymer) can also be used for any of the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Further, since the transistor is likely to be broken by static electricity or the like, a protection circuit for protecting the driver circuitry is preferably provided. The protection circuit is preferably formed using a nonlinear element.

As described above, by applying any of the transistors described in Embodiments 1 to 7, semiconductor devices having a variety of functions can be provided.

(Embodiment 9)

A semiconductor device having an image sensing function for reading data of an object can be manufactured with use of any of the transistors described in Embodiments 1 to 7.

Figure 22A:
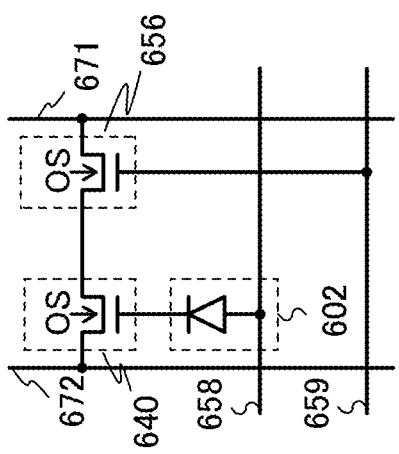
FIGS. 22A and 22B show one embodiment of a semiconductor device.

FIG. 22A illustrates an example of a semiconductor device having an image sensing function. FIG. 22A is an equivalent circuit of a photo sensor and FIG. 22B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

In the circuit diagram in this specification, a transistor using an oxide semiconductor film is put down with a symbol "OS" so as to be clearly identified as a transistor using an oxide semiconductor film. In FIG. 22A, the transistor 640 and the transistor 656 are transistors each using a crystalline oxide semiconductor film, such as the transistor 440 described in Embodiment 1.

Figure 22B:
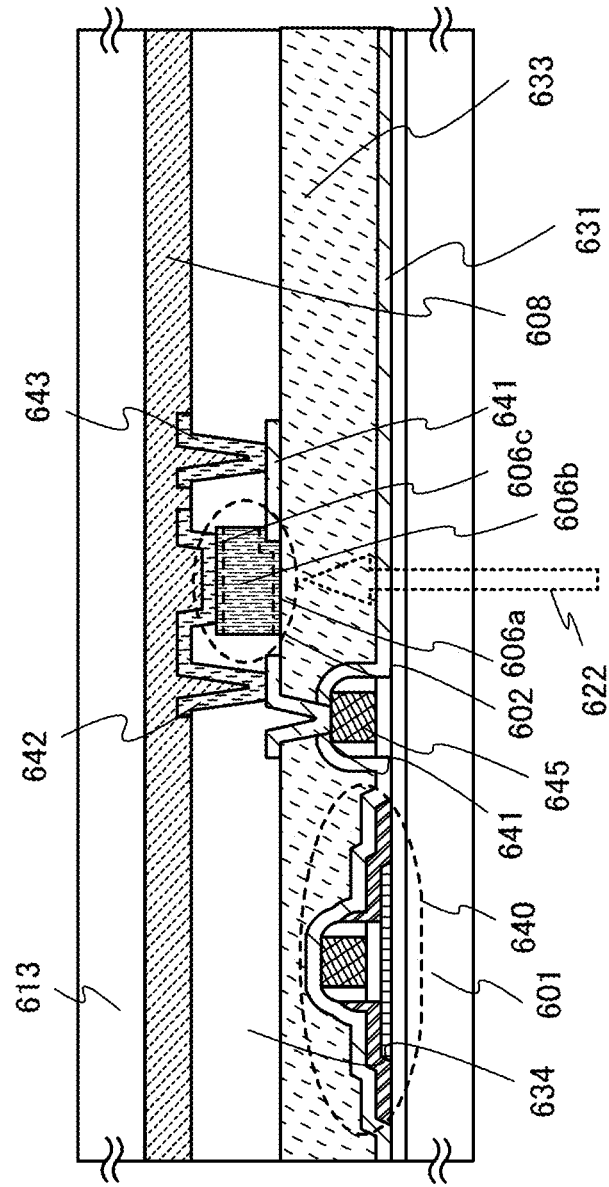

FIG. 22B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 with an adhesive layer 608 provided therebetween.

An insulating layer 631, an interlayer insulating layer 633, and an interlayer insulating layer 634 are provided over the transistor 640. The photodiode 602 is provided over the interlayer insulating layer 633. In the photodiode 602, a first semiconductor layer 606a, a second semiconductor layer 606b, and a third semiconductor layer 606c are sequentially stacked from the interlayer insulating layer 633 side, between an electrode layer 641 formed over the interlayer insulating layer 633 and an electrode layer 642 formed over the interlayer insulating layer 634.

The electrode layer 641 is electrically connected to a conductive layer 643 provided for the interlayer insulating layer 634, and the electrode layer 642 is electrically connected to a conductive layer 645 through the electrode layer 641. The conductive layer 645 is electrically connected to a gate electrode layer of the transistor 640, and the photodiode 602 is electrically connected to the transistor 640.

Described in this embodiment is a pin photodiode in which a semiconductor layer having a p-type conductivity as the first semiconductor layer 606a, a high-resistance semiconductor layer (i-type semiconductor layer) as the second semiconductor layer 606b, and a semiconductor layer having an n-type conductivity as the third semiconductor layer 606c are stacked.

The first semiconductor layer 606a is a p-type semiconductor layer and can be formed using an amorphous silicon film containing an impurity element imparting a p-type conductivity. The first semiconductor layer 606a is formed by a plasma enhanced CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be performed thereon after adding the impurity element by an ion implantation method or the like in order to diffuse the impurity element. In that case, as the method for forming the amorphous silicon film, an LPCVD method, a chemical vapor deposition method, a sputtering method, or the like may be used. The first semiconductor layer 606a is preferably formed to have a thickness greater than or equal to 10 nm and less than or equal to 50 nm.

The second semiconductor layer 606b is an i-type semiconductor layer (intrinsic semiconductor layer) and is formed using an amorphous silicon film. As for formation of the second semiconductor layer 606b, an amorphous silicon film is formed with use of a semiconductor source gas by a plasma enhanced CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be alternatively formed by an LPCVD method, a vapor deposition method, a sputtering method, or the like. The second semiconductor layer 606b is preferably formed to have a thickness greater than or equal to 200 nm and less than or equal to 1000 nm.

The third semiconductor layer 606c is an n-type semiconductor layer and is formed using an amorphous silicon film containing an impurity element imparting an n-type conductivity. The third semiconductor layer 606c is formed by a plasma enhanced CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be performed thereon after adding the impurity element by an ion implantation method or the like in order to diffuse the impurity element. In that case, as the method for forming the amorphous silicon film, an LPCVD method, a chemical vapor deposition method, a sputtering method, or the like may be used. The third semiconductor layer 606c is preferably formed to have a thickness greater than or equal to 20 nm and less than or equal to 200 nm.

Any of the first semiconductor layer 606a, the second semiconductor layer 606b, and the third semiconductor layer 606c is not necessarily formed using an amorphous semiconductor, and may be formed using a polycrystalline semiconductor, or a microcrystalline semiconductor (semi-amorphous semiconductor: SAS).

The microcrystalline semiconductor belongs to a metastable state of an intermediate between amorphous and single crystalline considering Gibbs free energy. That is, the microcrystalline semiconductor film is a semiconductor having a third state which is stable in terms of free energy and has a short range order and lattice distortion. Columnar-like or needle-like crystals grow in a normal direction with respect to a substrate top surface. The Raman spectrum of microcrystalline silicon, which is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon contains hydrogen or halogen of at least 1 atomic percent or more in order to terminate a dangling bond. Moreover, a rare gas element such as helium, argon, krypton, or neon may be contained to further promote the lattice distortion, whereby the stability is increased and thus a favorable microcrystalline semiconductor can be obtained.

The microcrystalline semiconductor film can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed using a compound containing silicon such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

In addition, since the mobility of holes generated by the photoelectric effect is lower than that of electrons, such a pin photodiode exhibits better characteristics when a surface on the p-type semiconductor layer side is used as a light-receiving plane. Here, an example in which light received by the photodiode 602 from a surface of the substrate 601, over which the pin photodiode is formed, is converted into electric signals is described. Further, light approaching the semiconductor layer having the conductivity type opposite from that of the semiconductor layer on the light-receiving plane is disturbance light; therefore, a light-blocking conductive film is preferably used for the electrode layer on the semiconductor layer having the opposite conductivity type. The surface on the n-type semiconductor layer side can alternatively be used as the light-receiving plane.

The interlayer insulating layer 633, 634 can be formed using an insulating material by a sputtering method, a plasma enhanced CVD method, an SOG method, spin coating, dipping, spray coating, or a droplet discharge method (e.g., an inkjet method), screen printing, offset printing, or the like, or a tool (equipment) such as a doctor knife, a roll coater, a curtain coater, or a knife coater, depending on a material.

In this embodiment, an aluminum oxide film is used as the insulating layer 631. The insulating layer 631 can be formed by a sputtering method or a plasma enhanced CVD method.

The aluminum oxide film provided as the insulating layer 631 over an oxide semiconductor film has a high shielding effect (blocking effect) of blocking penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

The transistor 640 includes the crystalline oxide semiconductor film obtained by recrystallization of an amorphous oxide semiconductor film amorphized by adding oxygen into a crystalline oxide semiconductor film. Since the heat treatment for crystallizing the amorphous oxide semiconductor film is performed in the state where the amorphous oxide semiconductor film is covered with the aluminum oxide film, oxygen can be prevented from being released from the amorphous oxide semiconductor film by the heat treatment. Thus, the resulting crystalline oxide semiconductor film can maintain the amount of oxygen contained in the amorphous oxide semiconductor film, and therefore has a region where the amount of oxygen is excess as compared to the stoichiometric oxide semiconductor in a crystalline state.

Therefore, the crystalline oxide semiconductor film has high purity because impurities such as hydrogen and moisture do not enter the crystalline oxide semiconductor film, and has the region where the amount of oxygen is excess as compared to the stoichiometric oxide semiconductor in a crystalline state because oxygen is prevented from being released therefrom. Accordingly, the crystalline oxide semiconductor film enables a variation in the threshold voltage $V_{th}$ of the transistor 640 and a shift of the threshold voltage ($\Delta V_{th}$) due to an oxygen vacancy to be reduced.

For reduction of the surface roughness, an insulating layer functioning as a planarizing insulating film is preferably used as the interlayer insulating layer 633, 634. For the interlayer insulating layer 633, 634, an organic insulating material having heat resistance such as polyimide, acrylic resin, benzocyclobutene resin, polyamide, or epoxy resin can be used. Other than such organic insulating materials, it is also possible to use a single layer or stacked layers of a low-dielectric constant material (a low-k material), a siloxane-based resin, phosphosilicate glass (PSG), borophosphosilicate glass (BPSG), or the like.

With detection of light entering the photodiode 602, data on an object to be detected can be read. A light source such as a backlight can be used at the time of reading data on the object.

The transistor including the highly purified crystalline oxide semiconductor film containing an excess of oxygen that repairs an oxygen vacancy as described above has less change in electric characteristics and thus is electrically stable. Accordingly, with the transistor, a highly reliable semiconductor device can be provided.

This embodiment can be implemented combining with any structure described in the other embodiments as appropriate.

Embodiment 10)

The transistor an example of which is described in any of Embodiments 1 to 7 can be suitably used for a semiconductor device including an integrated circuit in which a plurality of transistors is stacked. In this embodiment, a memory medium (memory element) is described as an example of the semiconductor device.

In this embodiment, a semiconductor device including a transistor 140 that is a first transistor formed using a single crystal semiconductor substrate, and a transistor 162 that is a second transistor formed using a semiconductor film above the transistor 140 with an insulating layer provided therebetween, is manufactured. The transistor an example of which is described in any of Embodiments 1 to 7 can be suitably used as the transistor 162. Described in this embodiment is an example in which a transistor having a structure similar to that of the transistor 440 described in Embodiment 1 is used as the transistor 162.

Semiconductor materials and structures of the transistor 140 and the transistor 162, which are stacked, may be the same as or different from each other. Described in this embodiment is an example in which a transistor with a suitable material and a suitable structure is used in each circuit of a memory medium (memory element).

Figure 19A:
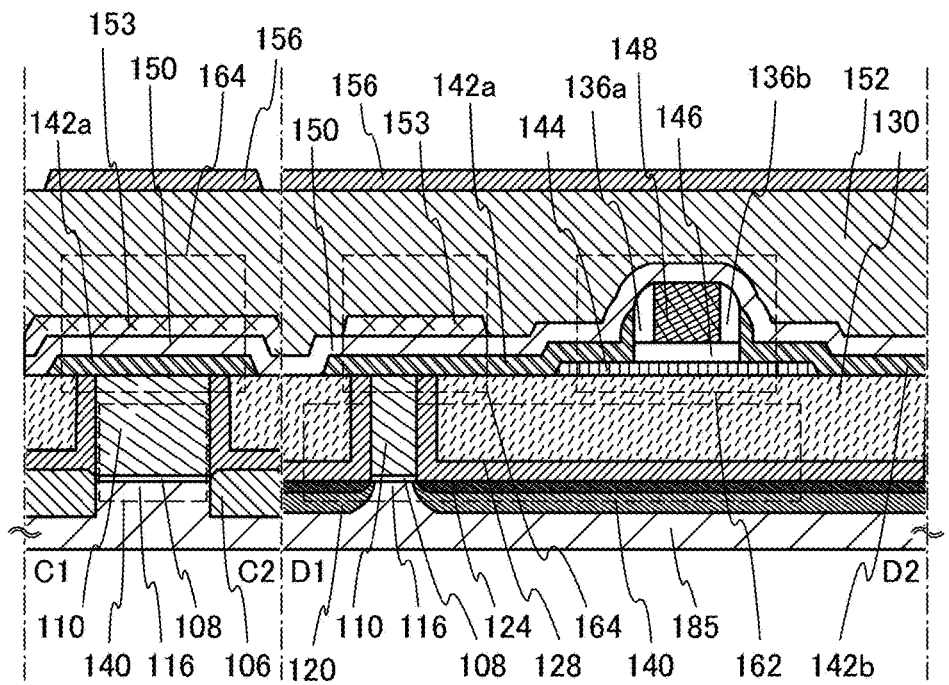
FIGS. 19A to 19C show one embodiment of a semiconductor device.
Figure 19B:
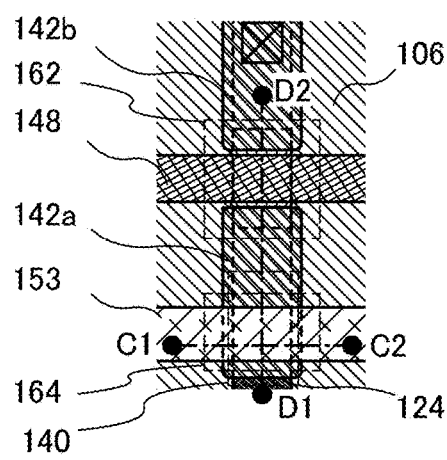
Figure 19C:
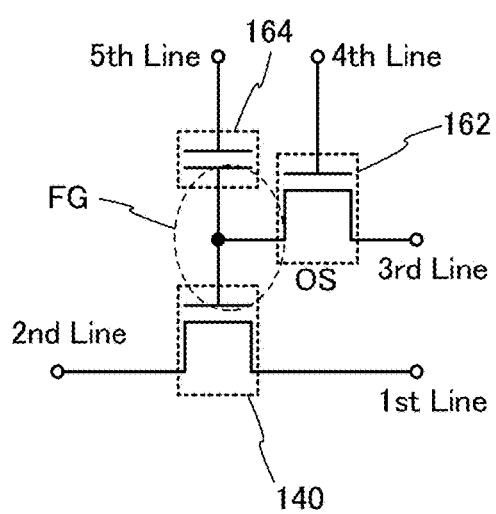

FIGS. 19A and 19B illustrate an example of a structure of a semiconductor device. FIG. 19A illustrates a cross section of the semiconductor device, and FIG. 19B illustrates a plan view of the semiconductor device. Here, FIG. 19A corresponds to the cross section along line C1-C2 and line D1-D2 in FIG. 19B. FIG. 19C illustrates an example of a circuit diagram of the semiconductor device when being used as a memory element. The semiconductor device illustrated in FIGS. 19A and 19B includes the transistor 140 using a first semiconductor material in a lower portion, and the transistor 162 using a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, gallium arsenide, or the like can be used, and a single crystal semiconductor is preferably used. An organic semiconductor material or the like may also be used. A transistor using such a semiconductor material other than an oxide semiconductor can operate at high speed easily. On the other hand, a transistor using an oxide semiconductor can retain electric charge for a long time owing to its characteristics.

A method for manufacturing the semiconductor device shown in FIGS. 19A to 19C is described with reference to FIGS. 19A to 19C.

The transistor 140 includes a channel formation region 116 provided in a substrate 185 including a semiconductor material (e.g., silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108.

As the substrate 185 including a semiconductor material, a single crystal semiconductor substrate or a polycrystalline semiconductor substrate comprised of silicon, silicon carbide, or the like; a compound semiconductor substrate of silicon germanium or the like; an SOI substrate; or the like can be used. Although the "SOI substrate" generally means a substrate in which a silicon semiconductor layer is provided on an insulating surface, the "SOI substrate" in this specification and the like also encompasses a substrate in which a semiconductor layer formed of a material other than silicon is provided on an insulating surface. That is, the semiconductor layer included in the "SOI substrate" is not limited to a silicon semiconductor layer. Moreover, the SOI substrate encompasses a substrate having a structure in which a semiconductor layer is provided over an insulating substrate such as a glass substrate, with an insulating layer provided therebetween.

The SOI substrate can be manufactured by any of the following methods: oxygen ions are added in a mirror-polished wafer, and then the wafer is heated at a high temperature(s) to form an oxidized layer at a predetermined depth from a top surface of the wafer and eliminate defects generated in the superficial layer; a semiconductor substrate is separated by utilizing the growth of microvoids, which are formed by hydrogen ion irradiation, by heat treatment; a single crystal semiconductor layer is formed on an insulating surface by crystal growth.

For example, ions are added through one surface of a single crystal semiconductor substrate to form an embrittlement layer at a certain depth from the surface of the single crystal semiconductor substrate, and an insulating layer is formed over one of the single crystal semiconductor substrate and an element substrate. Heat treatment is performed in a state where the single crystal semiconductor substrate and the element substrate are overlapped with each other with the insulating layer provided therebetween, so that a crack is generated in the embrittlement layer, whereby a single crystal semiconductor layer is formed of the single crystal semiconductor substrate, as a semiconductor layer. An SOI substrate formed by the above-described method can also be suitably used.

An element isolation insulating layer 106 is provided over the substrate 185 so as to surround the transistor 140. Note that it is preferable that the transistor 140 does not have a sidewall insulating layer as illustrated in FIGS. 19A to 19C in order to achieve high integration. On the other hand, when importance is put on the characteristics of the transistor 140, a sidewall insulating layer may be provided on the side surface of the gate electrode 110 to form another impurity region whose impurity concentration is different from an impurity concentration of the impurity region 120 in the impurity region 120.

The transistor 140 using a single crystal semiconductor substrate can operate at high speed. Thus, with use of the transistor as a reading transistor, data can be read at a high speed. Two insulating layers are formed so as to cover the transistor 140. As treatment before the transistor 162 and a capacitor 164 are formed, CMP treatment is performed on the two insulating layers, whereby planarized insulating layers 128 and 130 are formed and an upper surface of the gate electrode 110 is exposed.

As the insulating layer 128, 130, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating layer 128, 130 can be formed by a plasma enhanced CVD method, a sputtering method, or the like.

Alternatively, an organic material such as polyimide, an acrylic resin, or a benzocyclobutene resin can be used. Other than such organic materials, it is also possible to use a low-dielectric constant material (a low-k material) or the like. In the case of using an organic material, a wet process such as a spin coating method or a printing method may be applied to form the insulating layer 128, 130.

In the insulating layer 130, a silicon oxide film is used as a film to be in contact with the semiconductor layer.

In this embodiment, a 50-nm-thick silicon oxynitride film is formed by a sputtering method as the insulating layer 128, and a 550-nm-thick silicon oxide film is formed by a sputtering method as the insulating layer 130.

A semiconductor film is formed over the insulating layer 130 planarized sufficiently by the CMP treatment. In this embodiment, a crystalline oxide semiconductor film is formed as the semiconductor film by a sputtering method using an In—Ga—Zn—O-based oxide target so as to include a region containing excess oxygen as compared to the stoichiometric composition ratio of the oxide semiconductor in a crystalline state.

Next, the crystalline oxide semiconductor film is selectively etched to form an island-shaped crystalline oxide semiconductor film. Oxygen is added into the crystalline oxide semiconductor film, whereby an amorphous oxide semiconductor film is obtained. Over the amorphous oxide semiconductor film, a gate insulating layer 146, a gate electrode layer 148, and sidewall insulating layers 136a and 136b are formed.

As the gate insulating layer 146, a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a gallium oxide film can be formed by a plasma enhanced CVD method, a sputtering method, or the like.

The gate electrode layer 148 can be formed by forming a conductive layer over the gate insulating layer 146 and selectively etching the conductive layer.

Then, a conductive layer is formed over the gate electrode 110, the insulating layer 128, the insulating layer 130, and the like and is selectively etched, whereby a source and drain electrodes 142a and 142b are formed.

The conductive layer can be formed by a PVD method such as a sputtering method, a CVD method such as a plasma enhanced CVD method. Further, as a material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may also be used.

The conductive layer has either a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. In the case where the conductive layer has a single-layer structure of a titanium film or a titanium nitride film, there is an advantage of high processability of the conductive layer into the source and drain electrodes 142a and 142b to provide tapered shapes.

Next, an insulating layer 150 including an aluminum oxide film is formed over the amorphous oxide semiconductor film, the gate insulating layer 146, the gate electrode layer 148, and the sidewall insulating layers 136a and 136b. In the case where the insulating layer 150 has a stacked-layer structure, a stack of the aluminum oxide film and a silicon oxide film, a silicon nitride film, a silicon oxynitride film, a silicon nitride oxide film, an aluminum nitride film, an aluminum oxynitride film, an aluminum nitride oxide film, a hafnium oxide film, or a gallium oxide film may be formed by a plasma enhanced CVD method, a sputtering method, or the like.

Next, heat treatment is performed on the amorphous oxide semiconductor film to amorphize at least part of the amorphous oxide semiconductor film, so that a crystalline oxide semiconductor film 144 including a crystal having a c-axis which is substantially perpendicular to a top surface of the crystalline oxide semiconductor film 144 is formed.

The aluminum oxide film provided as the insulating layer 150 over the oxide semiconductor film has a high shielding effect (blocking effect) of blocking penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

Since the heat treatment for crystallizing the amorphous oxide semiconductor film is performed in the state where the amorphous oxide semiconductor film is covered with the aluminum oxide film provided as the insulating layer 150, oxygen can be prevented from being released from the amorphous oxide semiconductor film by the heat treatment. Thus, the resulting crystalline oxide semiconductor film 144 can maintain the amount of oxygen contained in the amorphous oxide semiconductor film, and therefore has a region where the amount of oxygen is excess as compared to the stoichiometric oxide semiconductor in a crystalline state.

Therefore, the crystalline oxide semiconductor film 144 has high purity because impurities such as hydrogen and moisture do not enter the crystalline oxide semiconductor film 144, and has the region where the amount of oxygen is excess as compared to the stoichiometric oxide semiconductor in a crystalline state because oxygen is prevented from being released therefrom. Accordingly, the crystalline oxide semiconductor film 144 enables a variation in the threshold voltage $V_{th}$ of the transistor 162 and a shift of the threshold voltage ($\Delta V_{th}$) due to an oxygen vacancy to be reduced.

The heat treatment for crystallizing at least part of the amorphous oxide semiconductor film is performed at a temperature(s) higher than or equal to 250° C. and lower than or equal to 700° C., preferably higher than or equal to 400° C., further preferably higher than or equal to 500° C., still further preferably higher than or equal to 550° C.

Over the insulating layer 150, an electrode layer 153 is formed in a region which overlaps with the source or drain electrode 142a.

Next, an insulating layer 152 is formed over the transistor 162 and the insulating layer 150. The insulating layer 152 can be formed by a sputtering method, a CVD method, or the like. The insulating layer 152 can be formed using a material including an inorganic insulating material such as silicon oxide, silicon oxynitride, silicon nitride, hafnium oxide, or aluminum oxide.

Next, an opening that reaches the source or drain electrode 142b is formed in the gate insulating layer 146, the insulating layer 150, and the insulating layer 152. The opening is formed by selective etching using a mask or the like.

After that, a wiring 156 is formed in the opening to be in contact with the source or drain electrode 142b. The connection point of the source or drain electrode 142b and the wiring 156 is not shown in FIG. 19A.

The wiring 156 is formed in such a manner that a conductive layer is formed by a PVD method such as a sputtering method or a CVD method such as a plasma enhanced CVD method and then is etched. Further, as a material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may also be used. The details are the same as those of the source or drain electrode 142a.

Through the above steps, the transistor 162 and the capacitor 164 are formed. The transistor 162 includes the highly purified crystalline oxide semiconductor film 144 containing excess oxygen which repairs an oxygen vacancy. Therefore, change in the electric characteristics of the transistor 162 is suppressed, and the transistor 162 is electrically stable. The capacitor 164 includes the source or drain electrode 142a, the crystalline oxide semiconductor film 144, the gate insulating layer 146, and the electrode layer 153.

The crystalline oxide semiconductor film 144 and the gate insulating layer 146 are stacked in the capacitor 164 in FIG. 19A, whereby the insulation between the source or drain electrode 142a and the electrode layer 153 can be sufficiently provided. It is needless to say that the crystalline oxide semiconductor film 144 can be omitted in the capacitor 164 in order to provide sufficient capacitance. An insulating layer may be included in the capacitor 164. The capacitor 164 can be omitted in the case where a capacitor is not needed.

FIG. 19C illustrates an example of a circuit diagram of the semiconductor device when used as a memory element. In FIG. 19C, one of a source electrode and a drain electrode of the transistor 162, one electrode of the capacitor 164, and a gate electrode of the transistor 140 are electrically connected to one another. A first wiring (1st Line, also referred to as a source line) is electrically connected to a source electrode of the transistor 140, and a second wiring (2nd Line, also referred to as a bit line) is electrically connected to a drain electrode of the transistor 140. Further, a third wiring (3rd Line, also referred to as a first signal line) is electrically connected to the other of the source electrode and the drain electrode of the transistor 162, and a fourth wiring (4th Line, also referred to as a second signal line) is electrically connected to a gate electrode of the transistor 162. A fifth wiring (5th line, also referred to as a word line) is electrically connected to the other electrode of the capacitor 164.

The transistor 162 using an oxide semiconductor has extremely small off-state current; therefore, when the transistor 162 is in an off state, the potential of a node (hereinafter, a node FG) where the one of the source electrode and drain electrode of the transistor 162, the one electrode of the capacitor 164, and the gate electrode of the transistor 140 are electrically connected to one another can be retained for an extremely long time. The capacitor 164 facilitates retention of electric charge given to the node FG and reading of the data.

When data is stored in the semiconductor device (in data writing), the potential of the fourth wiring is set to a potential at which the transistor 162 is turned on, whereby the transistor 162 is turned on. Thus, the potential of the third wiring is applied to the node FG and a predetermined amount of electric charge is accumulated in the node FG Here, electric charge for applying either two different potential levels (hereinafter referred to as low-level charge and high-level charge) is given to the node FG. After that, the potential of the fourth wiring is changed to a potential at which the transistor 162 is turned off, whereby the transistor 162 is turned off. Consequently, the node FG is made into a floating state to retain the predetermined amount of electric charge in the node FG In this manner, the predetermined amount of charge is accumulated and retained in the node FG, whereby data can be stored in the memory cell.

Since the off-state current of the transistor 162 is extremely small, the charge supplied to the node FG is retained for a long period. Accordingly, a refresh operation can be omitted or the frequency of the refresh operation can be drastically reduced, which leads to a sufficient reduction in power consumption. Further, stored data can be retained for a long time even with no power supply.

When stored data is read out (in data reading), while a certain potential (a fixed potential) is applied to the first wiring, an appropriate potential (a read-out potential) is applied to the fifth wiring, whereby the transistor 140 changes its state depending on the amount of charge retained in the node FG This is because in general, when the transistor 140 is an n-channel transistor, an apparent threshold value $V_{th\_H}$ of the transistor 140 in the case where the high-level charge is retained in the node FG is lower than an apparent threshold value $V_{th\_L}$ of the transistor 140 in the case where the low-level charge is retained in the node FG Here, each apparent threshold voltage refers to the potential of the fifth wiring, which is needed to turn on the transistor 140. Thus, by setting the potential of the fifth wiring to a potential $V_0$ which is between $V_{th\_H}$ and $V_{th\_L}$, electric charge retained in the node FG can be determined. For example, in the case where the high-level electric charge is given in data writing, the transistor 140 is turned on when the potential of the fifth wiring is $V_0$ ($>V_{th\_H}$). In contrast, in the case where the low-level electric charge is given in data writing, the transistor 140 remains in its off state even when the potential of the fifth wiring is $V_0$ ($<V_{th\_L}$). In this manner, the potential of the fifth wiring is controlled and whether the transistor 140 is in the on state or the off state (the potential of the second wiring) is read out, whereby stored data can be read out.

Further, when stored data is rewritten, a new potential is applied to the node FG that retains the predetermined amount of charge given in the above writing, so that the charge of the new data is retained in the node FG. Specifically, the potential of the fourth wiring is set to the potential at which the transistor 162 is turned on, whereby the transistor 162 is turned on. The potential of the third wiring (the potential of new data) is consequently applied to the node FG, and the predetermined amount of charge is accumulated in the node FG. After that, the potential of the fourth wiring is changed to the potential at which the transistor 162 is turned off, whereby the transistor 162 is turned off, so that the charge of the new data is retained in the node FG In other words, on the state where the predetermined amount of charge given in the first writing is retained in the node FG, an operation (a second writing) similar to the first writing is performed, whereby the stored data can be overwritten.

The off-state current of the transistor 162 described in this embodiment can be sufficiently reduced by using the highly purified oxide semiconductor film containing excess oxygen as the crystalline oxide semiconductor film 144. Further, with such a transistor, a semiconductor device in which stored data can be retained for an extremely long time can be provided.

As described above, a transistor which includes a highly purified crystalline oxide semiconductor film containing excess oxygen which repairs an oxygen vacancy has less change in electric characteristics and is electrically stable. Thus, with the transistor, a highly reliable semiconductor device can be provided.

The structures, methods, and the like described in this embodiment can be used in appropriate combination with any of the structures, methods, and the like described in the other embodiments.

(Embodiment 11)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of an electronic device including the semiconductor device described in the above embodiment are described below.

Figure 23A:
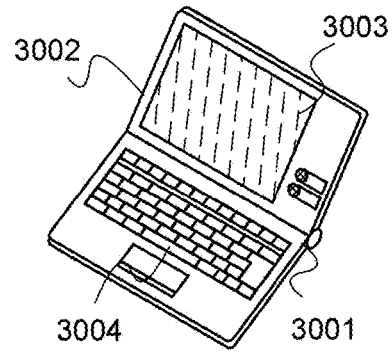
FIGS. 23A to 23F illustrate electronic devices.

FIG. 23A illustrates a laptop personal computer, which includes a main body 3001, a housing 3002, a display portion 3003, a keyboard 3004, and the like. Application of the semiconductor device described in any of Embodiments 1 to 10 to the display portion 3003 enables a highly reliable laptop personal computer to be provided.

Figure 23B:
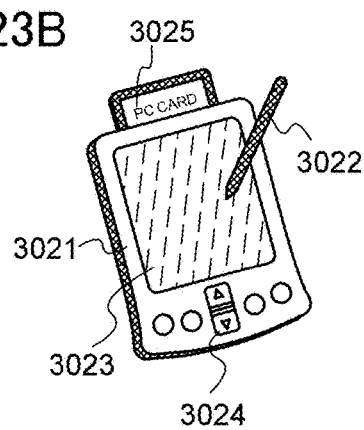

FIG. 23B is a personal digital assistant (PDA), which includes a main body 3021 provided with a display portion 3023, an external interface 3025, operation buttons 3024, and the like. A stylus 3022 is included as an accessory for operation. Application of the semiconductor device described in any of Embodiments 1 to 10 to the display portion 3023 enables a highly reliable personal digital assistant (PDA) to be provided.

Figure 23C:
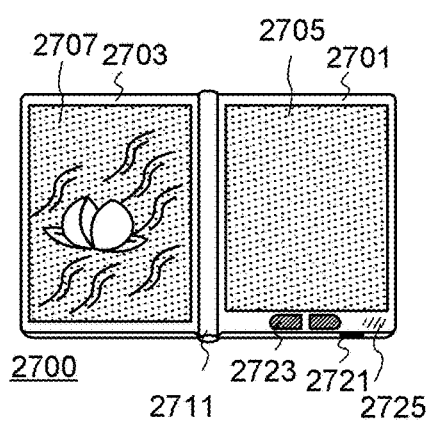

FIG. 23C illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. One screen image or different screen images may be displayed on the display portion 2705 and the display portion 2707. In the structure where different screen images are displayed on the display portion 2705 and the display portion 2707, for example, text can be displayed on the right display portion (the display portion 2705 in FIG. 23C) and images can be displayed on the left display portion (the display portion 2707 in FIG. 23C). By applying the semiconductor device described in any of Embodiments 1 to 10 to the display portion 2705, 2707, the e-book reader 2700 with high reliability can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 23C illustrates an example in which the housing 2701 is provided with an operation portion and the like. For example, the housing 2701 is provided with a power switch 2721, an operation key 2723, a speaker 2725, and the like. With the operation key 2723, pages can be turned. A keyboard, a pointing device, or the like may also be provided on the same plane of the housing, as the display portion. Furthermore, an external connection terminal (an earphone terminal, a USB terminal, or the like), a recording medium insertion portion, and the like may be provided on the back surface or the side surface of the housing. The e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 23D:
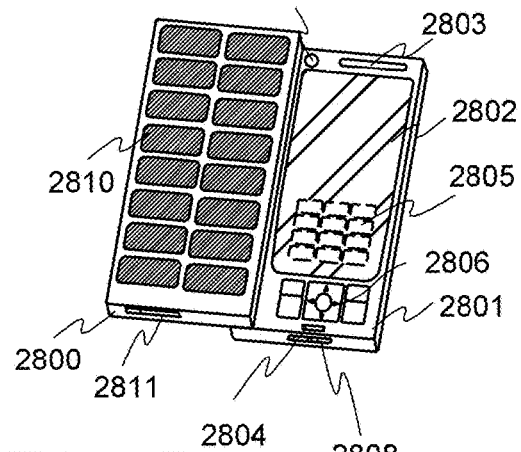

FIG. 23D illustrates a mobile phone, which includes two housings, a housing 2800 and a housing 2801. The housing 2801 is provided with a display panel 2802, a speaker 2803, a microphone 2804, a pointing device 2806, a camera lens 2807, an external connection terminal 2808, and the like. The housing 2800 is provided with a solar cell 2810 for charging the mobile phone, an external memory slot 2811, and the like. Further, an antenna is incorporated in the housing 2801. Application of the semiconductor device described in any of Embodiments 1 to 10 to the display panel 2802 enables a highly reliable mobile phone to be provided.

Further, the display panel 2802 is provided with a touch panel. A plurality of operation keys 2805 which are displayed as images are shown by dashed lines in FIG. 23D. A boosting circuit by which a voltage output from the solar cell 2810 is increased to be sufficiently high for each circuit is also equipped.

In the display panel 2802, the display direction can be appropriately changed depending on a usage pattern. Further, the display device is provided with the camera lens 2807 on the same plane as the display panel 2802, which enables videophone calls. The speaker 2803 and the microphone 2804 can be used for videophone calls, recording and playing sound, and the like as well as voice calls. Further, the housings 2800 and 2801 in a state where they are developed as illustrated in FIG. 23D can shift by sliding to a state where one is overlapped with the other; therefore, the size of the mobile phone can be reduced, which makes the mobile phone suitable for being carried.

The external connection terminal 2808 can be connected to an AC adapter and various types of cables such as a USB cable, which enables charging and data communication with a personal computer. Further, a large amount of data can be stored and carried by a storage medium inserted into the external memory slot 2811.

In addition to the above functions, an infrared communication function, a television reception function, or the like may be equipped.

Figure 23E:
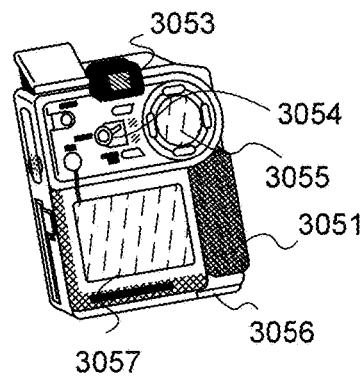

FIG. 23E illustrates a digital video camera which includes a main body 3051, a display portion A 3057, an eyepiece 3053, an operation switch 3054, a display portion B 3055, a battery 3056, and the like. Application of the semiconductor device described in any of Embodiments 1 to 10 to the display portion A 3057 and/or the display portion B 3055 enables a highly reliable digital video camera to be provided.

Figure 23F:
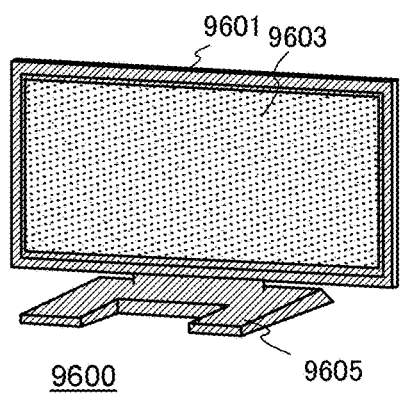

FIG. 23F illustrates an example of a television set. In a television set 9600, a display portion 9603 is incorporated in a housing 9601. Images can be displayed on the display portion 9603. Here, the housing 9601 is supported by a stand 9605. Application of the semiconductor device described in any of Embodiments 1 to 10 to the display portion 9603 enables the reliability of the television set 9600 to be increased.

The television set 9600 can be operated by an operation switch of the housing 9601 or a separate remote controller. Further, the remote controller may be provided with a display portion for displaying data output from the remote controller.

The television set 9600 is provided with a receiver, a modem, and the like. With use of the receiver, general television broadcasting can be received. Moreover, the display device can be connected to a communication network with or without wires via the modem, whereby one-way (from sender to receiver) or two-way (between sender and receiver or between receivers) data communication can be performed.

This embodiment can be implemented combining with any structure described in the other embodiments as appropriate.

EXAMPLE 1

In this example, properties of an aluminum oxide film in terms of a barrier film in a semiconductor device according to one embodiment of the present invention were evaluated. As the evaluation method, secondary ion mass spectrometry (SIMS) and thermal desorption spectrometry (TDS) were used.

First, results of evaluation on oxygen diffusion in an aluminum oxide film (Example Sample B) according to SIMS are shown. For comparison, oxygen diffusion in a silicon oxide film (Comparison Example Sample B) and in an In—Ga—Zn—O film (Comparison Example Sample C) was also evaluated.

In each of Example Sample B, Comparison Example Sample B, and Comparison Example Sample C, a 300-nm-thick silicon oxide film ($^{18}$O) was formed using oxygen ($^{18}$O) over a silicon substrate by a sputtering method. In this example, in order to discriminate oxygen which is diffused from the outside to each sample film after formation of the sample film from oxygen ($^{16}$O) that is a component of the sample film, the silicon oxide film ($^{18}$O) using oxygen ($^{18}$O) that is an isotope of oxygen ($^{16}$O) that is a component of the sample film, was provided in contact with each sample film as a diffusion source of oxygen ($^{18}$O).

The deposition conditions of the silicon oxide film ($^{18}$O) were as follows: a silicon oxide (SiO$_2$) target; a distance between glass substrate and target of 60 mm; a pressure of 0.4 Pa; a power of 1.5 kW; an atmosphere of argon and oxygen ($^{18}$O) (argon:oxygen ($^{18}$O)=25 sccm:25 sccm (flow rate)); a substrate temperature of 100° C. The silicon oxide film is formed using oxygen ($^{18}$O) and thus referred to as the silicon oxide film ($^{18}$O).

In Example Sample B, a 500-nm-thick aluminum oxide film was formed over the silicon oxide film ($^{18}$O) by a sputtering method. The deposition conditions of the aluminum oxide film were as follows: an aluminum oxide (Al$_2$O$_3$) target; a distance between silicon substrate and target of 60 mm; a pressure of 0.4 Pa; a power of 1.5 kW; an atmosphere of argon and oxygen (argon:oxygen=25 sccm:25 sccm (flow rate)); a substrate temperature of 250° C.

In Comparison Example Sample B, a 100-nm-thick silicon oxide film ($^{16}$O) was formed using oxygen ($^{16}$O) over the silicon oxide film ($^{18}$O) by a sputtering method. The deposition conditions of the silicon oxide film ($^{16}$O) were as follows: a silicon oxide (SiO$_2$) target; a distance between silicon substrate and target of 60 mm; a pressure of 0.4 Pa; a power of 1.5 kW; an atmosphere of argon and oxygen ($^{16}$O) (argon:oxygen ($^{16}$O)=25 sccm:25 sccm (flow rate)); a substrate temperature of 100° C. The silicon oxide film is formed using oxygen ($^{16}$O) and thus referred to as the silicon oxide film ($^{16}$O).

In Comparison Example Sample C, a 100-nm-thick In—Ga—Zn—O film was formed over the silicon oxide film ($^{18}$O) by a sputtering method. The deposition conditions of the In—Ga—Zn—O film were as follows: an oxide target whose composition ratio is In$_2$O$_3$:Ga$_2$O$_3$:ZnO=1:1:2 (molar ratio); a distance between silicon substrate and target of 60 mm; a pressure of 0.4 Pa; a direct-current (DC) power of 0.5 kW; an atmosphere of argon and oxygen (argon:oxygen=30 sccm:15 sccm (flow rate)); a substrate temperature of 200° C. It is preferable that argon and oxygen used for deposition of the oxide semiconductor film do not contain water, hydrogen, and the like. For example, it is preferable that the purity of argon is 9N and the dew point of argon is −121° C. or lower (the concentration of water: 0.1 ppb or less, the concentration of hydrogen: 0.5 ppb or less), and that the purity of oxygen is 8N and the dew point of oxygen is −112° C. or lower (the concentration of water: 1 ppb or less, the concentration of hydrogen: 1 ppb or less).

Heat treatment was performed on Example Sample B, Comparison Example Sample B, and Comparison Example Sample C at temperatures in the range from 150° C. to 800° C. The heat treatment was performed in a nitrogen atmosphere under atmospheric pressure for 1 hour.

The concentration of oxygen ($^{18}$O) was measured with SIMS on Example Sample B, Comparison Example Sample B, and Comparison Example Sample C without heat treatment and after being subjected to the heat treatment.

Figure 9:
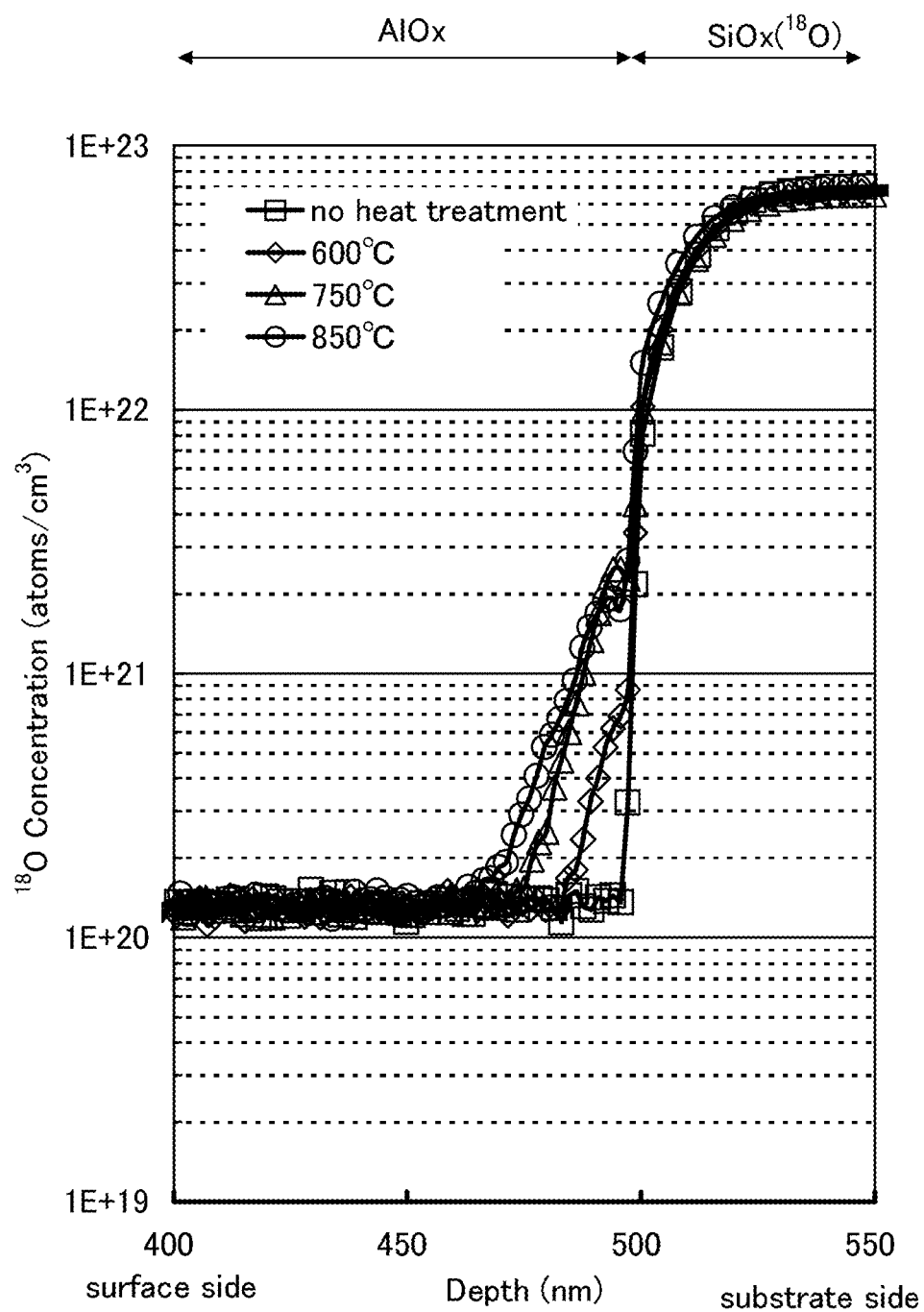
FIG. 9 shows SIMS measurement results of Example Sample B.

FIG. 9 shows profiles of the oxygen ($^{18}$O) concentration in Example Sample B without heat treatment and after being subjected to the heat treatment at 600° C., 750° C., and 850° C.

Figure 11:
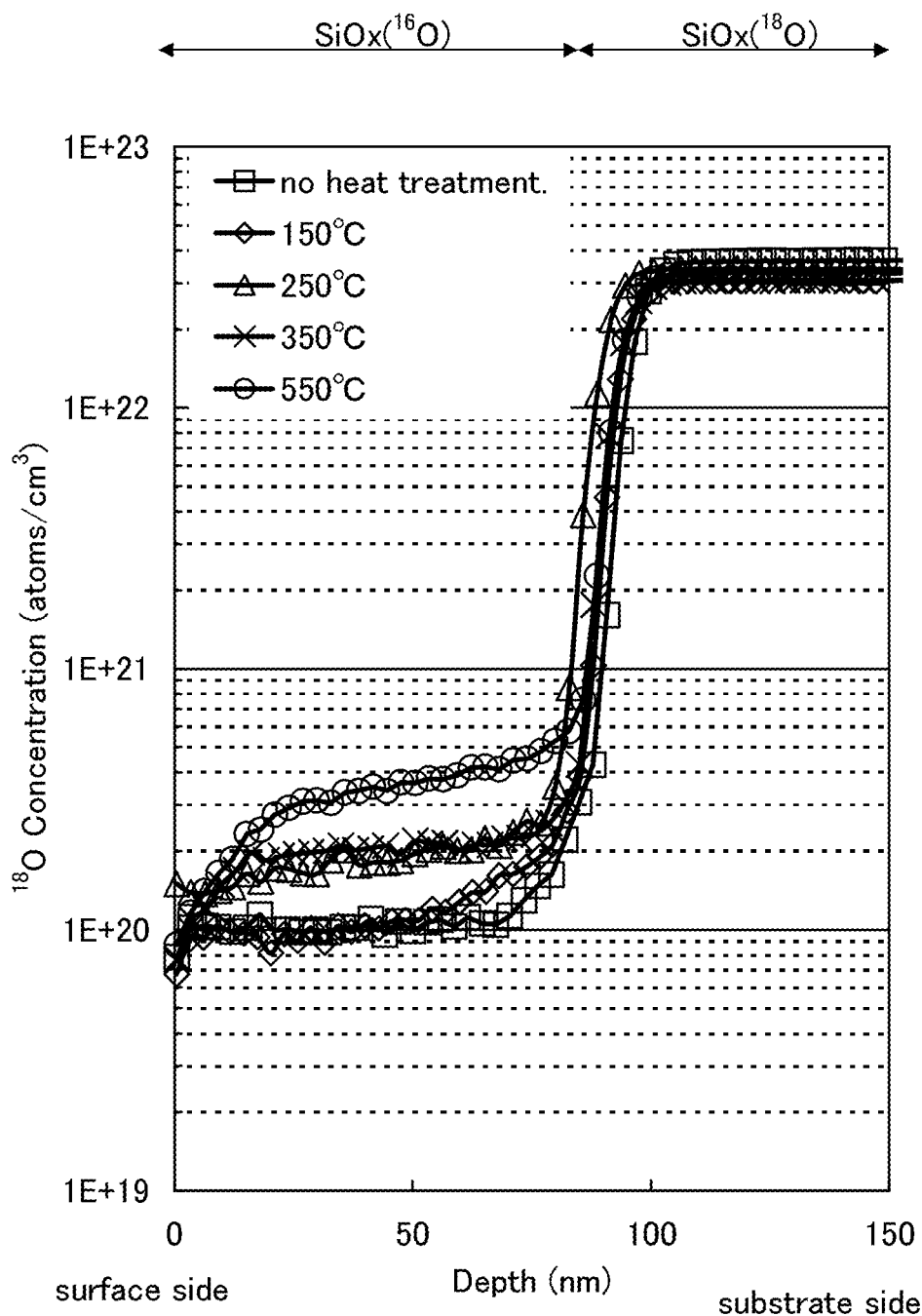
FIG. 11 shows SIMS measurement results of Comparison Example Sample C.

FIG. 11 shows profiles of the oxygen ($^{18}$O) concentration in Comparison Example Sample B without heat treatment and after being subjected to the heat treatment at 150° C., 250° C., 350° C., and 550° C.

Figure 10:
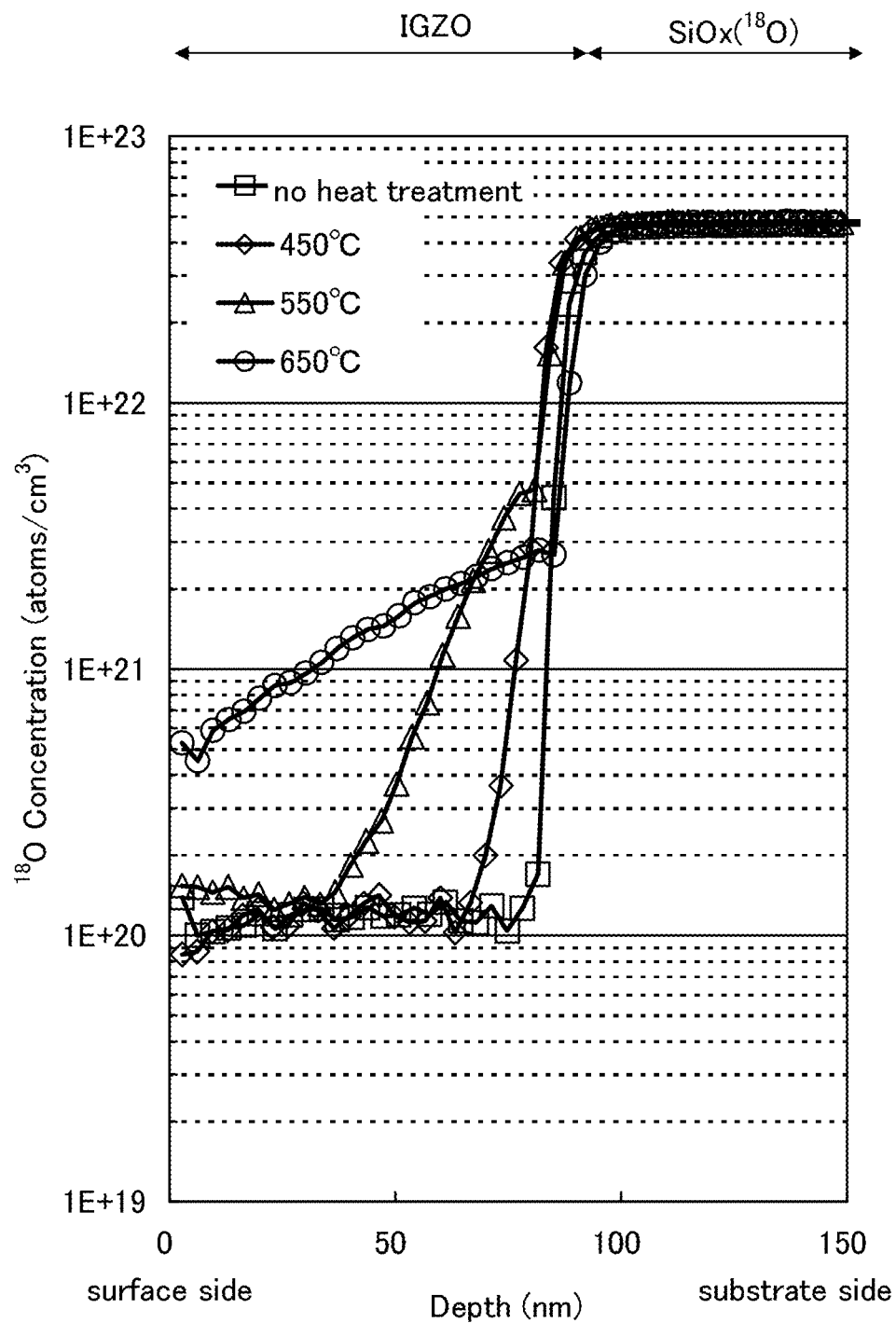
FIG. 10 shows SIMS measurement results of Comparison Example Sample B.

FIG. 10 shows profiles of the oxygen ($^{18}$O) concentration in Comparison Example Sample C without heat treatment and after being subjected to the heat treatment at 450° C., 550° C., and 650° C. Such a concentration profile shown in FIGS. 9 to 11 indicates the diffusion state of oxygen ($^{18}$O) in the film and thus is also called a diffusion profile.

It is found from FIG. 9 that the diffusion distance of oxygen ($^{18}$O) in the aluminum oxide film is about several tens of nanometers even in the sample after being subjected to the heat treatment at 850° C. for 1 hour and thus the diffusion is very slow and suppressed. On the other hand, as shown in FIG. 11, in the silicon oxide film ($^{16}$O), the concentration of oxygen ($^{18}$O) was increased even by the heat treatment at 250° C. and oxygen ($^{18}$O) was observed to be diffused widely. Likewise, in the In—Ga—Zn—O film in FIG. 10, the concentration of oxygen ($^{18}$O) was increased by the heat treatment at 450° C. and oxygen ($^{18}$O) was observed to be diffused widely. In both of the silicon oxide film ($^{16}$O) of Comparison Example Sample B in FIG. 11 and the In—Ga—Zn—O film of Comparison Example Sample C in FIG. 10, as the temperature of the heat treatment is higher, the amount of diffusion and the diffusion region of oxygen ($^{18}$O) from the silicon oxide film ($^{18}$O) are larger.

From the above-described results, it was confirmed that the aluminum oxide film can suppress (block) diffusion of oxygen into the film even in the case where a high temperature treatment at 850° C. is performed thereon, and has a high barrier property against oxygen.

Next, results of evaluation on the barrier property of an aluminum oxide film against oxygen according to TDS are shown.

Example Sample A was formed as follows: a 300-nm-thick silicon oxide film was formed over a glass substrate by a sputtering method, a 100-nm-thick In—Ga—Zn—O film was formed over the silicon oxide film by a sputtering method, and a 100-nm-thick aluminum oxide film was formed over the In—Ga—Zn—O film by a sputtering method.

Further, for comparison, Comparison Example Sample A was formed as follows: a 300-nm-thick silicon oxide film was formed over a glass substrate by a sputtering method, and a 100-nm-thick In—Ga—Zn—O film was formed over the silicon oxide film by a sputtering method.

In each of Example Sample A and Comparison Example Sample A, the silicon oxide film and the In—Ga—Zn—O film were consecutively deposited without air exposure, and then, heat treatment was performed thereon under reduced pressure at 400° C. for 30 minutes.

In each of Example Sample A and Comparison Example Sample A, the deposition conditions of the silicon oxide film were as follows: a silicon oxide ($SiO_2$) target; a distance between glass substrate and target of 60 mm; a pressure of 0.4 Pa; an RF power of 1.5 kW; an atmosphere of argon and oxygen (argon:oxygen=25 sccm:25 sccm (flow rate)); a substrate temperature of 100° C.

In each of Example Sample A and Comparison Example Sample A, the deposition conditions of the In—Ga—Zn—O film were as follows: an oxide target whose composition ratio is $In_2O_3:Ga_2O_3:ZnO=1:1:2$ (molar ratio); a distance between glass substrate and target of 60 mm; a pressure of 0.4 Pa; a direct-current (DC) power of 0.5 kW; an atmosphere of argon and oxygen (argon:oxygen=30 sccm:15 sccm (flow rate)); a substrate temperature of 250° C.

In Example Sample A, the deposition conditions of the aluminum oxide film were as follows: an aluminum oxide ($Al_2O_3$) target; a distance between glass substrate and target of 60 mm; a pressure of 0.4 Pa; an RF power of 2.5 kW; an atmosphere of argon and oxygen (argon:oxygen=25 sccm:25 sccm (flow rate)); a substrate temperature of 250° C.

Further, Example Sample A2 and Comparison Example Sample A2 were formed by adding oxygen into the In—Ga—Zn—O films of Example Sample A and Comparison Example Sample A, respectively. Note that Example Sample A and Comparison Example Sample A into which no oxygen was added are referred to as Example Sample A1 and Comparison Example Sample A1.

In Example Sample A2, an oxygen ($^{18}O$) ion was added into the In—Ga—Zn—O film through the aluminum oxide film by an ion implantation method. The conditions of the oxygen ($^{18}O$) ion implantation were as follows: an acceleration voltage of 80 kV and a dosage of $5.0 \times 10^{16}$ ions/cm$^2$.

In Comparison Example Sample A2, an oxygen ($^{18}O$) ion was directly added into the In—Ga—Zn—O film by an ion implantation method. The conditions of the oxygen ($^{18}O$) ion implantation were as follows: an acceleration voltage of 40 kV and a dosage of $5.0 \times 10^{16}$ ions/cm$^2$.

In this example, in order to discriminate oxygen which is added from the outside into each sample film after formation of the sample film from oxygen ($^{16}O$) that is a component of the sample film, oxygen ($^{18}O$), that is an isotope of oxygen ($^{16}O$) that is a component of the sample film, was used to add into the sample film.

Example Sample A1, Example Sample A2, Comparison Example Sample A1, and Comparison Example Sample A2 were analyzed by TDS (thermal desorption spectrometry). The TDS spectrum of M/z of 36 ($^{18}O_2$) in Comparison Example Sample A1 (bold line) and the same in Comparison Example Sample A2 (thin line) are shown in FIG. 12A, and the TDS spectrum of M/z of 36 ($^{18}O_2$) in Example Sample A1 (bold line) and the same in Example Sample A2 (thin line) are shown in FIG. 12B.

Figure 12A:
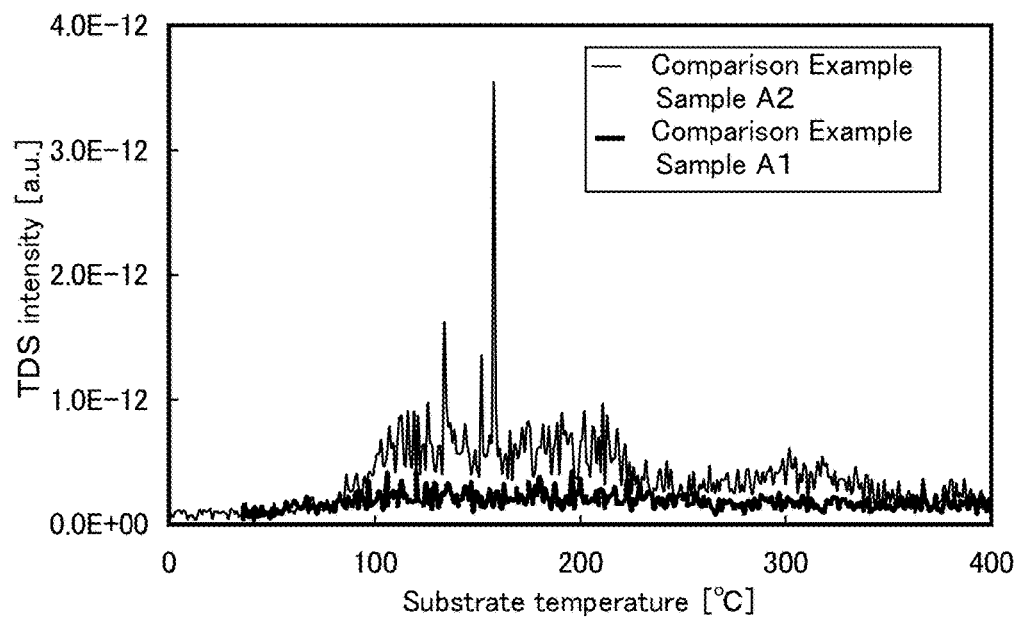
FIG. 12A shows TDS measurement results of Comparison Example Samples A1 and A2.
Figure 12B:
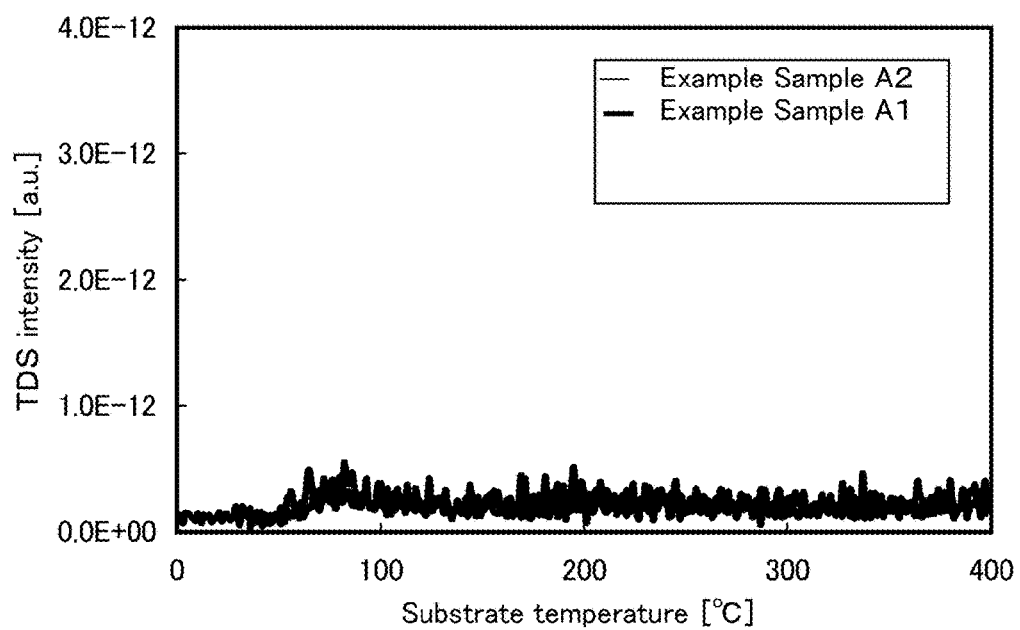
FIG. 12B shows TDS measurement results of Example Samples A1 and A2.

As shown in FIGS. 12A and 12B, a peak was not particularly observed in the TDS spectra of Comparison Example Sample A1 and Example Sample A1 into each of which oxygen ($^{18}O$) was not added. In contrast, in Comparison Example Sample A2 into which oxygen ($^{18}O$) was added, as shown in FIG. 12A, peaks attributed to release of oxygen ($^{18}O$) were detected at temperatures from 100° C. to 200° C. On the other hand, as shown in FIG. 12B, no peak attributed to release of oxygen ($^{18}O$) was observed in Example Sample A2 into which oxygen ($^{18}O$) was added.

From those results, it is found that by heating in TDS measurement, added oxygen ($^{18}O$) is released from the In—Ga—Zn—O film in Comparison Example Sample A2 where the In—Ga—Zn—O film is bare, whereas added oxygen ($^{18}O$) is prevented (blocked) from being released from the In—Ga—Zn—O film in Example Sample A2 where the aluminum oxide film is provided over the In—Ga—Zn—O film. Consequently, it was confirmed that the aluminum oxide film has a high barrier property against oxygen and the high barrier property is kept even when oxygen is added through the aluminum oxide film.

Therefore, in the structure in which an aluminum oxide film is stacked over an oxide semiconductor film, the oxide semiconductor film can be made an oxygen excess state by adding oxygen into the oxide semiconductor film through the aluminum oxide film, and the oxygen excess state can be kept even when heat treatment is performed thereon because the aluminum oxide film behaves as a barrier film against oxygen.

Accordingly, the oxygen-excess oxide semiconductor film enables a variation in the threshold voltage $V_{th}$ of the transistor and a shift of the threshold voltage ($\Delta V_{th}$) due to an oxygen vacancy to be reduced.

EXAMPLE 2

In this example, the crystalline state of an oxide semiconductor film was observed. Further, diffusion of oxygen in the oxide semiconductor film was evaluated by SIMS.

Example Sample D1 was formed as follows: a 300-nm-thick silicon oxide film was formed over a glass substrate by a sputtering method, a 100-nm-thick In—Ga—Zn—O film was formed over the silicon oxide film by a sputtering method, and a 100-nm-thick aluminum oxide film was formed over the In—Ga—Zn—O film by a sputtering method.

In Example Sample D1, the silicon oxide film and the In—Ga—Zn—O film were consecutively deposited without air exposure, and then, heat treatment was performed thereon under reduced pressure at 400° C. for 30 minutes.

Further, Example Sample D2 was formed by adding oxygen into the In—Ga—Zn—O film through the aluminum oxide film of Example Sample D1. In Example Sample D2, an oxygen ($^{18}O$) ion was added into the In—Ga—Zn—O film through the aluminum oxide film by an ion implantation method. The conditions of the oxygen ($^{18}O$) ion implantation were as follows: an acceleration voltage of 80 kV and a dosage of $1.0 \times 10^{16}$ ions/cm$^2$.

Further, Example Sample D3 was formed by performing heat treatment on Example Sample D2 in a nitrogen atmosphere at 650° C. for 1 hour.

For comparison, Comparison Example Sample D1 was formed by performing heat treatment on Example Sample D1 in a nitrogen atmosphere at 650° C. for 1 hour without performing addition of an oxygen ion.

Further, for comparison, Comparison Example Sample D2 was formed as follows: a 300-nm-thick silicon oxide film was formed over a glass substrate by a sputtering method, a 100-nm-thick In—Ga—Zn—O film was formed over the silicon oxide film by a sputtering method, an oxygen ($^{18}$O) ion was added directly into the In—Ga—Zn—O film by an ion implantation method, and heat treatment was performed thereon in a nitrogen atmosphere at 650° C. for 1 hour. The conditions of the oxygen ($^{18}$O) ion implantation were as follows: an acceleration voltage of 40 kV and a dosage of $1.0 \times 10^{16}$ ions/cm$^2$.

In each of Example Samples D1 to D3 and Comparison Example Samples D1 and D2, the deposition conditions of the silicon oxide film were as follows: a silicon oxide (SiO$_2$) target; a distance between glass substrate and target of 60 mm; a pressure of 0.4 Pa; an RF power of 1.5 kW; an atmosphere of argon and oxygen (argon:oxygen=25 sccm:25 sccm (flow rate)); a substrate temperature of 100° C.

In each of Example Samples D1 to D3 and Comparison Example Samples D1 and D2, the deposition conditions of the In—Ga—Zn—O film were as follows: an oxide target whose composition ratio is In$_2$O$_3$:Ga$_2$O$_3$:ZnO=1:1:2 (molar ratio); a distance between glass substrate and target of 60 mm; a pressure of 0.4 Pa; a direct-current (DC) power of 0.5 kW; an atmosphere of argon and oxygen (argon:oxygen=30 sccm:15 sccm (flow rate)); a substrate temperature of 250° C.

In Example Samples D1 to D3, the deposition conditions of the aluminum oxide film were as follows: an aluminum oxide (Al2O3) target; a distance between glass substrate and target of 60 mm; a pressure of 0.4 Pa; an RF power of 2.5 kW; an atmosphere of argon and oxygen (argon:oxygen=25 sccm:25 sccm (flow rate)); a substrate temperature of 250° C.

End planes were cut out from Example Samples D1 to D3 and Comparison Example Samples D1 and D2 obtained through the above-described process, and cross-sectional observation of the In—Ga—Zn—O film were performed thereon with a high resolution transmission electron microscope ("H9000-NAR" manufactured by Hitachi High-Technologies Corporation). TEM images of Example Samples D1, D2, and D3 and Comparison Example Samples D1 and D2 are FIGS. 14A and 14B, FIGS. 15A and 15B, FIGS. 16A and 16B, FIGS. 17A and 17B, and FIGS. 18A and 18B, respectively.

Figure 13A:
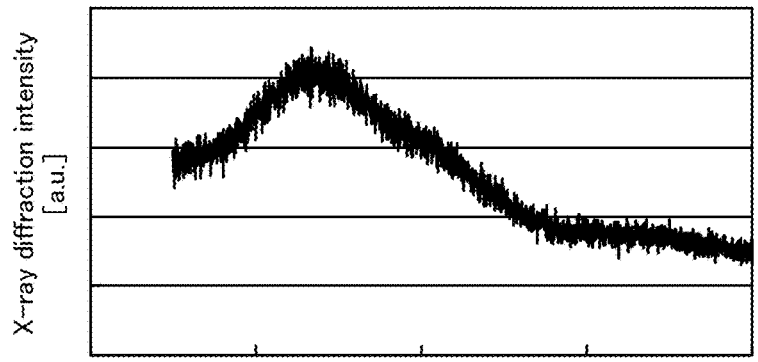
FIG. 13A shows an XRD measurement result of Example Sample D1.
Figure 13B:
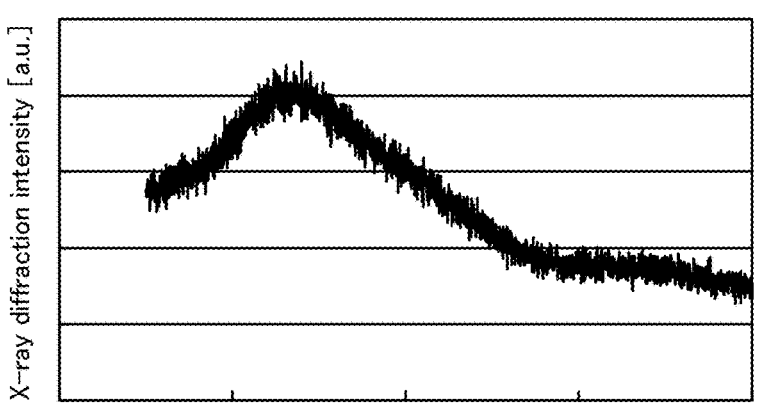
FIG. 13B shows an XRD measurement result of Example Sample D2.
Figure 13C:
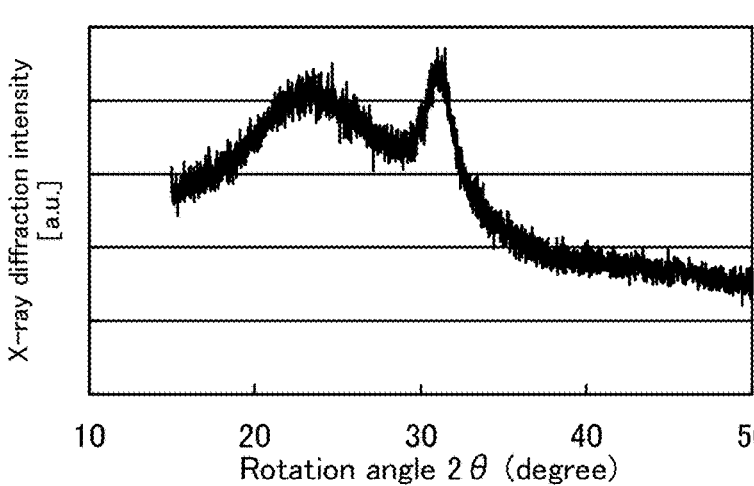
FIG. 13C shows an XRD measurement result of Example Sample D3.

Further, X-ray diffraction (XRD) of the In—Ga—Zn—O film was measured in each of Example Samples D1 to D3. FIGS. 13A, 13B, and 13C are results of the out-of-plane XRD spectrum of Example Samples D1, D2, and D3, respectively. In FIGS. 13A to 13C, the vertical axis indicates the X-ray diffraction intensity (arbitrary unit) and the horizontal axis indicates the rotation angle 2θ (degree). The XRD spectra were measured with an X-ray diffractometer, D8 ADVANCE manufactured by Bruker AXS.

Figure 14A:
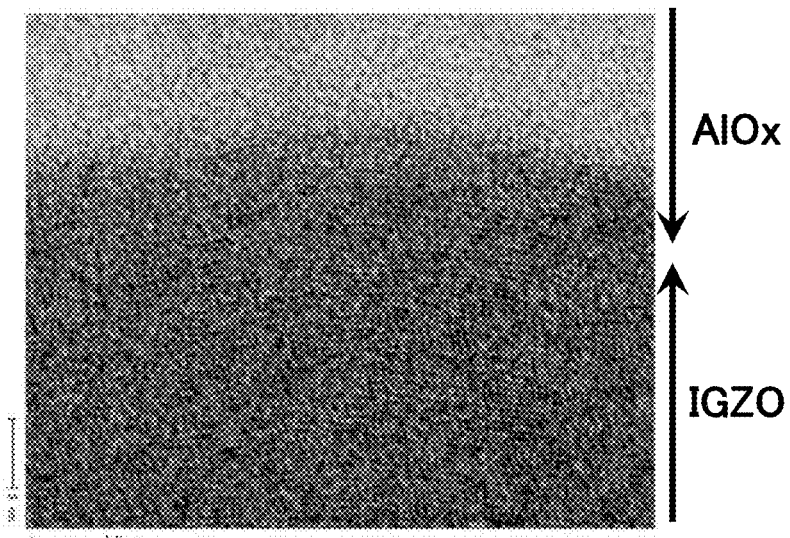
FIGS. 14A and 14B are TEM images of Example Sample D1.
Figure 14B:
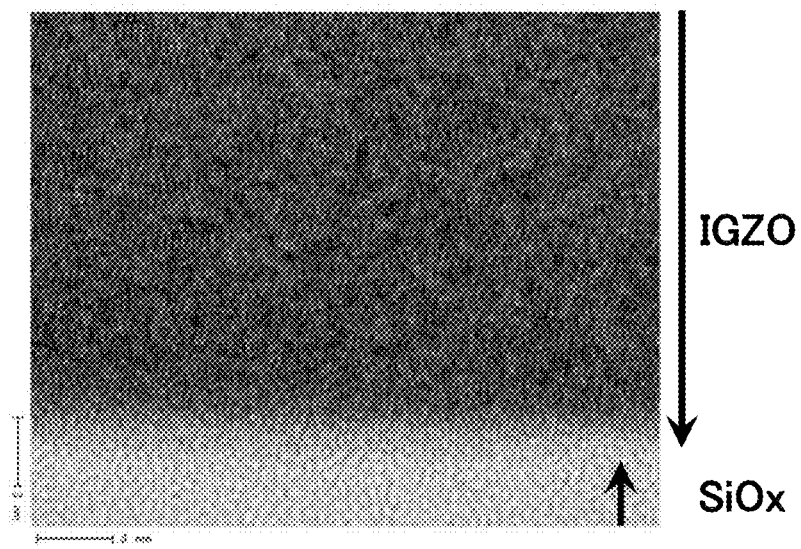

FIG. 14A is a TEM image at 8 million-fold magnification in the interface between the In—Ga—Zn—O film and the aluminum oxide film of Example Sample D1, and FIG. 14B is a TEM image at 8 million-fold magnification in the interface between the silicon oxide film and the In—Ga—Zn—O film of Example Sample D1.

FIG. 13A shows the XRD spectrum of the In—Ga—Zn—O film of Example Sample D1.

In Example Sample D1, although a clear peak showing a crystal was hardly observed in the XRD spectrum as shown in FIG. 13A, an In—Ga—Zn—O film including a crystal having a c-axis substantially perpendicular to the top surface (CAAC-OS) was observed as shown in FIGS. 14A and 14B.

Figure 15A:
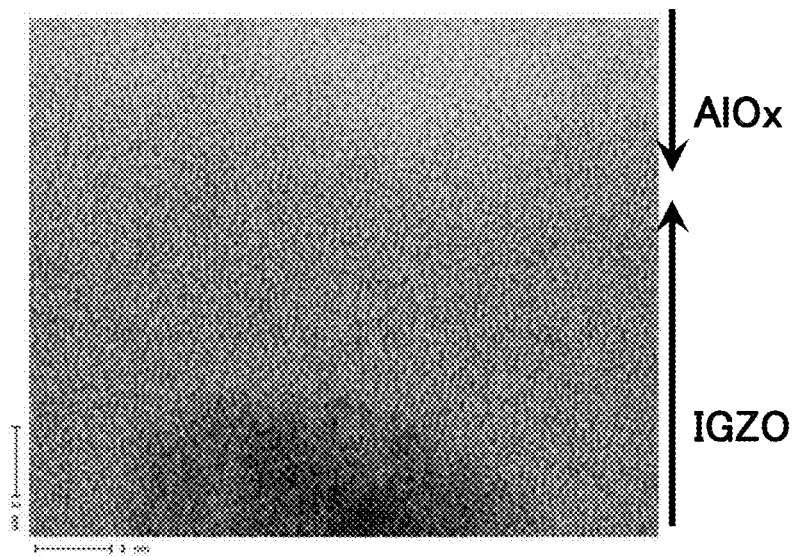
FIGS. 15A and 15B are TEM images of Example Sample D2.
Figure 15B:
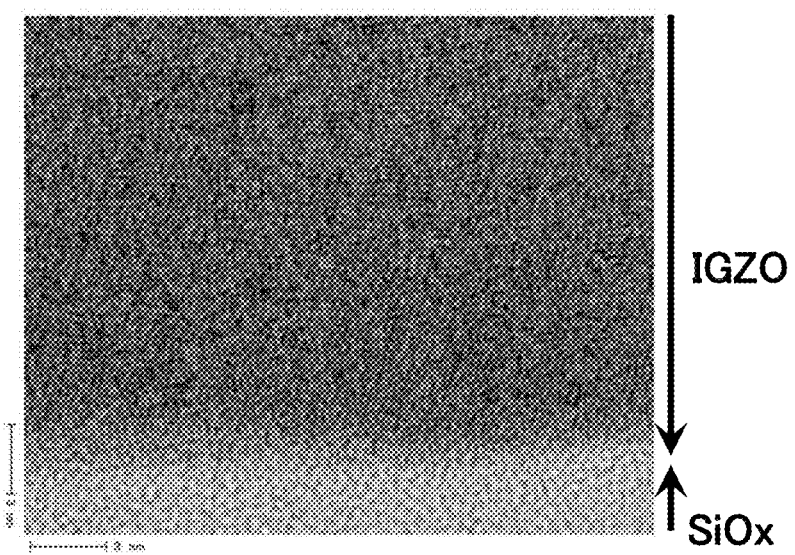

FIG. 15A is a TEM image at 8 million-fold magnification in the interface between the In—Ga—Zn—O film and the aluminum oxide film of Example Sample D2, and FIG. 15B is a TEM image at 8 million-fold magnification in the interface between the silicon oxide film and the In—Ga—Zn—O film of Example Sample D2.

FIG. 13B shows the XRD spectrum of the In—Ga—Zn—O film of Example Sample D2.

In Example Sample D2, a peak showing a crystal was not observed in the XRD spectrum as shown in FIG. 13B, and a crystal having a c-axis substantially perpendicular to the top surface of the In—Ga—Zn—O film was hardly observed in the TEM images as shown in FIGS. 15A and 15B, either. Those results make it clear that the In—Ga—Zn—O film was amorphized by addition of an oxygen ion in Example Sample D2.

Figure 16A:
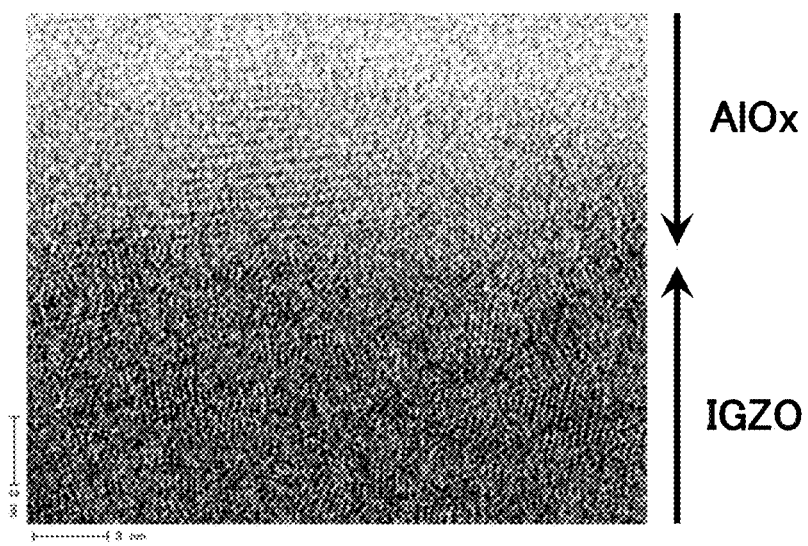
FIGS. 16A and 16B are TEM images of Example Sample D3.
Figure 16B:
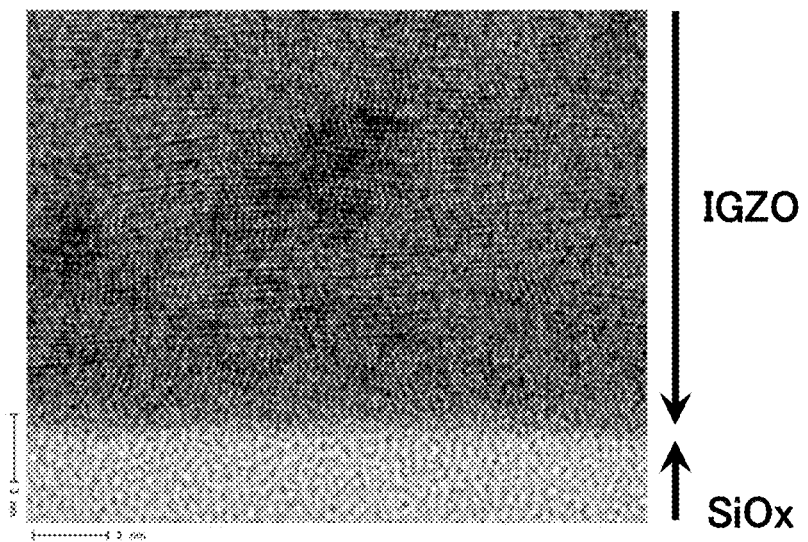

FIG. 16A is a TEM image at 8 million-fold magnification in the interface between the In—Ga—Zn—O film and the aluminum oxide film of Example Sample D3, and FIG. 16B is a TEM image at 8 million-fold magnification in the interface between the silicon oxide film and the In—Ga—Zn—O film of Example Sample D3.

FIG. 13C shows the XRD spectrum of the In—Ga—Zn—O film of Example Sample D3.

In Example Sample D3, a peak attributed to a diffraction on the (009) face of an InGaZnO$_4$ crystal was observed around at 31° (=2θ) in the XRD spectrum as shown in FIG. 13C. Further, as shown in FIGS. 16A and 16B, an In—Ga—Zn—O film including a crystal having a c-axis substantially perpendicular to the top surface (CAAC-OS) was observed. In Example Sample D3, the crystal having a c-axis substantially perpendicular to the top surface was more obvious than that in Example Sample D1, and a stack of layers of the crystalline state of In—Ga—Zn—O was observed both in the vicinity of the interface with the aluminum oxide film and in the vicinity of the interface with the silicon oxide film, showing that CAAC-OS was formed in a wide region in the In—Ga—Zn—O film.

In this manner, it was revealed that even from an In—Ga—Zn—O film amorphized by addition of an oxygen ion like in Example Sample D2, an In—Ga—Zn—O film having higher crystallinity can be formed by recrystallization by heat treatment.

Figure 17A:
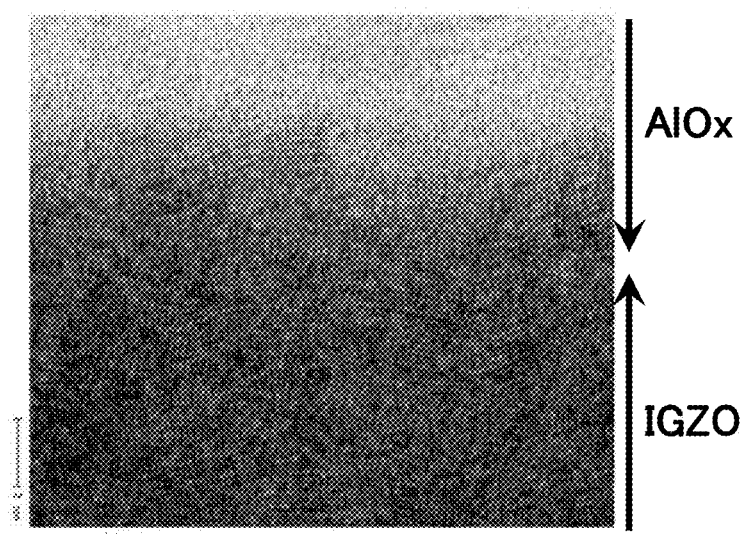
FIGS. 17A and 17B are TEM images of Comparison Example Sample D1.
Figure 17B:
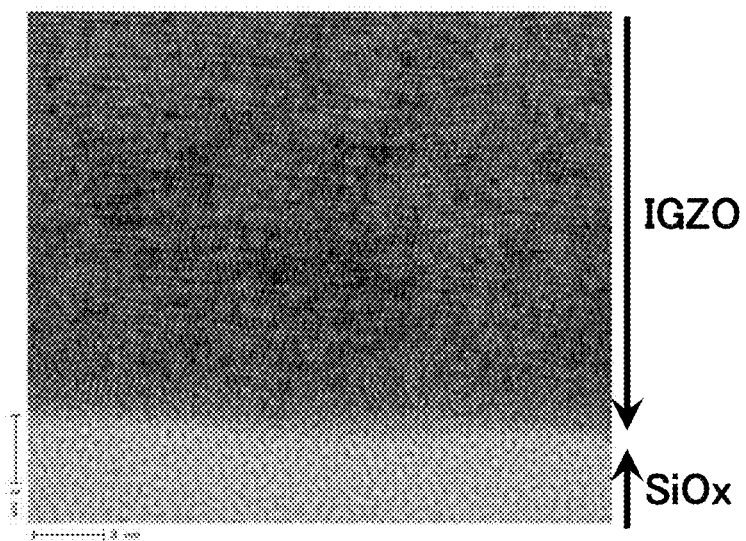

FIG. 17A is a TEM image at 8 million-fold magnification in the interface between the In—Ga—Zn—O film and the aluminum oxide film of Comparison Example Sample D1 where no oxygen ion was added, and FIG. 17B is a TEM image at 8 million-fold magnification in the interface between the silicon oxide film and the In—Ga—Zn—O film of Comparison Example Sample D1. In Comparison Example Sample D1, as shown in FIGS. 17A and 17B, although an In—Ga—Zn—O film including a crystal having a c-axis substantially perpendicular to the top surface (CAAC-OS) was observed, the formation region of CAAC-OS was narrower and a clear crystal was less observed than in Example Sample D3, showing that the crystallinity is lower.

Figure 18A:
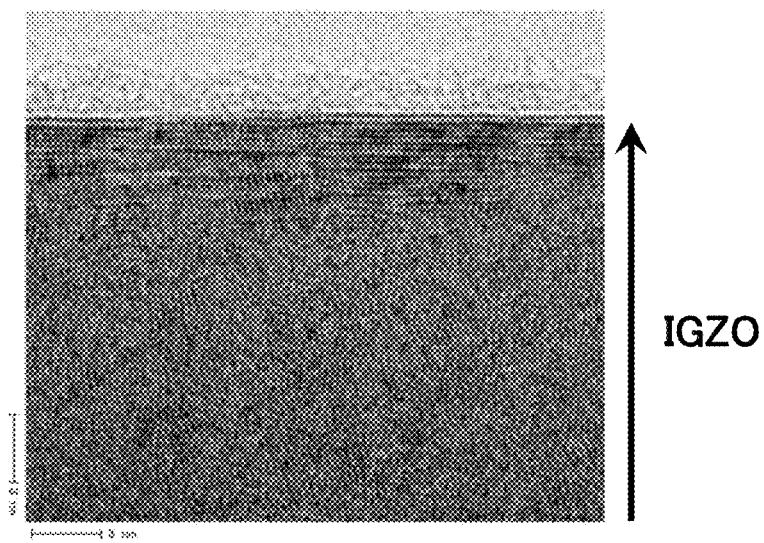
FIGS. 18A and 18B are TEM images of Comparison Example Sample D2.
Figure 18B:
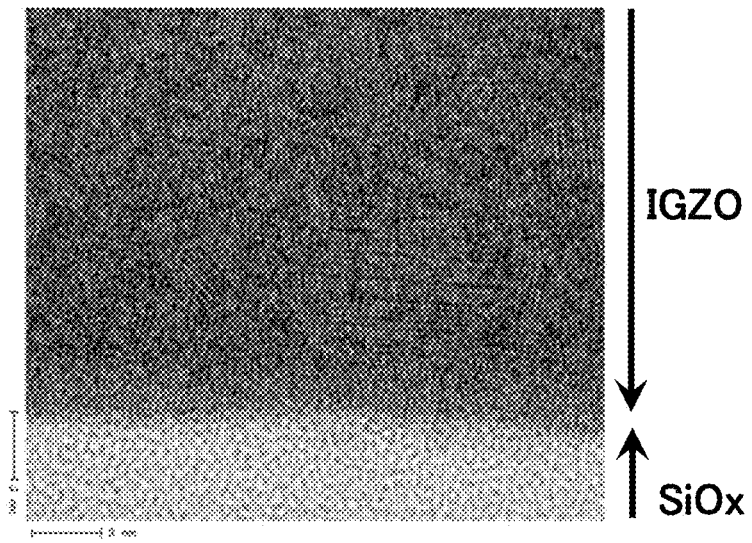

FIG. 18A is a TEM image at 8 million-fold magnification in the top surface of the In—Ga—Zn—O film of Comparison Example Sample D2 where no aluminum oxide film was provided, and FIG. 18B is a TEM image at 8 million-fold magnification in the interface between the silicon oxide film and the In—Ga—Zn—O film of Comparison Example Sample D2. In Comparison Example Sample D2, although an In—Ga—Zn—O film including a crystal having a c-axis substantially perpendicular to the top surface (CAAC-OS) was observed in the vicinity of the top surface as shown in FIG. 18A, a crystal was not observed in the interface with the silicon oxide film as shown in FIG. 18B, showing that the formation region of CAAC-OS was narrow. Hence, it was found that the crystallinity as the In—Ga—Zn—O film is low.

From the above-described results, it was confirmed that an oxide semiconductor film obtained by recrystallization by heat treatment an oxide semiconductor film, which is amorphized by addition of an oxygen ion, in the state where the oxide semiconductor film is covered with an aluminum oxide film is a crystalline oxide semiconductor (CAAC-OS) film including a crystal having a c-axis substantially perpendicular to the top surface, and the crystallinity is high and good, as shown in Example Sample D3.

Further, Example Samples D2 and D3 were analyzed by SIMS to evaluate oxygen diffusion therein.

Figure 24:
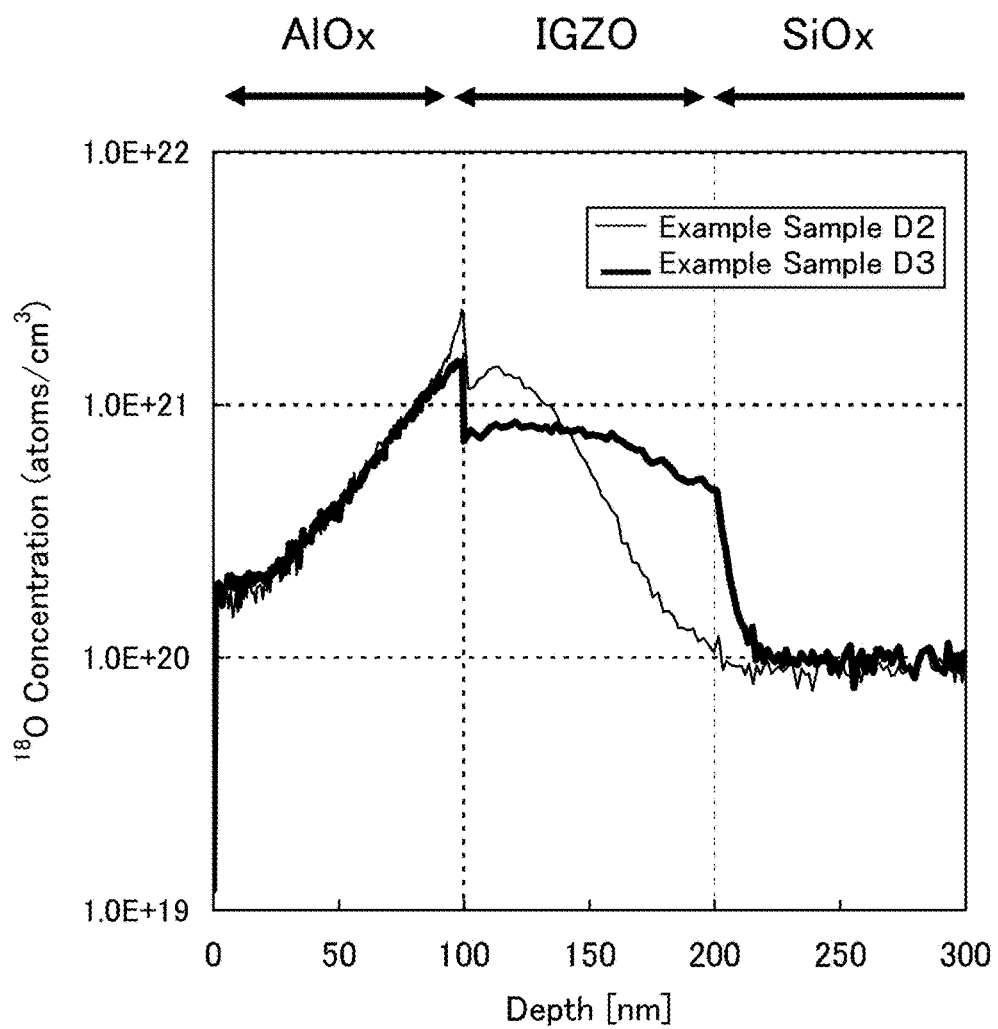
FIG. 24 shows SIMS measurement results of Example Samples D2 and D3.

FIG. 24 shows the concentration profiles of oxygen ($^{18}O$) in Example Sample D2 (thin line) and Example Sample D3 (bold line). As shown in FIG. 24, the oxygen concentration in the In—Ga—Zn—O film was not changed between Example Sample D2 where heat treatment was not performed and Example Sample D3 where heat treatment was performed, and a release of oxygen from the In—Ga—Zn—O film by heat treatment was not observed. In addition, oxygen was diffused throughout the In—Ga—Zn—O film and dispersed uniformly in the depth direction in Example Sample D3 where heat treatment was performed. From the above results, it was confirmed that a release of oxygen from an In—Ga—Zn—O film sandwiched between an aluminum oxide film and a silicon oxide film can be suppressed even when heat treatment is performed thereon, and oxygen can be diffused throughout the In—Ga—Zn—O film by heat treatment such that the oxygen concentration becomes uniform in the depth direction.

It was found also from the results of FIG. 24 that owing to the high barrier property against oxygen of the aluminum oxide film, oxygen added into the oxide semiconductor film can be kept in the oxide semiconductor film even when heat treatment for crystallization is performed thereon, so that a stable crystalline oxide semiconductor film can be obtained.

Such a crystalline oxide semiconductor (CAAC-OS) film including a crystal having a c-axis substantially perpendicular to the top surface as described above enables a change of electric characteristics of a transistor due to irradiation with visible light or ultraviolet light and the short-channel effect to be further suppressed. Accordingly, a highly reliable miniaturized semiconductor device can be provided.

This application is based on Japanese Patent Application serial no. 2011-100040 filed with Japan Patent Office on Apr. 27, 2011, the entire contents of which are hereby incorporated by reference.

What is claimed is:

1. A semiconductor device comprising:
an insulating layer;
an oxide semiconductor film including a source region and a drain region over and in contact with the insulating layer;
a gate insulating film over the oxide semiconductor film; and
a gate electrode layer over the gate insulating film,
wherein the source region and the drain region include impurities,
wherein the oxide semiconductor film contains a crystal having a c-axis which is substantially perpendicular to a top surface of the oxide semiconductor film, and
wherein an average surface roughness of a top surface of the insulating layer is greater than or equal to 0.05 nm and less than 0.5 nm.

2. A semiconductor device comprising:
an insulating layer;
an oxide semiconductor film including a source region and a drain region over and in contact with the insulating layer;
a gate insulating film over the oxide semiconductor film; and
a gate electrode layer over the gate insulating film,
wherein the source region and the drain region include impurities,
wherein the oxide semiconductor film contains a crystal having a c-axis which is substantially perpendicular to a top surface of the oxide semiconductor film,
wherein an average surface roughness of a top surface of the insulating layer is greater than or equal to 0.05 nm and less than 0.5 nm, and
wherein the impurities are added into the source region and the drain region through the gate insulating film.

3. A semiconductor device comprising:
an insulating layer;
an oxide semiconductor film including a source region and a drain region over and in contact with the insulating layer;
a gate insulating film over the oxide semiconductor film;
a gate electrode layer over the gate insulating film; and
a protective film over the gate electrode layer,
wherein the source region and the drain region include impurities,
wherein the oxide semiconductor film contains a crystal having a c-axis which is substantially perpendicular to a top surface of the oxide semiconductor film,
wherein an average surface roughness of a top surface of the insulating layer is greater than or equal to 0.05 nm and less than 0.5 nm, and
wherein the impurities are added into the source region and the drain region through the gate insulating film.

* * * * *